(12) United States Patent
Yoneda

(10) Patent No.: US 9,372,694 B2
(45) Date of Patent: Jun. 21, 2016

(54) REDUCING DATA BACKUP AND RECOVERY PERIODS IN PROCESSORS

(71) Applicant: Semiconductor Energy Laboratory Co., Ltd., Atsugi-shi, Kanagawa-ken (JP)

(72) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 613 days.

(21) Appl. No.: 13/796,063

(22) Filed: Mar. 12, 2013

(65) Prior Publication Data

US 2013/0262828 A1    Oct. 3, 2013

(30) Foreign Application Priority Data

Mar. 29, 2012  (JP) .................................. 2012-077996

(51) Int. Cl.
| | |
|---|---|
| G06F 7/38 | (2006.01) |
| G06F 7/00 | (2006.01) |
| G06F 9/30 | (2006.01) |
| G06F 1/32 | (2006.01) |
| G11C 5/00 | (2006.01) |
| G06F 11/14 | (2006.01) |

(52) U.S. Cl.
CPC .............. G06F 9/30145 (2013.01); G06F 1/32 (2013.01); G06F 1/3287 (2013.01); G06F 9/30083 (2013.01); G06F 9/30141 (2013.01); G06F 11/14 (2013.01); G11C 5/00 (2013.01); *Y02B 60/1282* (2013.01); *Y02B 60/32* (2013.01)

(58) Field of Classification Search
CPC   G06F 1/30; G06F 11/1458; G06F 2212/7203
See application file for complete search history.

(56) References Cited

U.S. PATENT DOCUMENTS

| | | | | |
|---|---|---|---|---|
| 5,913,219 | A * | 6/1999 | Baek ........................ | G06F 12/08 |
| 8,046,615 | B2 | 10/2011 | Taguchi et al. | |
| 2009/0198931 | A1* | 8/2009 | Ohyama ................... | G06F 1/30 |
| | | | | 711/162 |
| 2010/0180065 | A1* | 7/2010 | Cherian .............. | G06F 12/0804 |
| | | | | 711/103 |
| 2012/0230078 | A1 | 9/2012 | Fujita | |
| 2012/0274356 | A1 | 11/2012 | Takahashi | |
| 2012/0274378 | A1 | 11/2012 | Fujita | |
| 2012/0274379 | A1 | 11/2012 | Yoneda et al. | |
| 2012/0294060 | A1 | 11/2012 | Ohshima et al. | |
| 2012/0294066 | A1 | 11/2012 | Yoneda | |
| 2014/0133220 | A1* | 5/2014 | Danilak ................. | G11C 11/16 |
| | | | | 365/158 |

FOREIGN PATENT DOCUMENTS

JP     2009-116851 A     5/2009

* cited by examiner

*Primary Examiner* — Hyun Nam
(74) *Attorney, Agent, or Firm* — Fish & Richardson P.C.

(57) ABSTRACT

A low-power processor that does not easily malfunction is provided. Alternatively, a low-power processor having high processing speed is provided. Alternatively, a method for driving the processor is provided. In power gating, the processor performs part of data backup in parallel with arithmetic processing and performs part of data recovery in parallel with arithmetic processing. Such a driving method prevents a sharp increase in power consumption in a data backup period and a data recovery period and generation of instantaneous voltage drops and inhibits increases of the data backup period and the data recovery period.

14 Claims, 25 Drawing Sheets

REDUCING DATA BACKUP AND RECOVERY PERIODS IN PROCESSORS

BACKGROUND OF THE INVENTION

1. Field of the Invention

The present invention relates to products (including machines, manufactures, and compositions of matters) and processes (including simple methods and production methods). In particular, one embodiment of the present invention relates to semiconductor devices, methods for driving the semiconductor devices, or methods for manufacturing the semiconductor devices. Further, one embodiment of the present invention particularly relates to processors as semiconductor devices and methods for driving the processors.

Note that in this specification, a semiconductor device means a circuit having a semiconductor element (e.g., a transistor or a diode) and a device having the circuit. The semiconductor device also means any device that can function by utilizing semiconductor characteristics. For example, an integrated circuit, a chip having an integrated circuit, a display device, a light-emitting device, a lighting device, and an electronic device are all semiconductor devices. Further, here, a processor means a processing unit having an arithmetic unit and a controller. For example, a microprocessor, a CPU, and an MPU are processors.

2. Description of the Related Art

These days, as a technology for downsizing a semiconductor element is improved, the integration degree of a processor such as a CPU or an MPU is markedly improved, and the processing speed of the processor is greatly increased. On the other hand, as the semiconductor element becomes small, the number of semiconductor elements provided in the processor greatly increases, and the power consumption of the semiconductor element due to leakage current markedly increases.

One of driving methods for reducing the power consumption of a processor is a method for driving a processor that is called power gating (hereinafter also referred to as a power gating driving method). A power gating driving method is a driving method in which in a period during which a processor does not need to perform arithmetic processing, supply of power to part of the processor (e.g., a logic unit) is stopped to prevent consumption of wasted power.

A volatile storage element such as a register or an SRAM is usually used as a storage element in a processor. When supply of power to a logic unit or the like in the processor is stopped by the power gating driving method, data in the volatile storage element provided in the logic unit is lost. In contrast, by providing a flash memory that is a nonvolatile storage element in a processor and writing data in a volatile storage element to the nonvolatile storage element when supply of power is stopped, the data can be retained (for example, see Patent Document 1).

REFERENCE

Patent Document 1: Japanese Published Patent Application No. 2009-116851

SUMMARY OF THE INVENTION

In the power gating driving method, operation of writing data in a volatile storage element to a nonvolatile storage element (hereinafter the operation is referred to as data backup) is needed when part of a processor is powered off. In contrast, operation of rewriting data in the nonvolatile storage element to the volatile storage element (hereinafter the operation is referred to as data recovery) is needed when part of the processor is powered on.

Data backup and data recovery are performed after a power off/on instruction is given to the processor. Thus, when the power off/on instruction is given to the processor, data is written to or read from many volatile storage elements and nonvolatile storage elements in the processor. Accordingly, the power consumption of the processor sharply increases. This causes instantaneous voltage drops in the processor and might lead to malfunction of the processor.

By dividing the volatile storage elements and the nonvolatile storage elements into a plurality of blocks and sequentially performing data backup and data recovery in the blocks, a sharp increase in power consumption of the processor and generation of instantaneous voltage drops can be prevented. However, since data backup and data recovery are sequentially performed in the blocks after the power off/on instruction is given, the time required for data backup and data recovery increases and the processing speed of the processor decreases, which is problematic.

In view of the above problems, it is an object of one embodiment of the disclosed invention to provide a low-power processor that does not easily malfunction. It is an object of one embodiment of the disclosed invention to provide a low-power processor having high processing speed.

It is an object of one embodiment of the disclosed invention to provide a method for driving the processor.

Note that the description of these objects does not impede the existence of other objects. In one embodiment of the present invention, there is no need to achieve all the objects. Other objects will be apparent and can be derived from the description of the specification, the drawings, the claims, and the like.

One embodiment of the disclosed invention is a processor performing part of data backup in parallel with arithmetic processing and performing part of data recovery in parallel with arithmetic processing in a power gating driving method. Such an embodiment prevents a sharp increase in power consumption in a data backup period and a data recovery period and generation of instantaneous voltage drops and inhibits increases of the data backup period and the data recovery period. Specifically, structures described below can be employed, for example.

One embodiment of the disclosed invention is a processor that includes an instruction decoder, a logic unit including a plurality of logic circuit blocks including a volatile memory block and a nonvolatile memory block, a backup/recovery controller including a storage storing first reference instruction enumeration and second reference instruction enumeration, a power controller, and a flag storage. The instruction decoder receives an instruction from the outside of the processor and gives an instruction to the logic unit, the backup/recovery controller, and the power controller. When enumeration of the instruction from the outside of the processor corresponds to at least part of the first reference instruction enumeration, the backup/recovery controller gives an instruction to back up data from the volatile memory block to the nonvolatile memory block to at least one of the plurality of logic circuit blocks in accordance with the first reference instruction enumeration. The backup/recovery controller receives an instruction from the instruction decoder and gives an instruction to recover data from the nonvolatile memory block to the volatile memory block to at least one of the plurality of logic circuit blocks in accordance with the second reference instruction enumeration. One of the logic circuit blocks in the logic unit receives an instruction from the backup/recovery controller, and performs data backup or data recovery between the volatile memory block and the nonvolatile memory block. Another one of the logic circuit blocks in the logic unit concurrently receives an instruction from the instruction decoder and performs arithmetic processing using data stored in the volatile memory block. A data backed up flag or a data recovered flag is written to the flag storage by the backup/recovery controller. The power controller receives an instruction from the instruction decoder or the backup/recovery controller and powers on or off the logic unit.

In one embodiment of the disclosed invention, in the processor, data backup performed at the time of stop of the logic unit is divided into primary backup in which data is backed up from the volatile memory block to the nonvolatile memory block in one of the logic circuit blocks in the logic unit before an instruction to stop the logic unit and another one of the logic circuit blocks in the logic unit concurrently performs arithmetic processing, and secondary backup in which data is backed up from the volatile memory block to the nonvolatile memory block in another one of the logic circuit blocks in the logic unit after the instruction to stop the logic unit. Data recovery performed at the time of start of the logic unit is divided into primary recovery in which data is recovered from the nonvolatile memory block to the volatile memory block in one of the logic circuit blocks in the logic unit in accordance with an instruction to start the logic unit, and secondary recovery in which data is recovered from the nonvolatile memory block to the volatile memory block in another one of the logic circuit blocks in the logic unit after completion of the primary recovery and one of the logic circuit blocks in the logic unit concurrently performs arithmetic processing.

In another embodiment of the disclosed invention, in the processor, in the primary backup, when the enumeration of the instruction from the outside of the processor corresponds to at least part of the first reference instruction enumeration, the backup/recovery controller gives an instruction to back up data from the volatile memory block to the nonvolatile memory block to at least one of the logic circuit blocks in the logic unit; one of the logic circuit blocks in the logic unit receives the instruction from the backup/recovery controller and backs up data from the volatile memory block to the nonvolatile memory block; another one of the logic circuit blocks in the logic unit concurrently performs arithmetic processing; the backup/recovery controller writes a backed up flag of one of the logic circuit blocks in the logic unit to the flag storage in accordance with backup of the data in one of the logic circuit blocks in the logic unit; in the secondary backup, the instruction decoder receives an instruction to stop the logic unit from the outside of the processor and gives an instruction to back up data in the logic unit to the backup/recovery controller; the backup/recovery controller gives an instruction to back up data from the volatile memory block to the nonvolatile memory block to another one of the logic circuit blocks in the logic unit in accordance with the backed up flag; another one of the logic circuit blocks in the logic unit backs up data from the volatile memory block to the nonvolatile memory block; the backup/recovery controller gives an instruction to power off at least the logic unit to the power controller after completion of backup of the data in another one of the logic circuit blocks in the logic unit; and the power controller powers off at least the logic unit.

In the processor, in the primary backup, in the case where another data is written to one of the logic circuit blocks in the logic unit from which the data is backed up, the backed up flag of the logic circuit block written to the flag storage is preferably erased.

In the processor, in the primary backup, one of the logic circuit blocks in the logic unit can be divided into a plurality of blocks and the primary backup can be performed more than once.

In another embodiment of the disclosed invention, in the processor, in the primary backup, the instruction decoder receives an instruction to start the logic unit from the outside of the processor, gives an instruction to power on the logic unit to the power controller, and gives an instruction to recover data in the logic unit to the backup/recovery controller; the power controller receives the instruction from the instruction decoder and powers on at least the logic unit; the backup/recovery controller receives the instruction from the instruction decoder and gives an instruction to recover data from the nonvolatile memory block to the volatile memory block to one of the logic circuit blocks in the logic unit in accordance with the second reference instruction enumeration; one of the logic circuit blocks in the logic unit recovers data from the nonvolatile memory block to the volatile memory block; the backup/recovery controller writes a recovered flag of one of the logic circuit blocks in the logic unit to the flag storage in accordance with recovery of the data in one of the logic circuit blocks in the logic unit; a data recovery completion signal of one of the logic circuit blocks in the logic unit is transmitted to the instruction decoder after completion of recovery of the data in one of the logic circuit blocks in the logic unit; in the secondary recovery, the instruction decoder receives the data recovery completion signal and gives an instruction to perform arithmetic processing to one of the logic circuit blocks in the logic unit; the backup/recovery controller gives an instruction to recover data from the nonvolatile memory block to the volatile memory block to another one of the logic circuit blocks in the logic unit; another one of the logic circuit blocks in the logic unit recovers data from the nonvolatile memory block to the volatile memory block; one of the logic circuit blocks in the logic unit concurrently performs arithmetic processing in accordance with the instruction from the instruction decoder; and the backup/recovery controller writes a recovered flag of another one of the logic circuit blocks in the logic unit to the flag storage in accordance with recovery of the data in another one of the logic circuit blocks in the logic unit.

In the processor, in the secondary recovery, in the case where an instruction to perform arithmetic processing in another one of the logic circuit blocks in the logic unit from which the data is not recovered is given, the instruction to perform arithmetic processing can be on standby. Further, it is preferable to preferentially recover data from the nonvolatile memory block to the volatile memory block in the logic circuit block.

In the processor, in the primary recovery, one of the logic circuit blocks in the logic unit can be divided into a plurality of blocks and the primary recovery can be performed more than once.

In the processor, the volatile memory block preferably includes a register. Further, the nonvolatile memory block preferably includes a transistor including an oxide semiconductor.

Another embodiment of the disclosed invention is a method for driving a processor that includes, in data backup performed at the time of stop of a logic unit in the processor, a step of backing up data from a volatile storage element to a nonvolatile storage element in part of the logic unit that is not used until an instruction to stop the logic unit is given by predicting the stop instruction before the stop instruction is given and concurrently performing arithmetic processing in another part of the logic unit, a step of backing up data from a volatile storage element to a nonvolatile storage element in another part of the logic unit when the instruction to stop the logic unit is given, and a step of powering off at least the logic unit when data backup in the logic unit is completed. The driving method further includes, in data recovery performed at the time of start of the logic unit, a step of powering on at least the logic unit when an instruction to start the logic unit is given, a step of recovering data from the nonvolatile storage element to the volatile storage element in part of the logic unit used after the start instruction is given when the logic unit is powered on, and a step of performing arithmetic processing in part of the logic unit when data is recovered in part of the logic unit and concurrently recovering data from the nonvolatile storage element to the volatile storage element in another part of the logic unit.

Note that in this specification and the like, the term "high potential" means a potential high enough to turn on an n-channel transistor provided in a processor and turn off a p-channel transistor when the potential is applied to gate electrodes. Further, in this specification and the like, the term "low potential" means a potential low enough to turn off an n-channel transistor provided in a processor and turn on a p-channel transistor when the potential is applied to gate electrodes.

Note that in this specification and the like, the term "over" or "below" does not necessarily mean that a component is placed directly on or directly under another component. For example, the expression "a gate electrode over a gate insulating layer" does not exclude the case where another component is placed between the gate insulating layer and the gate electrode.

In this specification and the like, the term "electrode" or "wiring" does not limit the function of a component. For example, an electrode can be used as part of a wiring, and the wiring can be used as part of the electrode. The term "electrode" or "wiring" can also mean a combination of a plurality of electrodes or wirings, for example.

Note that a source electrode, a drain electrode, and a gate electrode may be simply referred to as a source, a drain, and a gate, respectively. The functions of a source and a drain might interchange when a transistor of opposite polarity is used or the direction of current flow is changed in circuit operation, for example. Thus, in this specification and the like, the terms "source" and "drain" can interchange.

Note that in this specification and the like, the expression "electrically connected" includes the case where components are connected to each other through an object having any electric action. Here, there is no particular limitation on an object having any electric action as long as electric signals can be transmitted and received between components that are connected to each other.

Examples of an object having any electric action include an electrode, a wiring, a switching element such as a transistor, a resistor, an inductor, a capacitor, and an element with a variety of functions.

In one embodiment of the disclosed invention, a low-power processor that does not easily malfunction can be provided. Further, a low-power processor having high processing speed can be provided.

Further, a method for driving the processor can be provided.

DETAILED DESCRIPTION OF THE INVENTION

Figure 1:
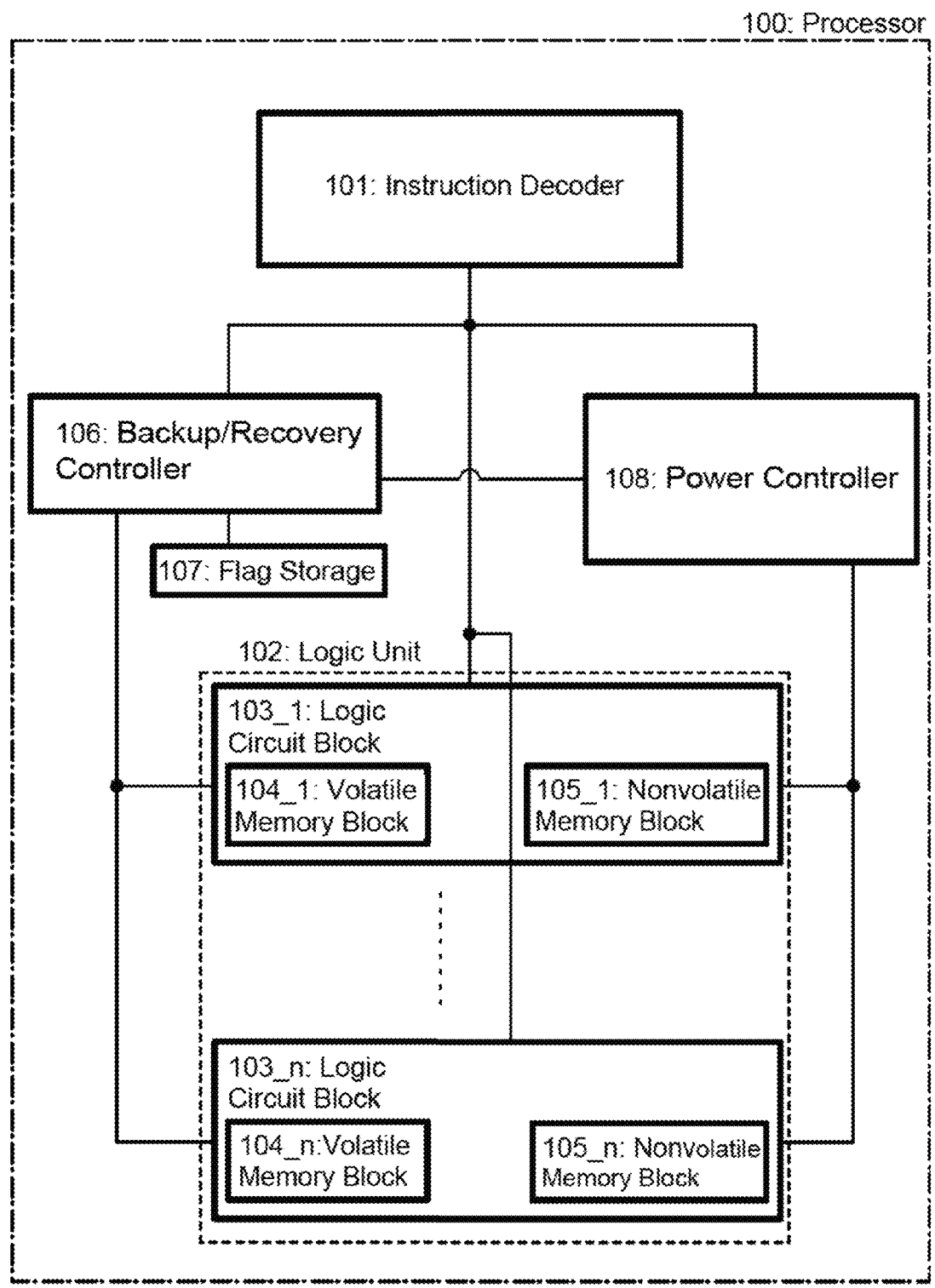
FIG. 1 is a block diagram of a processor according to one embodiment of the disclosed invention.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

Embodiment 1

In this embodiment, structures and operations of a processor according to one embodiment of the disclosed invention are described with reference to FIG. 1, FIGS. 2A to 2C, FIG. 3, FIGS. 4A to 4C, FIG. 5, FIG. 6, FIG. 7, FIG. 8, FIG. 9, FIG. 10, FIG. 11, and FIG. 12.

The processor in this embodiment has a power gating function, and stops and starts a logic unit by the following method.

In data backup performed at the time of stop of the logic unit in the processor, data is backed up from a volatile storage element to a nonvolatile storage element in part of the logic unit that is not used until an instruction to stop the logic unit is given by predicting the stop instruction before the stop instruction is given, and arithmetic processing is concurrently performed in another part of the logic unit. Data is backed up from a volatile storage element to a nonvolatile storage element in another part of the logic unit when the instruction to stop the logic unit is given, and at least the logic unit is powered off when data backup in the logic unit is completed.

In data recovery performed at the time of start of the logic unit in the processor, at least the logic unit is powered on when an instruction to start the logic unit is given, and data is recovered from the nonvolatile storage element to the volatile storage element in part of the logic unit used after the start instruction is given when the logic unit is powered on. Arithmetic processing is performed in part of the logic unit when data is recovered in part of the logic unit, and data is concurrently recovered from the nonvolatile storage element to the volatile storage element in another part of the logic unit.

The structure of a processor that can use such a power gating driving method is described below.

The structure of the processor according to one embodiment of the disclosed invention is illustrated in a block diagram of FIG. 1. A processor 100 in FIG. 1 includes an instruction decoder 101, a logic unit 102 including n (n is an integer of 2 or more) logic circuit blocks 103_1 to 103_n, a backup/recovery controller 106, a flag storage 107, and a power controller 108. The plurality of logic circuit blocks 103_1 to 103_n include volatile memory blocks 104_1 to 104_n and nonvolatile memory blocks 105_1 to 105_n. Note that the logic circuit blocks 103_1 to 103_n, the volatile memory blocks 104_1 to 104_n, and the nonvolatile memory blocks 105_1 to 105_n are marked with "_1" to "_n". However, when it is not necessary to mark these blocks with "_1" to "_n", the blocks are referred to as a logic circuit block 103, a volatile memory block 104, and a nonvolatile memory block 105 in some cases.

The instruction decoder 101 is electrically connected to the logic circuit blocks 103_1 to 103_n in the logic unit 102, the backup/recovery controller 106, and the power controller 108. The instruction decoder 101 receives an instruction from the outside of the processor 100, for example, a storage device such as a cache memory or a main memory and transmits a control signal corresponding to the instruction to the plurality of logic circuit blocks 103_1 to 103_n in the logic unit 102, the backup/recovery controller 106, or the power controller 108. In this specification and the like, the term "instruction" also means a control signal corresponding to an instruction, and the expression "giving an instruction" also means transmitting a control signal corresponding to an instruction.

For example, the instruction decoder 101 gives an instruction to perform arithmetic processing to the plurality of logic circuit blocks 103_1 to 103_n in the logic unit 102, gives an instruction to perform data backup or data recovery between the volatile memory block 104 and the nonvolatile memory block 105 in each of the logic circuit blocks 103 of the logic unit 102 to the backup/recovery controller 106, and gives an instruction to power on the plurality of logic circuit blocks 103_1 to 103_n in the logic unit 102 to the power controller 108.

The instruction decoder 101 can include, for example, a fetch circuit for temporarily storing an instruction given from the outside of the processor 100 and a decoder for decoding the instruction stored in the fetch circuit and generating a control signal.

The logic unit 102 is electrically connected to the instruction decoder 101, the backup/recovery controller 106, and the power controller 108. The logic unit 102 receives an instruction from the instruction decoder 101 and performs arithmetic processing in the plurality of logic circuit blocks 103_1 to 103_n. The logic circuit block 103 includes a plurality of logic circuits, an arithmetic logic unit (ALU) constituted of the plurality of logic circuits, and the like.

The volatile memory block 104 in the logic circuit block 103 includes at least a volatile storage element and, for example, is constituted of a register. The volatile memory block 104 reads and writes data in the arithmetic processing of the logic circuit block 103; thus, the volatile memory block 104 has at least higher access speed than the nonvolatile memory block 105.

A semiconductor material used for a transistor included in the volatile memory block 104 is not particularly limited. However, the semiconductor material preferably has a band gap width different from that of a semiconductor material used for a transistor with low off-state current in the nonvolatile memory block 105 to be described later. Such a semiconductor material can be, for example, silicon, germanium, silicon germanium, or gallium arsenide and is preferably single crystal. In order to increase the speed of reading information, it is preferable to use, for example, a transistor with high switching speed, such as a transistor formed using single crystal silicon.

The nonvolatile memory block 105 in the logic circuit block 103 includes at least a nonvolatile storage element having a longer data retention time than the volatile storage element. The nonvolatile memory block 105 is electrically connected to a node in which electric charge corresponding to data in the volatile memory block 104 is stored, and backs up data in the volatile memory block 104 when the logic unit 102 is powered off in a power gating driving method. Thus, the nonvolatile memory block 105 has at least a longer data retention time than the volatile memory block 104.

Here, structure examples of the nonvolatile memory block 105 are described with reference to FIGS. 2A to 2C.

Figure 2A:
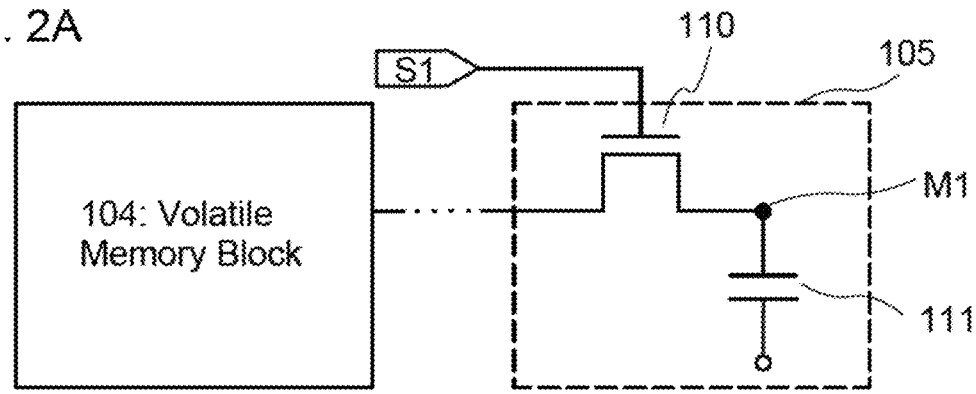
FIGS. 2A to 2C are circuit diagrams of processors according to one embodiment of the disclosed invention.

The nonvolatile memory block 105 in FIG. 2A includes a transistor 110 and a capacitor 111 and is electrically connected to the volatile memory block 104 through the transistor 110. Note that in this embodiment, the transistor 110 is an n-channel transistor; however, a p-channel transistor may be used as appropriate. In such a case, a potential applied to a gate electrode is inverted as appropriate.

Specifically, a source electrode (or a drain electrode) of the transistor 110 is electrically connected to a node holding electric charge corresponding to data in the volatile memory block 104. The drain electrode (or the source electrode) of the transistor 110 is electrically connected to one electrode of the capacitor 111 (hereinafter the node is referred to as a node M1 in some cases). A control signal S1 is supplied to the gate electrode of the transistor 110, and the transistor 110 is turned on or off in accordance with the potential of the control signal S1. A predetermined potential is applied to the other electrode of the capacitor 111. Here, the predetermined potential is, for example, a ground potential (GND). By providing the capacitor 111 in this manner, much electric charge can be held in the node M1, so that data retention characteristics can be improved.

The transistor 110 is preferably a transistor with extremely low off-state current. The transistor with extremely low off-state current preferably includes, in a channel formation region, a wide band gap semiconductor having a wider band gap and lower intrinsic carrier density than single crystal silicon. For example, the band gap of the wide band gap semiconductor is more than 1.1 eV, preferably 2.5 eV or more and 4 eV or less, more preferably 3 eV or more and 3.8 eV or less. For example, as the wide band gap semiconductor, a compound semiconductor such as silicon carbide (SiC) or gallium nitride (GaN), an oxide semiconductor formed using metal oxide such as an In—Ga—Zn—O oxide semiconductor, or the like can be used. Alternatively, since a transistor including amorphous silicon, microcrystalline silicon, or the like has lower off-state current than a transistor including single crystal silicon, the transistor 110 may employ amorphous silicon, microcrystalline silicon, or the like.

Here, the band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. The band gap of the In—Ga—Zn—O oxide semiconductor which is the wide band gap semiconductor is approximately 3.2 eV and the concentration of thermally excited carriers is approximately $1 \times 10^{-7}$ cm$^{-3}$. The off-state resistance (resistance between a source and a drain of a transistor in an off state) of a transistor is inversely proportional to the concentration of thermally excited carriers in the channel formation region. Accordingly, the resistivity of the In—Ga—Zn—O oxide semiconductor at the time when the transistor is off is 18 orders of magnitude higher than that of silicon.

By using such a wide band gap semiconductor for the transistor 110, for example, off-state current (per unit channel width (1 μm), here) at room temperature (25° C.) is 100 zA (1 zA (zeptoampere) is $1 \times 10^{-21}$ A) or lower, preferably 10 zA or lower.

For example, when the off-state current of the transistor 110 at room temperature (25° C.) (per unit channel width (1 μm), here) is 10 zA (1 zA (zeptoampere) is $1 \times 10^{-21}$ A) or lower, data can be retained for $10^4$ seconds or longer. Needless to say, the retention time depends on the characteristics of the transistor 110, the capacitance of the capacitor 111 connected to the electrode of the transistor 110, temperature, and the like.

In this embodiment, a transistor with extremely low off-state current that is used as the transistor 110 is a transistor including an oxide semiconductor.

When data is backed up from the volatile memory block 104, by turning on the transistor 110 by application of a high potential as the control signal S1, the potential of the node holding electric charge corresponding to data in the volatile memory block 104 is applied to the node M1. After that, by turning off the transistor 110 by application of a low potential as the control signal S1, electric charge supplied to the node M1 is held. Here, since the off-state current of the transistor 110 is extremely low, electric charge in the node M1 is held for a long time.

When data is recovered to the volatile memory block 104, by turning on the transistor 110 by application of a high potential as the control signal S1, the potential of the node M1 is applied to the node holding electric charge corresponding to data in the volatile memory block 104.

By using a wide band gap semiconductor or the like for the transistor 110, the off-state current of the transistor 110 can be extremely low. Thus, by turning off the transistor 110, the potential of the node M1 can be held for an extremely long time. With such a structure, the nonvolatile memory block 105 can be used as a nonvolatile storage element capable of retaining data without supply of power.

Figure 2B:
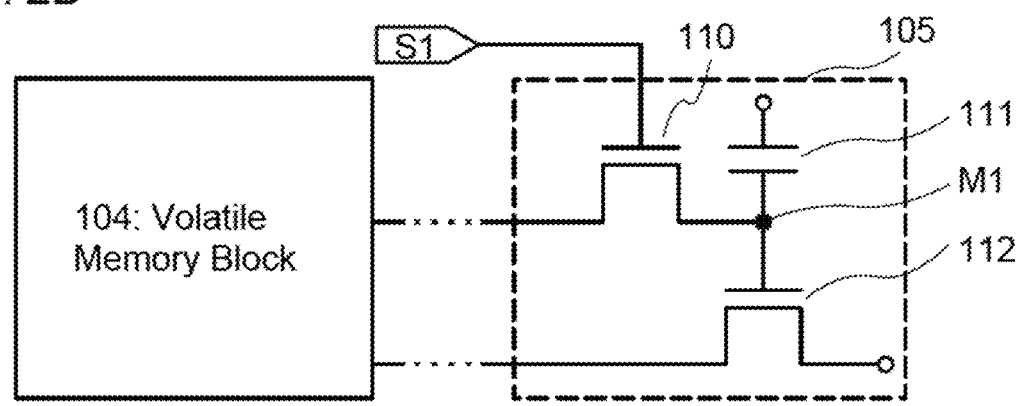

As illustrated in FIG. 2B, the nonvolatile memory block 105 may include a transistor 112 in addition to the components in FIG. 2A. A gate electrode of the transistor 112 is electrically connected to the node M1. A drain electrode (or a source electrode) of the transistor 112 is electrically connected to the node holding electric charge corresponding to data in the volatile memory block 104. A predetermined potential is applied to the source electrode (or the drain electrode) of the transistor 112.

In the nonvolatile memory block 105 in FIG. 2B, the state of the transistor 112 depends on a potential held in the node M1 in the data backup. In other words, the transistor 112 is turned on when a high potential is applied in the data backup, and the transistor 112 is turned off when a low potential is applied in the data backup.

In data recovery, the potential of the drain electrode of the transistor 112 is applied to the node holding electric charge corresponding to data in the volatile memory block 104. In other words, when a high potential is applied to the node M1 in the data backup, the transistor 112 is on, and the potential of the source electrode of the transistor 112 is applied to the volatile memory block 104. Further, when a low potential is applied to the node M1 in the data backup, the transistor 112 is off, and the potential of the source electrode of the transistor 112 is not applied to the volatile memory block 104.

In order to increase the speed of reading information, it is preferable to use a transistor that is similar to the transistor used for the volatile memory block 104 as the transistor 112.

Note that the source electrode of the transistor 112 and the other electrode of the capacitor 111 may have the same potential or different potentials. The source electrode of the transistor 112 and the other electrode of the capacitor 111 may be electrically connected to each other. Further, the capacitor 111 is not necessarily provided. For example, in the case where the parasitic capacitance of the transistor 112 is high, the parasitic capacitance can be used instead of the capacitor 111.

Here, the drain electrode of the transistor 110 and the gate electrode of the transistor 112 (i.e., the node M1) have the same effect as a floating gate of a floating-gate transistor used as a nonvolatile storage element. However, since data can be directly rewritten by turning on or off the transistor 110, injection of electric charge into a floating gate and extraction of electric charge from the floating gate with the use of high voltage are not necessary. In other words, in the nonvolatile memory block 105, high voltage needed for writing or erasing data in a conventional floating gate transistor is not necessary.

Thus, by using the nonvolatile memory block 105 in this embodiment, power consumption needed for data backup can be reduced.

For similar reasons, a decrease in operation speed due to data writing or data erasing can be reduced; thus, the nonvolatile memory block 105 can be operated at high speed. Further, for similar reasons, the problem of deterioration of a gate insulating film (a tunnel insulating film) that is pointed out in a conventional floating gate transistor does not exist. In other words, unlike in a conventional floating gate transistor, the nonvolatile memory block 105 in this embodiment has no limitation on the number of writings in principle. From the above, the nonvolatile memory block 105 can be adequately used as a storage device that needs many rewritings and high-speed operation, such as a register.

Figure 2C:
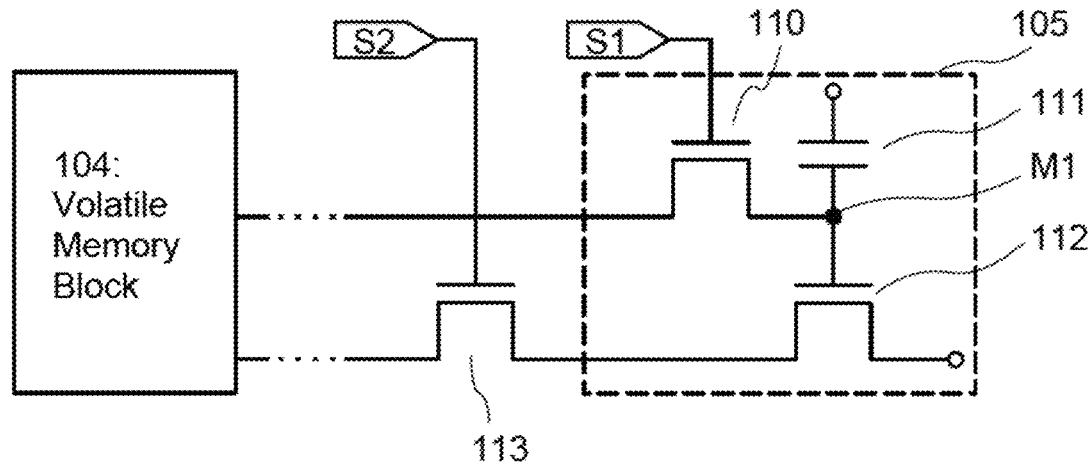

As illustrated in FIG. 2C, the nonvolatile memory block 105 may include a transistor 113 in addition to the components in FIG. 2B. A control signal S2 is supplied to a gate electrode of the transistor 113. A drain electrode (or a source electrode) of the transistor 113 is electrically connected to the node holding electric charge corresponding to data in the volatile memory block 104. The source electrode (or the drain electrode) of the transistor 113 is electrically connected to the drain electrode of the transistor 112.

Here, the control signal S2 is a signal for applying a high potential to the gate electrode of the transistor 113 at the time of the data recovery. By supplying S2 having a high potential, the transistor 113 can be turned on. Accordingly, at the time of the data recovery, a potential based on the on state or off state of the transistor 112 can be applied to the node holding electric charge corresponding to data in the volatile memory block 104.

Note that in order to increase the speed of reading information, it is preferable to use a transistor that is similar to the transistor used for the volatile memory block 104 as the transistor 113.

Note that the structure of the nonvolatile memory block 105 is not limited to the structures in FIGS. 2A to 2C. For example, a phase change memory (PCM) or a resistance random access memory (ReRAM) can be used.

Here, a specific structure example of a storage device that includes the volatile memory block 104 and the nonvolatile memory block 105 having the structure in FIG. 2C is described with reference to a circuit diagram in FIG. 3.

Figure 3:
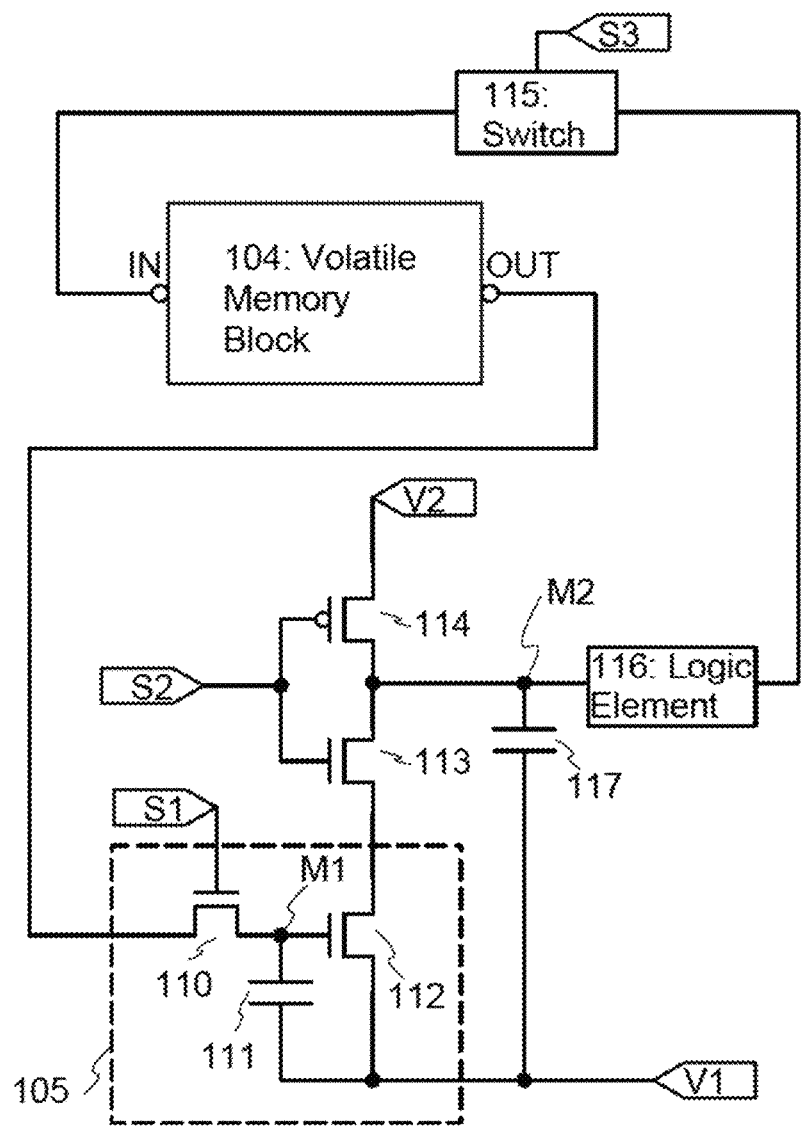
FIG. 3 is a circuit diagram of a processor according to one embodiment of the disclosed invention.

The storage device in FIG. 3 includes the volatile memory block 104, the nonvolatile memory block 105, the transistor 113, a transistor 114, a switch 115, a logic element 116, and a capacitor 117. Note that the logic element 116 has a function of inverting logic (a logic value). The nonvolatile memory block 105 includes the transistor 110, the capacitor 111, and the transistor 112. Here, the volatile memory block 104, the nonvolatile memory block 105, and the transistor 113 can have structures that are similar to those in FIG. 2C.

FIG. 3 illustrates an example in which the transistor 113 is a transistor having conductivity (e.g., an n-channel transistor) and the transistor 114 is a transistor having another conductivity (e.g., a p-channel transistor).

The control signal S2 is supplied to gate electrodes of the transistor 113 and the transistor 114. Only the transistor 113 is turned on when the control signal S2 has a high potential, and only the transistor 114 is turned on when the control signal S2 has a low potential.

The source electrode of the transistor 112 is electrically connected to a wiring to which a potential V1 is applied. The drain electrode of the transistor 112 is electrically connected to the source electrode of the transistor 113. The drain electrode of the transistor 113 is electrically connected to a drain electrode of the transistor 114. A source electrode of the transistor 114 is electrically connected to a wiring to which a potential V2 is applied. The drain electrode of the transistor 113, the drain electrode of the transistor 114, an input terminal of the logic element 116, and one electrode of the capacitor 117 are electrically connected to each other (hereinafter the node is referred to as a node M2 in some cases). Here, a low potential such as a ground potential (GND) is applied as the potential V1, and a high potential (VDD) or the like is mainly applied as the potential V2.

The other electrode of the capacitor 111 and the other electrode of the capacitor 117 are electrically connected to the wiring to which the potential V1 is applied.

In the switch 115, conduction or non-conduction between a first terminal and a second terminal is selected by a control signal S3 that is different from the control signal S1 and the control signal S2.

The source electrode of the transistor 110 is electrically connected to the node holding electric charge corresponding to data in the volatile memory block 104. FIG. 3 illustrates an example in which a signal output from an output terminal OUT of the volatile memory block 104 is input to the source electrode of the transistor 110. The phase of a signal output from the drain electrode of the transistor 113 is inverted by the logic element 116, and the inversion signal is input to the volatile memory block 104 through the switch 115 in which the first terminal and the second terminal are set in a conduction state by the control signal S3.

Note that FIG. 3 illustrates an example in which a signal output from the drain electrode of the transistor 113 is input to an input terminal (denoted by IN in FIG. 3) of the volatile memory block 104 through the logic element 116 and the switch 115; however, one embodiment of the present invention is not limited to this structure. A signal output from the drain electrode of the transistor 113 may be input to the volatile memory block 104 without its phase being inverted. For example, in the case where the volatile memory block 104 has a node in which a signal obtained by inversion of the phase of a signal input from the input terminal is held, a signal output from the drain electrode of the transistor 113 can be input to the node.

In FIG. 3, voltage corresponding to a difference between the potential V1 and the potential V2 is supplied to the storage device as power supply voltage. The voltage corresponding to the difference between the potential V1 and the potential V2 may be supplied to the volatile memory block 104 as power supply voltage. In a period during which power supply voltage is not supplied to the volatile memory block 104, the potential V1 and the potential V2 are substantially equal to power off the processor. In that case, for example, the potential V2 may be a ground potential only in the period.

Note that the switch 115 can be a transistor. The transistor may be an n-channel transistor or a p-channel transistor. Alternatively, an n-channel transistor and a p-channel transistor may be used in combination. For example, an analog switch can be used as the switch 115.

The volatile memory block 104 in FIG. 3 includes a first logic element and a second logic element. An input terminal of the first logic element is connected to an output terminal of the second logic element. An input terminal of the second logic element is connected to an output terminal of the first logic element. The first logic element and the second logic element each output a signal corresponding to a signal input only in a period during which power supply voltage is supplied.

The first and second logic elements each invert logic (a logic value). For example, an inverter or a clocked inverter can be used.

Each of the volatile memory block 104 and the nonvolatile memory block 105 can be used as, for example, a buffer register temporarily storing input data of the ALC or the result of arithmetic processing, or a general-purpose register.

As illustrated in FIG. 1, the backup/recovery controller 106 is electrically connected to the instruction decoder 101, the logic circuit blocks 103_1 to 103_n in the logic unit 102, the flag storage 107, and the power controller 108. The backup/recovery controller 106 has first reference instruction enumeration and second instruction reference enumeration. The backup/recovery controller 106 selects at least one of the logic circuit blocks 103_1 to 103_n in the logic unit 102 based on the reference instruction enumeration, and gives an instruction to perform data backup or data recovery to the selected logic circuit block 103. Note that the first reference instruction enumeration and the second instruction reference enumeration are stored in a storage provided in the backup/recovery controller. The storage can have a structure that is similar to the structure of the volatile memory block 104 including a volatile storage element, the nonvolatile memory block 105 including a nonvolatile storage element, or the like.

Here, the first reference instruction enumeration is a sample of instruction enumeration including an instruction to stop a logic unit and a plurality of instructions before the instruction to stop the logic unit. Note that the first reference instruction enumeration includes at least the plurality of instructions before the instruction to stop the logic unit, and does not necessarily include the instruction to stop the logic unit. Further, the second reference instruction enumeration is a sample of instruction enumeration including an instruction to start a logic unit and a plurality of instructions after the instruction to start the logic unit. Note that the second reference instruction enumeration includes at least the plurality of instructions after the instruction to start the logic unit, and does not necessarily include the instruction to start the logic unit. The details of the first reference instruction enumeration and the second reference instruction enumeration are described together with a method for driving the processor 100 to be described later.

The backup/recovery controller 106 always compares the history of instructions given from the outside of the processor 100 (hereinafter referred to as instruction enumeration) with the first reference instruction enumeration when the processor 100 operates. When the instruction enumeration corresponds to at least part of the first reference instruction enumeration, an instruction to back up data from the volatile memory block 104 to the nonvolatile memory block 105 is given to at least one of the plurality of logic circuit blocks 103_1 to 103_n in the logic unit 102 in accordance with the first reference instruction enumeration. When the backup/recovery controller 106 receives an instruction from the instruction decoder 101, an instruction to recover data from the nonvolatile memory block 105 to the volatile memory block 104 is given to at least one of the plurality of logic circuit blocks 103_1 to 103_n in the logic unit 102 in accordance with the second reference instruction enumeration. The details of the data backup and recovery will be described together with the method for driving the processor 100.

The backup/recovery controller 106 writes a backed up flag to the flag storage 107 after the backup of data from the volatile memory block 104 to the nonvolatile memory block 105 is completed. Further, the backup/recovery controller 106 writes a recovered flag to the flag storage 107 after the recovery of data from the nonvolatile memory block 105 to the volatile memory block 104 is completed.

The backup/recovery controller 106 gives an instruction to power off the plurality of logic circuit blocks 103_1 to 103_n in the logic unit 102 to the power controller 108 after the data backup is completed.

The power controller 108 is electrically connected to the instruction decoder 101, the backup/recovery controller 106, and the logic circuit blocks 103_1 to 103_n in the logic unit 102. Although not illustrated, power is supplied from the outside of the processor 100 to the power controller 108.

The power controller 108 receives an instruction from the instruction decoder 101 or the backup/recovery controller 106, and powers on or off the plurality of logic circuit blocks 103_1 to 103_n in the logic unit 102.

Here, it is preferable that a transistor with extremely low off-state current be provided in the power controller 108 as in the transistor 110 in FIGS. 2A to 2C to form a switch for selecting whether the logic unit 102 is powered on or off. Thus, when the logic unit 102 is in an off state, leakage current between the power controller 108 and the logic circuit blocks 103_1 to 103_n in the logic unit 102 can be reduced, so that the power consumption of the processor 100 can be reduced.

Note that the power controller 108 may control whether a component other than the logic unit 102 is powered on or off. For example, the power controller 108 can control whether the backup/recovery controller 106 is powered on or off.

Note that the structures of the instruction decoder 101, the logic unit 102, the backup/recovery controller 106, the flag storage 107, and the power controller 108 are not limited to the above structures. The plurality of these components may be brought together. For example, the instruction decoder 101, the backup/recovery controller 106, and the flag storage 107 can be brought together.

Figure 4A:
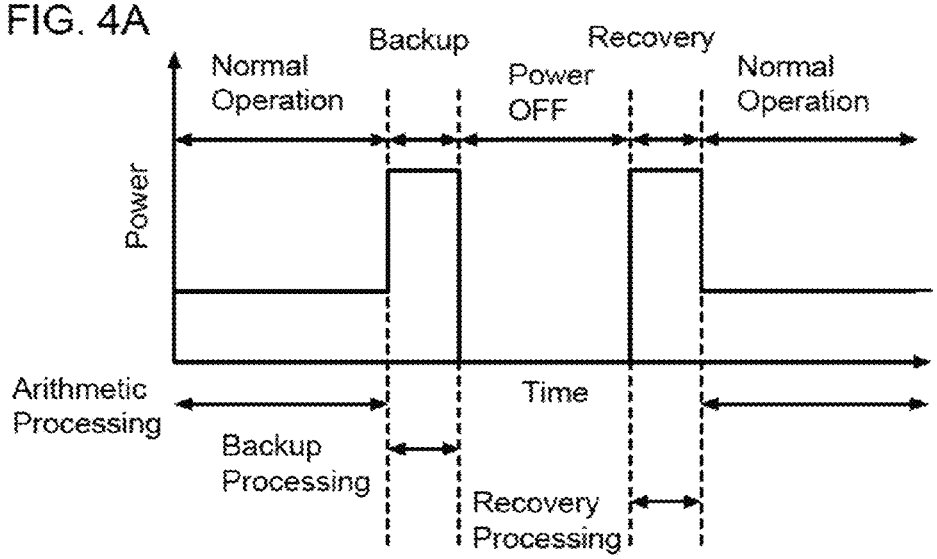
FIGS. 4A to 4C are timing charts each illustrating a relationship between a power gating operation time and power consumption of a processor.
Figure 4B:
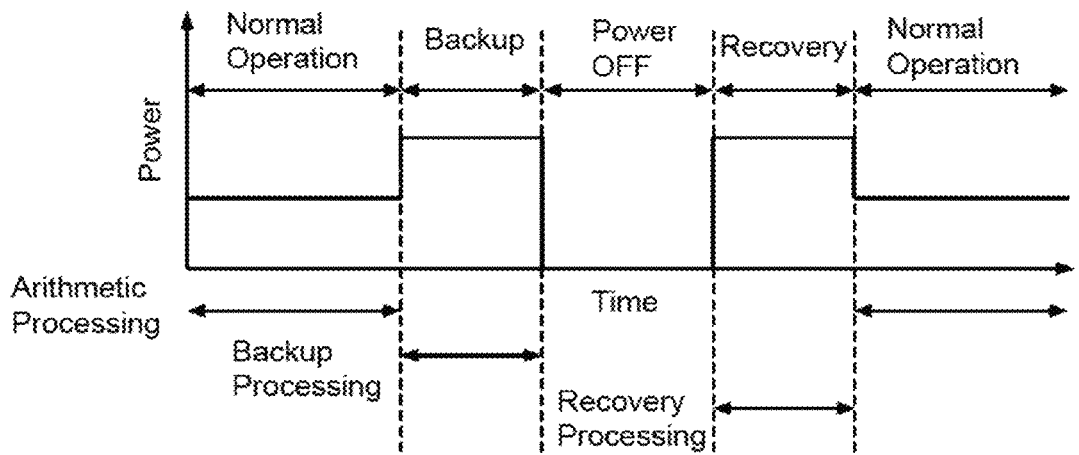
Figure 4C:
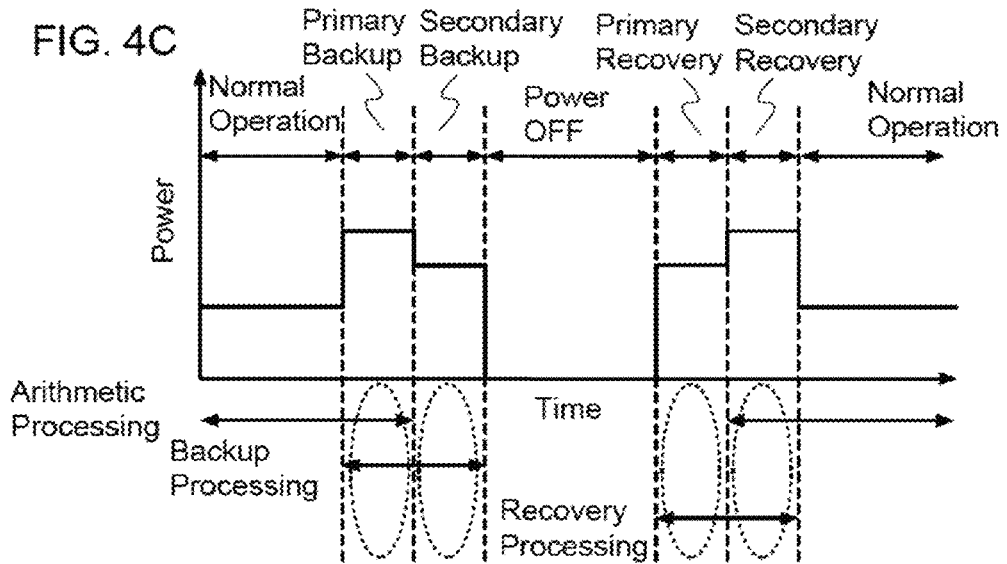

Here, a power gating driving method of the processor 100 is described with reference to FIGS. 4A to 4C. FIGS. 4A to 4C are timing charts each showing power consumption of a processor in power gating. The vertical axis represents power consumption, and the horizontal axis represents time. The timing chart in FIG. 4A shows power consumption of a processor using a conventional power gating driving method. The timing chart in FIG. 4B shows power consumption of a processor using a conventional power gating driving method that is different from the method in FIG. 4A. The timing chart in FIG. 4C shows power consumption of a processor using a power gating driving method of this embodiment.

As shown in FIG. 4A, the conventional power gating driving method has a normal operation period during which a logic unit performs arithmetic processing, a backup period during which an instruction to stop the logic unit is given to the processor and data in the logic unit is backed up, a power-off period during which at least the logic unit is in an off state, a recovery period during which an instruction to start the logic unit is given to the processor and the data in the logic unit is recovered, and a next normal operation period after the data recovery.

Here, as shown in FIG. 4A, when an instruction to stop the logic unit is given to the processor and pieces of data in storage elements in the logic unit are collectively backed up in the backup period, the power consumption of the processor sharply increases. Thus, this causes instantaneous voltage drops in the processor and might lead to malfunction of the processor. In a similar manner, when an instruction to start the logic unit is given to the processor and the pieces of data in the storage elements in the logic unit are collectively recovered in the recovery period, the power consumption of the processor sharply increases. This causes instantaneous voltage drops in the processor and might lead to malfunction of the processor.

On the other hand, as shown in FIG. 4B, for example, when an instruction to stop a logic unit is given to the processor and pieces of data in storage elements in the logic unit are sequentially backed up in the blocks in a backup period, a sharp increase in power consumption of the processor is suppressed, so that instantaneous voltage drops can be prevented. However, when data backup is performed in this manner, as shown in FIG. 4B, the backup period becomes longer, so that the processing speed of the processor decreases. Also in a recovery period, a sharp increase in power consumption of the processor is suppressed by a similar method, so that instantaneous voltage drops can be prevented. However, this leads to an increase of the recovery period.

Thus, as shown in FIG. 4C, in the power gating driving method of this embodiment, part of data backup is performed in parallel with arithmetic processing, and part of data recovery is performed in parallel with arithmetic processing. This prevents a sharp increase in power consumption in a data backup period and a data recovery period and generation of instantaneous voltage drops and inhibits increases of the data backup period and the recovery period.

In other words, power gating of a processor in this embodiment has a normal operation period during which a logic unit performs arithmetic processing, a primary backup period during which data backup in part of the logic unit is performed in parallel with arithmetic processing in another part of the logic unit, a secondary backup period during which an instruction to stop the logic unit is given to the processor and data backup in another part of the logic unit is performed, a power-off period during which at least the logic unit is powered off, a primary recovery period during which an instruction to start the logic unit is given to the processor and data recovery in part of the logic unit is performed, a secondary recovery period during which data recovery in another part of the logic unit is performed in parallel with arithmetic processing in part of the logic unit, and a next normal operation period after complete recovery of data.

In the power gating driving method of the processor 100 in this embodiment, as shown in FIG. 4C, data backup for stopping the logic unit 102 is divided into primary backup and secondary backup. In the primary backup, data is backed up from the volatile memory block 104 to the nonvolatile memory block 105 in part of the logic circuit block 103 in the logic unit 102 before an instruction to stop the logic unit 102, and arithmetic processing is concurrently performed in another part of the logic circuit block 103 in the logic unit 102. In the secondary backup, data is backed up from the volatile memory block 104 to the nonvolatile memory block 105 in another part of the logic circuit block 103 in the logic unit 102 after the instruction to stop the logic unit 102.

When data backup of part of the logic circuit block 103 in the logic unit 102 is performed in the primary backup and data backup of another part of the logic circuit block 103 in the logic unit 102 is performed in the secondary backup as described above, data backup is divided; thus, power needed for the data backup is also divided. Accordingly, a sharp increase in power consumption of the processor 100 after the instruction to stop the logic unit 102 as shown in FIG. 4A can be prevented. Consequently, instantaneous voltage drops due to a sharp increase in power consumption in the data backup and malfunction of the processor 100 due to the voltage drops can be inhibited.

Further, when data backup of part of the logic circuit block 103 in the logic unit 102 is performed in parallel with arithmetic processing in another part of the logic circuit block 103 in the logic unit 102 in the primary backup as described above, the amount of data that should be backed up after the instruction to stop the logic unit (in the secondary backup period) can be reduced compared to the case of backup processing in FIG. 4B. Accordingly, the time needed for data backup (secondary backup) after the instruction to stop the logic unit can be shortened. Consequently, a time from giving the instruction to stop the logic unit to actually powering off the logic unit 102 can be shortened, so that the processing speed of the processor 100 can be increased.

Further, in the power gating driving method of the processor 100 in this embodiment, as shown in FIG. 4C, data recovery for starting the logic unit 102 is divided into primary recovery and secondary recovery. In the primary recovery, data is recovered from the nonvolatile memory block 105 to the volatile memory block 104 in part of the logic circuit block 103 in the logic unit 102 in accordance with an instruction to start the logic unit 102. In the secondary recovery, data is recovered from the nonvolatile memory block 105 to the volatile memory block 104 in another part of the logic circuit block 103 in the logic unit 102 after the completion of the primary recovery, and arithmetic processing is concurrently performed in part of the logic circuit block 103 in the logic unit 102.

When data recovery of part of the logic circuit block 103 in the logic unit 102 is performed in the primary recovery and data recovery of another part of the logic circuit block 103 in the logic unit 102 is performed in the secondary recovery as described above, data recovery is divided; thus, power needed for the data recovery is also divided. Accordingly, a sharp increase in power consumption of the processor 100 after the instruction to start the logic unit as shown in FIG. 4A can be prevented. Consequently, instantaneous voltage drops due to a sharp increase in power consumption in the data recovery and malfunction of the processor 100 due to the voltage drops can be inhibited.

Further, when data recovery of part of the logic circuit block 103 that is needed for at least the minimum arithmetic processing is performed in the primary recovery and data recovery of another part of the logic circuit block 103 in the logic unit 102 is performed in parallel with arithmetic processing in part of the logic circuit block 103 in the logic unit 102 in the secondary recovery as described above, the amount of data that should be recovered right after the instruction to start the logic unit (in the primary recovery period) can be reduced compared to the case of recovery processing in FIG. 4B. Accordingly, the time needed for data recovery (primary recovery) after the instruction to start the logic unit can be shortened. Consequently, a time from giving the instruction to start the logic unit to actually performing arithmetic processing in the logic unit 102 can be shortened, so that the processing speed of the processor 100 can be increased.

By using a power gating driving method in the processor 100 as described above, a sharp increase in power consumption in a data backup period and a data recovery period and generation of instantaneous voltage drops can be prevented, and the data backup period and the recovery period can be shortened. Thus, in the power gating driving method in which power consumption is reduced, malfunction of the processor can be inhibited, and the processing speed of the processor can be increased.

Next, specific examples of a power gating driving method of the processor 100 are described with reference to block diagrams in FIG. 5, FIG. 6, FIG. 7, and FIG. 8 and flow charts in FIG. 9, FIG. 10, FIG. 11, and FIG. 12. The block diagrams in FIG. 5, FIG. 6, FIG. 7, and FIG. 8 illustrate control signals for giving instructions and the flow of data processing in the power gating driving method of the processor 100 by dotted lines. FIG. 5, FIG. 6, FIG. 7, and FIG. 8 correspond to the primary backup, the secondary backup, the primary recovery, and the secondary recovery, respectively. The flow charts in FIG. 9, FIG. 10, FIG. 11, and FIG. 12 illustrate steps in the power gating driving method of the processor 100. FIG. 9, FIG. 10, FIG. 11, and FIG. 12 correspond to the primary backup, the secondary backup, the primary recovery, and the secondary recovery, respectively. Note that reference numerals of the dotted lines in the block diagrams in FIG. 5, FIG. 6, FIG. 7, and FIG. 8 correspond to steps of the same reference numerals in the flow charts in FIG. 9, FIG. 10, FIG. 11, and FIG. 12.

Figure 5:
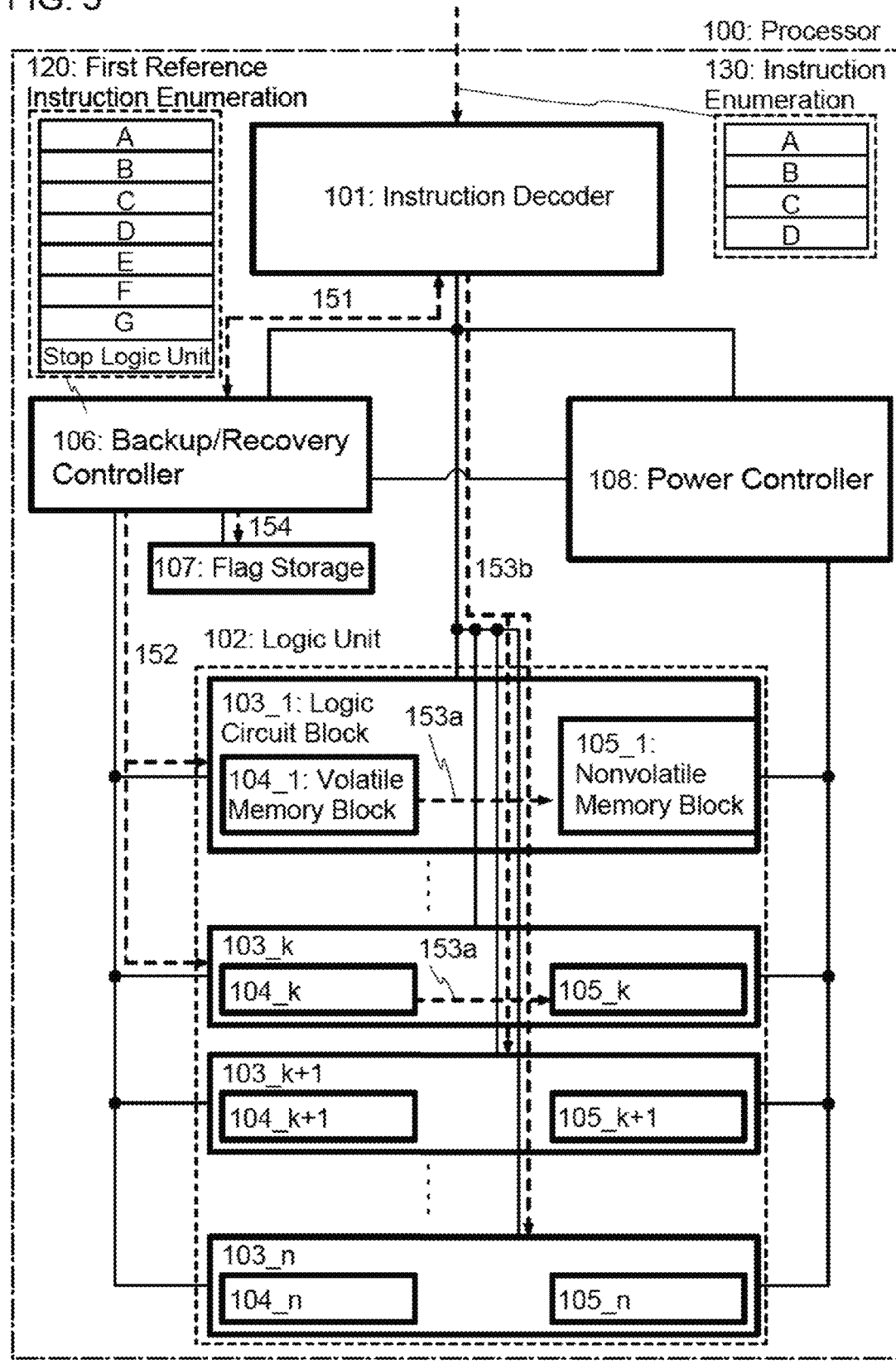
FIG. 5 is a block diagram of a processor according to one embodiment of the disclosed invention.
Figure 9:
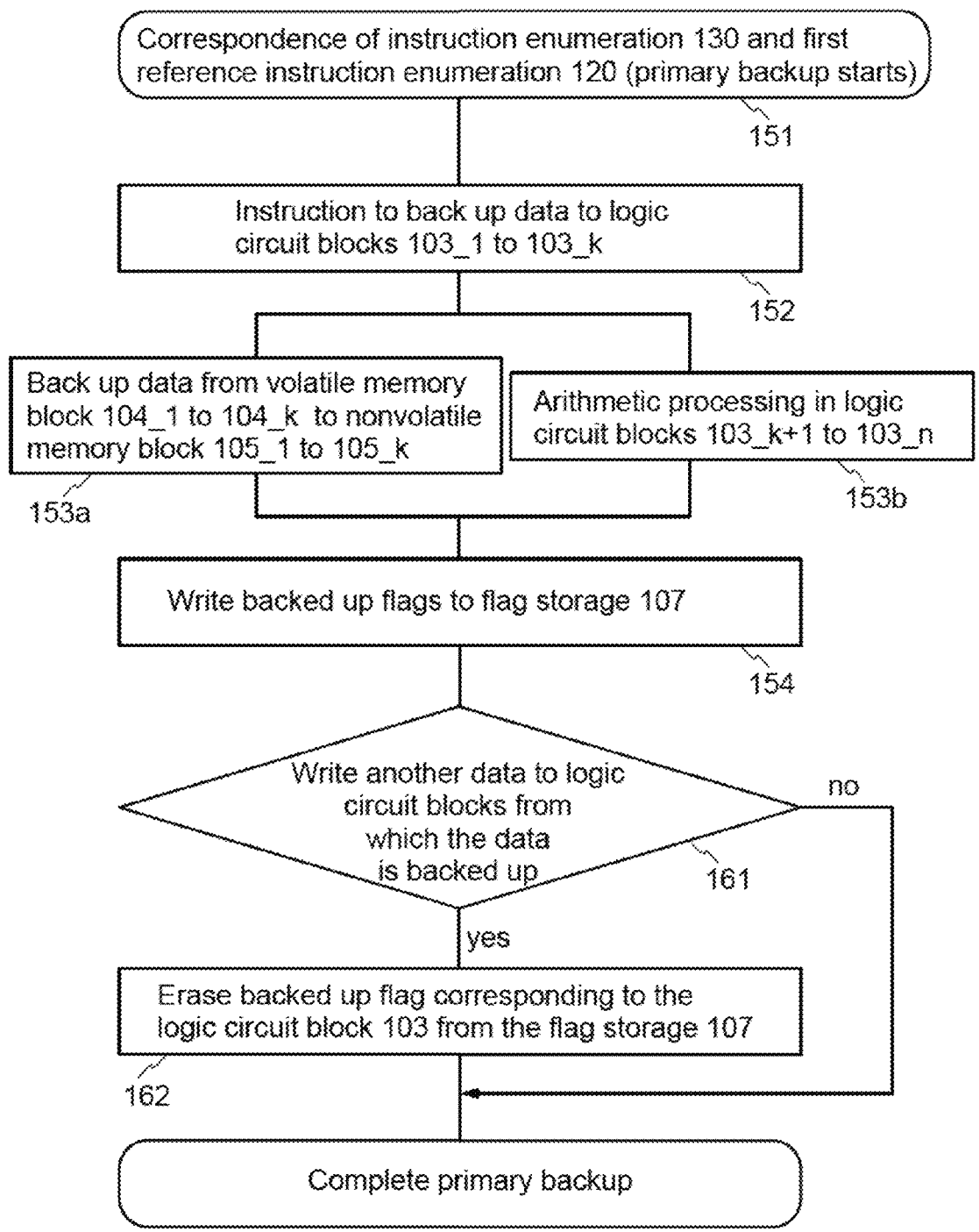
FIG. 9 is a flow chart of a processor according to one embodiment of the disclosed invention.

First, the details of the primary backup are described with reference to the block diagram in FIG. 5 and the flow chart in FIG. 9. Note that until the primary backup is started, the processor 100 performs normal arithmetic processing using the logic unit 102 in accordance with an instruction given from the outside.

The backup/recovery controller 106 first compares first reference instruction enumeration 120 with instruction enumeration 130 and starts the primary backup after the backup/recovery controller 106 confirms correspondence of at least some of them (Step 151).

Here, the instruction enumeration 130 is enumeration of the history of instructions given from the outside of the processor 100. In FIG. 5, instructions A to D given right before the primary backup are used as the instruction enumeration 130.

The first reference instruction enumeration 120 is a sample of instruction enumeration including an instruction to stop a logic unit and a plurality of instructions before the instruction to stop the logic unit in the backup/recovery controller 106. Note that the first reference instruction enumeration 120 includes at least the plurality of instructions before the instruction to stop the logic unit, and does not necessarily include the instruction to stop the logic unit. In FIG. 5, the instruction to stop the logic unit and instructions A to G before the instruction to stop the logic unit are used as the first reference instruction enumeration 120. Note that the first reference instruction enumeration 120 may be prepared in the backup/recovery controller 106, or may be acquired from the history of instructions in power gating.

When normal arithmetic processing is performed, the backup/recovery controller 106 always compares the first reference instruction enumeration 120 with the instruction enumeration 130 given from the outside of the processor 100, and starts the primary backup after the backup/recovery controller 106 confirms correspondence of at least some of them. In FIG. 5, the instructions A to D in the first reference instruction enumeration 120 correspond to the instructions A to D in the instruction enumeration 130.

The backup/recovery controller 106 selects the logic circuit block 103 that is not used until the instruction to stop the logic unit is given to the processor 100 from the step in accordance with the first reference instruction enumeration 120 after the backup/recovery controller 106 confirms correspondence of at least part of the first reference instruction enumeration 120 and part of the instruction enumeration 130. In this embodiment, the backup/recovery controller 106 selects logic circuit blocks 103_1 to 103_k (k is an integer of 1 or more and less than n) that are not used in accordance with the instruction with reference to instructions E to G after the instruction D.

The backup/recovery controller 106 gives an instruction to back up data from the volatile memory block 104 to the nonvolatile memory block 105 to the selected logic circuit blocks 103_1 to 103_k (Step 152).

When the backup/recovery controller 106 has the first reference instruction enumeration 120 in this manner, backup of data in part of the logic circuit block 103 in the logic unit 102 can be started before the instruction to stop the logic unit is actually given from the outside of the processor 100.

The logic circuit blocks 103_1 to 103_k receive the instruction from the backup/recovery controller 106 and back up data from the volatile memory block 104 to the nonvolatile memory block 105 (Step 153a).

Here, for example, in the case where the volatile memory block 104 and the nonvolatile memory block 105 have the structures in FIG. 2C, a high potential is applied to the transistor 110 as the control signal S1, and the potential of the node holding electric charge corresponding to data in the volatile memory block 104 is applied to the node M1 of the nonvolatile memory block 105. After that, by turning off the transistor 110 by application of a low potential as the potential of the control signal S1, the potential applied to the node M1 is held. In this manner, in the logic circuit blocks 103_1 to 103_k, data is backed up from the volatile memory block 104 to the nonvolatile memory block 105.

In parallel with Step 153a, logic circuit blocks 103_k+1 to 103_n that are not selected by the backup/recovery controller 106 perform arithmetic processing in accordance with an instruction from the instruction decoder 101 (Step 153b).

When data backup of part of the logic circuit block 103 in the logic unit 102 is performed in parallel with arithmetic processing in another part of the logic circuit block 103 in the logic unit 102 as described above, the amount of data that should be backed up after the instruction to stop the logic unit (in the secondary backup period) can be reduced. Accordingly, the time needed for data backup (secondary backup) after the instruction to stop the logic unit can be shortened. Consequently, a time from giving the instruction to stop the logic unit to actually powering off the logic unit 102 can be shortened, so that the processing speed of the processor 100 can be increased.

The backup/recovery controller 106 writes backed up flags of the logic circuit blocks 103_1 to 103_k to the flag storage 107 in accordance with the data backup in the logic circuit blocks (Step 154).

Note that writing of the backed up flags of the logic circuit blocks 103_1 to 103_k is not necessarily performed after Step 153a. For example, the writing of the backed up flags of the logic circuit blocks 103_1 to 103_k may be performed in parallel with Step 153a or Step 153b, or may be performed in parallel with Step 152.

When the data backup of the logic circuit blocks 103_1 to 103_k and the writing of the backed up flags of the logic circuit blocks 103_1 to 103_k are terminated, the primary backup is completed.

Note that in the data backup, depending on an instruction given from the outside of the processor 100, the logic circuit block 103 that is not used until the instruction to stop the logic unit is given to the processor 100 in accordance with the first reference instruction enumeration 120 is also used for arithmetic processing in some cases. In other words, another data is written to any of the logic circuit blocks 103_1 to 103_k from which the data is backed up in some cases (Step 161). Note that Step 161 and the next step (Step 162) are not illustrated in the block diagram of FIG. 5.

In the case where another data is written to any of the logic circuit blocks 103_1 to 103_k from which the data is backed up in this manner, a backed up flag corresponding to the logic circuit block 103 to which the data is written is erased from the flag storage 107 (Step 162). Thus, data backup of the logic circuit block 103 to which the data is written is performed not in the primary backup but in the secondary backup.

For example, in the case where another data is written to the logic circuit block 103_1 after data backup of the logic circuit block 103_1 is performed in Step 153a, a backed up flag corresponding to the logic circuit block 103_1 is erased from the flag storage 107. Data backup of the logic circuit block 103_1 and data backup of the logic circuit blocks 103_k+1 to 103_n are performed in the secondary backup.

By writing the backed up flags of the logic circuit blocks 103_1 to 103_k to the flag storage 107 in accordance with the data backup of the logic circuit blocks as described above, even when an instruction that is different from the first reference instruction enumeration 120 is given, the primary backup can be continuously performed by just erasing a backed up flag corresponding to the instruction.

Figure 6:
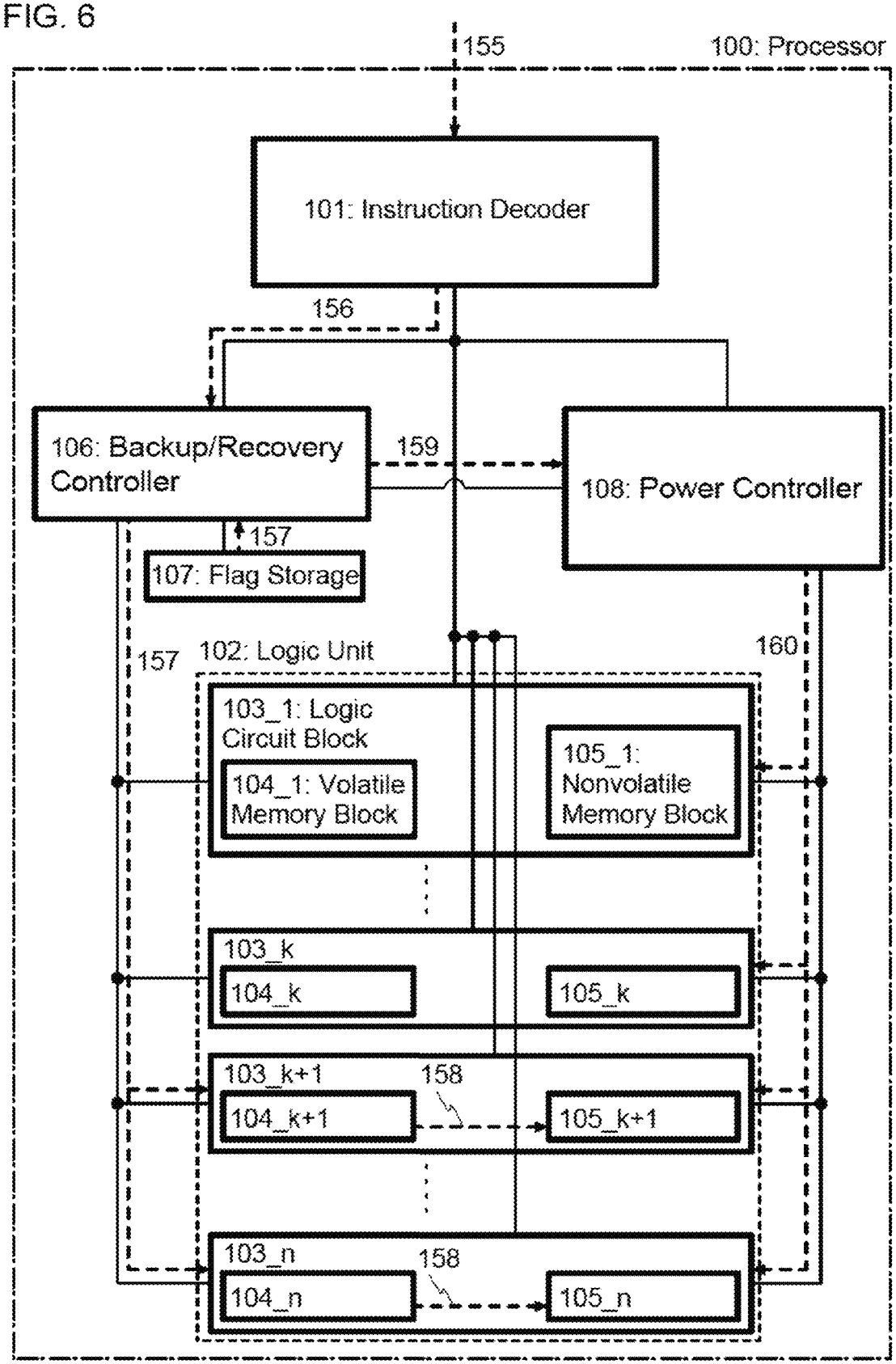
FIG. 6 is a block diagram of a processor according to one embodiment of the disclosed invention.
Figure 10:
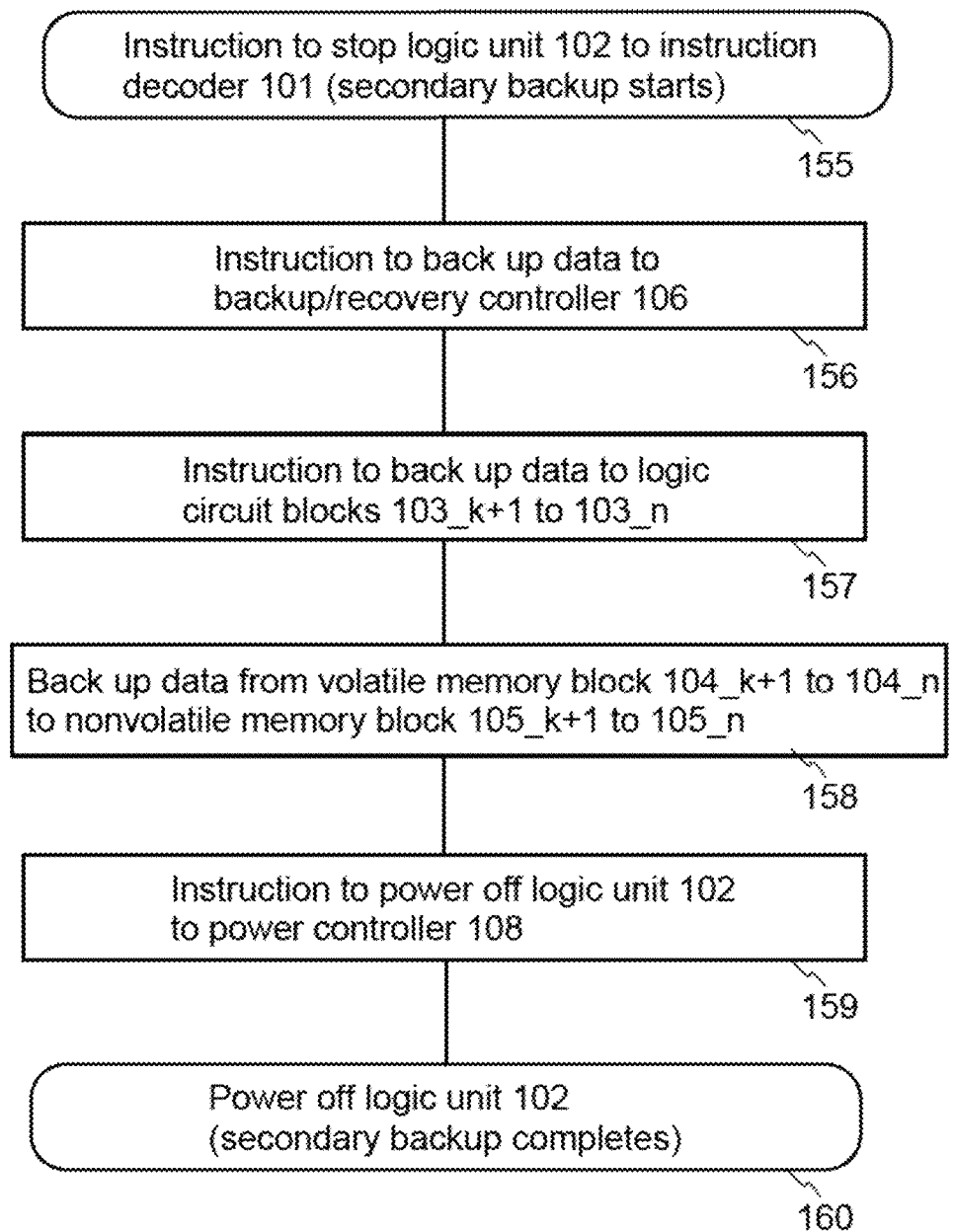
FIG. 10 is a flow chart of a processor according to one embodiment of the disclosed invention.

Next, the details of the secondary backup are described with reference to the block diagram in FIG. 6 and the flow chart in FIG. 10.

First, an instruction to stop the logic unit 102 is given from the outside of the processor 100 to the instruction decoder 101, and the secondary backup is started (Step 155). Note that in the case where the data backup of the logic circuit blocks 103_1 to 103_k is not terminated at the time when the instruction to stop the logic unit is given from the outside of the processor 100, the data backup of the logic circuit blocks 103_1 to 103_k may be continuously performed.

The instruction decoder 101 receives an instruction to stop the logic unit, and gives, to the backup/recovery controller 106, an instruction to back up data in the logic circuit block 103 in the logic unit 102 (Step 156).

The backup/recovery controller 106 gives an instruction to back up data from the volatile memory block 104 to the nonvolatile memory block 105 to the logic circuit blocks 103_k+1 to 103_n in accordance with the backed up flags written to the flag storage 107 in the primary backup (Step 157).

In this embodiment, since the backed up flags of the logic circuit blocks 103_1 to 103_k are written to the flag storage 107 in the primary backup, the backup/recovery controller 106 gives an instruction to back up data to the logic circuit blocks 103_k+1 to 103_n in which data backup is not performed. In the case where there is a logic circuit block 103 whose backed up flag is erased in Step 162 in the primary backup, the backup/recovery controller 106 also gives, to the logic circuit block 103, an instruction to back up data.

The logic circuit blocks 103_k+1 to 103_n receive the instruction from the backup/recovery controller 106 and back up data from the volatile memory block 104 to the nonvolatile memory block 105 (Step 158).

Here, for example, in the case where the volatile memory block 104 and the nonvolatile memory block 105 have the structures in FIG. 2C, a high potential is applied to the transistor 110 as the control signal S1, and the potential of the node holding electric charge corresponding to data in the volatile memory block 104 is applied to the node M1 of the nonvolatile memory block 105. After that, by turning off the transistor 110 by application of a low potential as the potential of the control signal S1, the potential applied to the node M1 is held. In this manner, in the logic circuit blocks 103_k+1 to 103_n, data is backed up from the volatile memory block 104 to the nonvolatile memory block 105.

When data backup of part of the logic circuit block 103 in the logic unit 102 is performed in the primary backup and data backup of another part of the logic circuit block 103 in the logic unit 102 is performed in the secondary backup as described above, data backup is divided; thus, power needed for the data backup is also divided. Accordingly, a sharp increase in power consumption of the processor 100 after the instruction to stop the logic unit can be prevented. Consequently, instantaneous voltage drops due to a sharp increase in power consumption in the data backup and malfunction of the processor 100 due to the voltage drops can be inhibited.

The backup/recovery controller 106 gives an instruction to power off the plurality of logic circuit blocks 103_1 to 103_n in the logic unit 102 to the power controller 108 after the data backup in the logic circuit blocks 103_k+1 to 103_n is completed (Step 159).

The power controller 108 receives the instruction to power off the logic unit 102 and powers off the plurality of logic circuit blocks 103_1 to 103_n in the logic unit 102, so that the secondary backup is completed (Step 160).

Here, by providing a transistor with extremely low off-state current in the power controller 108 to form a switch for selecting whether the logic unit 102 is powered on or off, when the logic unit 102 is in an off state, leakage current between the power controller 108 and the logic circuit blocks 103_1 to 103_n in the logic unit 102 can be reduced, so that the power consumption of the processor can be reduced.

Here, the power controller 108 may power off at least the plurality of logic circuit blocks 103_1 to 103_n in the logic unit 102, and can power off another part of the processor 100. For example, the power controller 108 can power off the logic unit 102 and the backup/recovery controller 106. Note that in the case where the backup/recovery controller 106 is powered off, it is necessary to prevent the first reference instruction enumeration 120 and second reference instruction enumeration 122 used in the primary recovery from being erased when the backup/recovery controller 106 is powered off. Thus, it is necessary to provide at least a nonvolatile storage element in the storage storing the first reference instruction enumeration 120 and the second reference instruction enumeration 122.

Note that in this embodiment, data backup of part of the logic circuit block 103 in the logic unit 102 is performed in the primary backup; however, the present invention is not limited thereto. Part of the logic circuit block 103 in the logic unit 102 may be further divided, and the primary backup may be separately performed. For example, the logic circuit blocks 103_1 to 103_k can be further divided into two blocks and Steps 152 to 154 can be performed in each block. With such a structure, power needed for data backup is further divided. Consequently, instantaneous voltage drops due to a sharp increase in power consumption in the data backup and malfunction of the processor 100 due to the voltage drops can be further inhibited.

Figure 7:
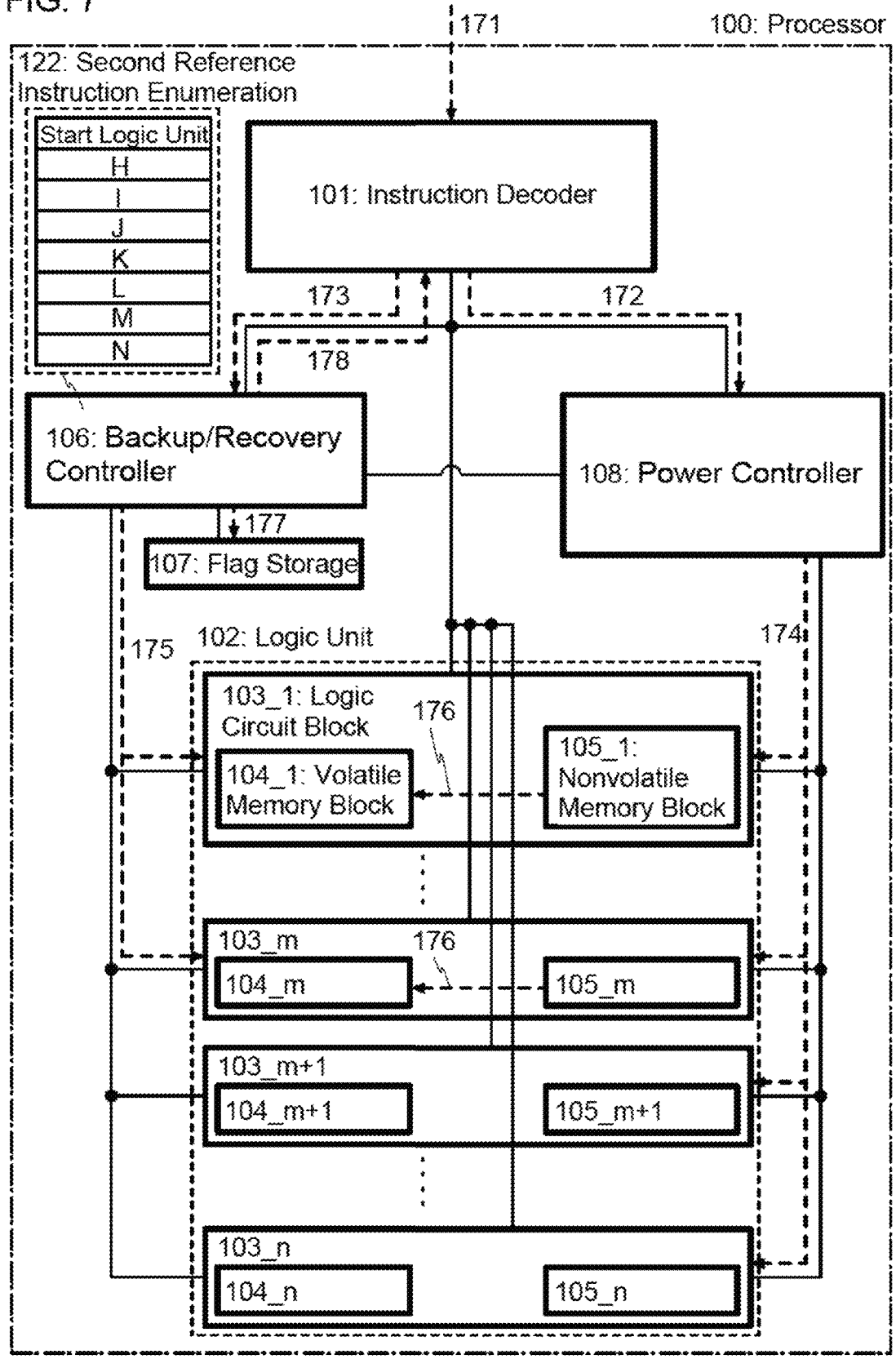
FIG. 7 is a block diagram of a processor according to one embodiment of the disclosed invention.

Next, the details of the primary recovery are described with reference to the block diagram in FIG. 7 and the flow chart in FIG. 11. Note that until the primary recovery is started, the logic circuit blocks 103_1 to 103_n are in an off state in the secondary backup to stop the logic unit 102.

First, an instruction to start the logic unit 102 is given from the outside of the processor 100 to the instruction decoder 101, and the primary recovery is started (Step 171).

The instruction decoder 101 receives an instruction to start the logic unit 102, and gives an instruction to power on the plurality of logic circuit blocks 103_1 to 103_n in the logic unit 102 to the power controller 108 (Step 172).

The instruction decoder 101 receives the instruction to start the logic unit 102, and gives, to the backup/recovery controller 106, an instruction to recover data in the logic circuit block 103 in the logic unit 102 (Step 173).

Figure 11:
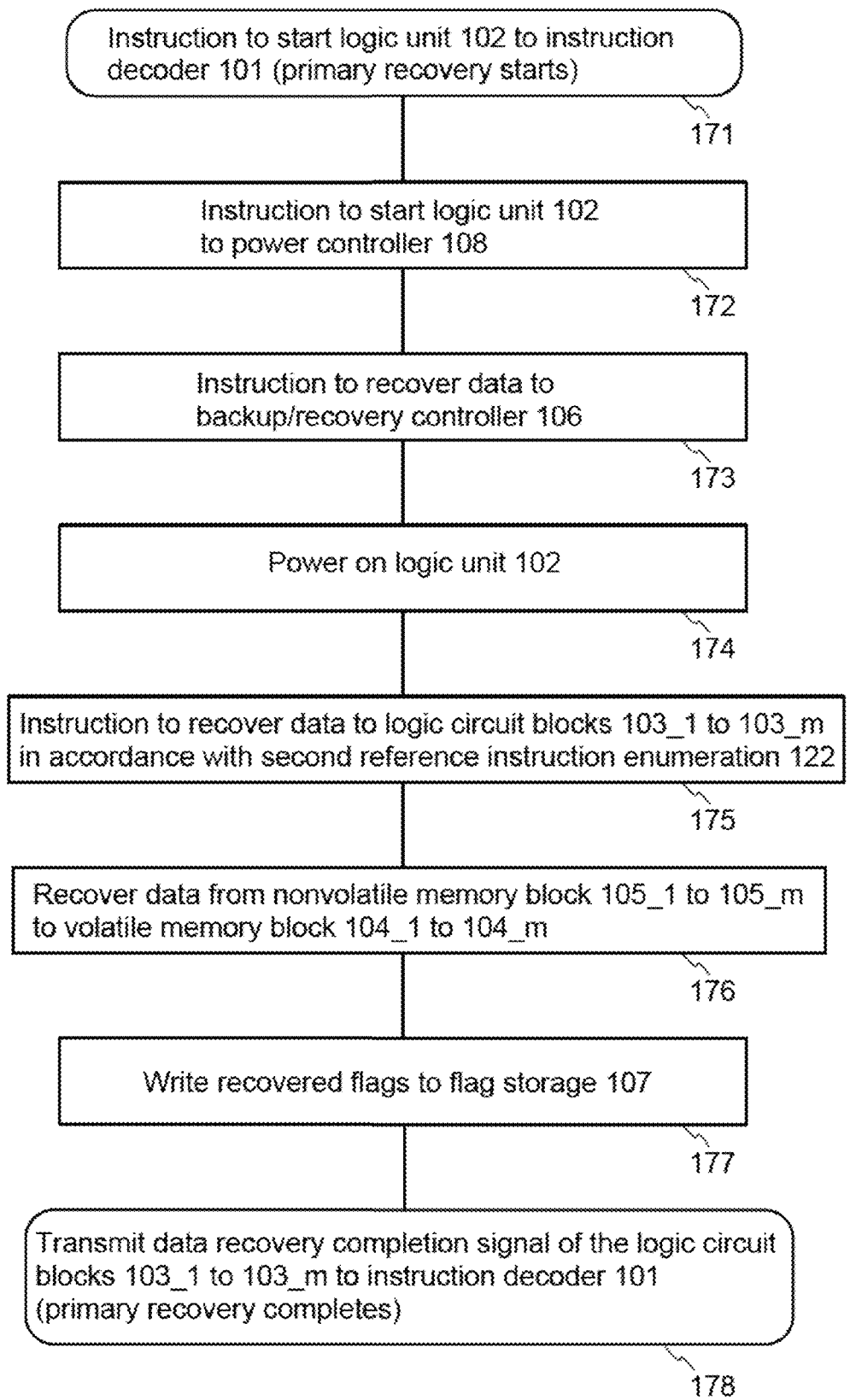
FIG. 11 is a flow chart of a processor according to one embodiment of the disclosed invention.

Note that in the flow chart in FIG. 11, Step 172 and Step 173 are sequentially performed; however, the order of the steps is not necessarily limited. For example, Step 172 and Step 173 may be performed concurrently.

The power controller 108 receives an instruction to power on the logic unit 102, and powers on the plurality of logic circuit blocks 103_1 to 103_n in the logic unit 102 (Step 174).

The backup/recovery controller 106 receives the instruction to recover data in the logic circuit block 103 in the logic unit 102, and selects the logic circuit block 103 to be used after the instruction to start the logic unit is given in accordance with the second reference instruction enumeration 122.

Here, the second reference instruction enumeration 122 is a sample of instruction enumeration including an instruction to start a logic unit and a plurality of instructions after the instruction to start the logic unit in the backup/recovery controller 106. Note that the second reference instruction enumeration 122 includes at least the plurality of instructions after the instruction to start the logic unit, and does not necessarily include the instruction to start the logic unit. In FIG. 7, the instruction to start the logic unit and instructions H to N after the instruction to start the logic unit are used as the second reference instruction enumeration 122. Note that the second reference instruction enumeration 122 may be prepared in the backup/recovery controller 106, or may be acquired from the history of instructions in power gating.

When the backup/recovery controller 106 analyzes the second reference instruction enumeration 122, the use order of the logic circuit blocks 103_1 to 103_n after the instruction to start the logic unit is clear. Thus, the priority order of data recovery in the logic circuit block 103 can be determined. In this embodiment, the backup/recovery controller 106 selects logic circuit blocks 103_1 to 103_m (m is an integer of 1 or more and less than n) that are used in accordance with the instruction with reference to the instructions H to N after the instruction to start the logic unit. Note that the second reference instruction enumeration 122 may be analyzed after an instruction to recover data in the logic circuit block 103 in the logic unit 102 is received, or the second reference instruction enumeration 122 may be analyzed in a normal operation period in the case where the second reference instruction enumeration 122 is prepared.

The backup/recovery controller 106 gives an instruction to recover data from the nonvolatile memory block 105 to the volatile memory block 104 to the selected logic circuit blocks 103_1 to 103_m (Step 175).

When the backup/recovery controller 106 includes the second reference instruction enumeration 122 in this manner, data recovery can be performed by selecting part of the logic circuit block 103 that is needed for at least the minimum arithmetic processing in the primary recovery, and data recovery in another part of the logic circuit block 103 can be performed in parallel with arithmetic processing in the secondary recovery.

Accordingly, the time needed for data recovery (primary recovery) after the instruction to start the logic unit is given can be shortened. Consequently, a time from giving the instruction to start the logic unit to actually performing arithmetic processing in the logic unit 102 can be shortened, so that the processing speed of the processor 100 can be increased.

The logic circuit blocks 103_1 to 103_m receive the instruction from the backup/recovery controller 106 and recover data from the nonvolatile memory block 105 to the volatile memory block 104 (Step 176).

Here, for example, in the case where the volatile memory block 104 and the nonvolatile memory block 105 have the structures in FIG. 2C, a high potential is applied to the transistor 113 as the control signal S2, and a potential based on the on state or off state of the transistor 112 can be applied to the node holding electric charge corresponding to data in the volatile memory block 104. In this manner, in the logic circuit blocks 103_1 to 103_m, data is recovered from the nonvolatile memory block 105 to the volatile memory block 104.

The backup/recovery controller 106 writes recovered flags of the logic circuit blocks 103_1 to 103_m to the flag storage 107 in accordance with the data recovery in the logic circuit blocks (Step 177).

Note that writing of the recovered flags of the logic circuit blocks 103_1 to 103_m is not necessarily performed after Step 176. For example, the writing of the recovered flags of the logic circuit blocks 103_1 to 103_m may be performed in parallel with Step 175, or may be performed in parallel with Step 176.

After the data recovery in the logic circuit blocks 103_1 to 103_m is completed, the backup/recovery controller 106 transmits a data recovery completion signal of the logic circuit blocks 103_1 to 103_m to the instruction decoder 101 (Step 178). Thus, the primary recovery is completed, and the secondary recovery is started.

Figure 8:
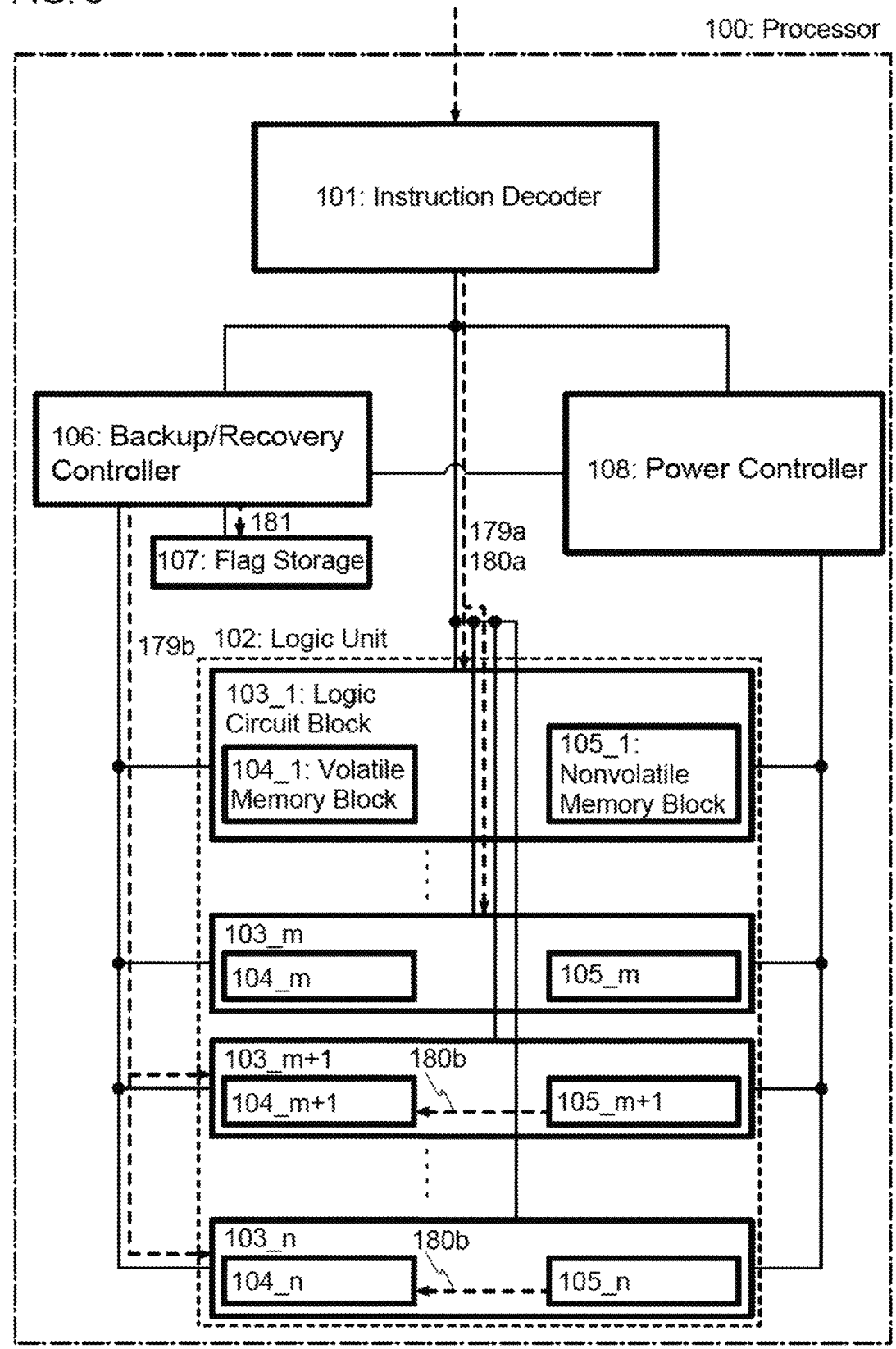
FIG. 8 is a block diagram of a processor according to one embodiment of the disclosed invention.
Figure 12:
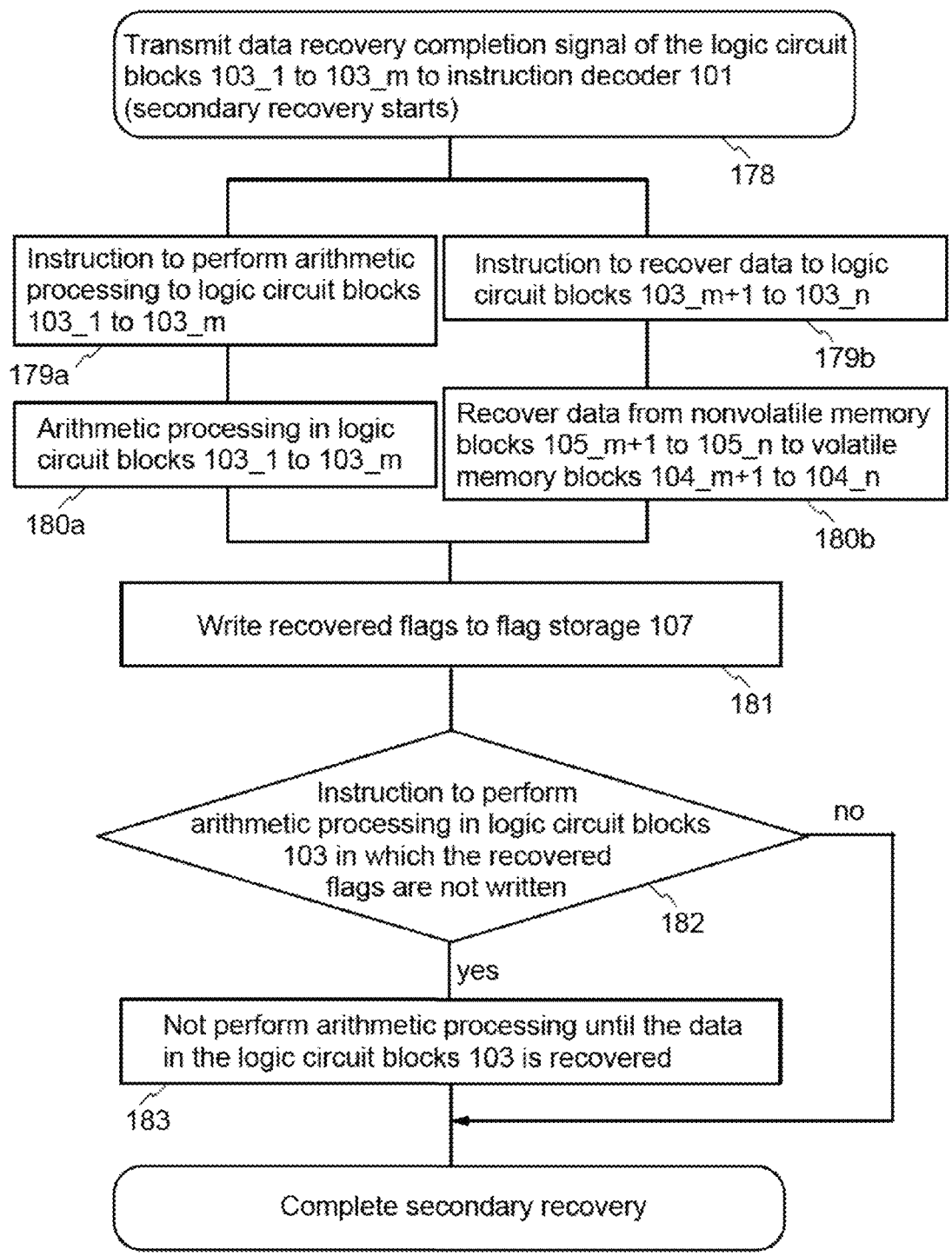
FIG. 12 is a flow chart of a processor according to one embodiment of the disclosed invention.

Finally, the details of the secondary recovery are described with reference to the block diagram in FIG. 8 and the flow chart in FIG. 12.

The instruction decoder 101 receives the data recovery completion signal of the logic circuit blocks 103_1 to 103_m, and gives an instruction to perform arithmetic processing to the logic circuit blocks 103_1 to 103_m in the logic unit 102 in accordance with an instruction given from the outside of the processor 100 after the instruction to start the logic unit (Step 179a).

In parallel with Step 179a, the backup/recovery controller 106 gives an instruction to recover data from the nonvolatile memory block 105 to the volatile memory block 104 to the logic circuit blocks 103_m+1 to 103_n in accordance with the recovered flags written to the flag storage 107 in the primary recovery (Step 179b).

The logic circuit blocks 103_1 to 103_m in the logic unit 102 receive the instruction from the instruction decoder 101, and perform arithmetic processing using the data recovered from the nonvolatile memory block 105 to the volatile memory block 104 in the primary recovery (Step 180a).

In parallel with Step 180a, the logic circuit blocks 103_m+1 to 103_n receive the instruction from the backup/recovery controller 106 and recover data from the nonvolatile memory block 105 to the volatile memory block 104 (Step 180b).

Here, for example, in the case where the volatile memory block 104 and the nonvolatile memory block 105 have the structures in FIG. 2C, a high potential is applied to the transistor 113 as the control signal S2, and a potential based on the on state or off state of the transistor 112 can be applied to the node holding electric charge corresponding to data in the volatile memory block 104. In this manner, in the logic circuit blocks 103_m+1 to 103_n, data is recovered from the nonvolatile memory block 105 to the volatile memory block 104.

When data recovery of part of the logic circuit block 103 in the logic unit 102 is performed in the primary recovery and data recovery of another part of the logic circuit block 103 in the logic unit 102 is performed in the secondary recovery as described above, data recovery is divided; thus, power needed for the data recovery is also divided. Accordingly, a sharp increase in power consumption of the processor 100 after the instruction to start the logic unit 102 can be prevented. Consequently, instantaneous voltage drops due to a sharp increase in power consumption in the data recovery and malfunction of the processor 100 due to the voltage drops can be inhibited.

The backup/recovery controller 106 writes recovered flags of the logic circuit blocks 103_*m*+1 to 103_*n* to the flag storage 107 in accordance with the data recovery in the logic circuit blocks (Step 181).

Note that writing of the recovered flags of the logic circuit blocks 103_*m*+1 to 103_*n* is not necessarily performed after Step 180*b*. For example, the writing of the recovered flags of the logic circuit blocks 103_*m*+1 to 103_*n* may be performed in parallel with Step 180*a* or Step 180*b*, or may be performed in parallel with Step 179*a* or Step 179*b*.

When the data recovery of the logic circuit blocks 103_*m*+1 to 103_*n* and the writing of the recovered flags of the logic circuit blocks 103_*m*+1 to 103_*n* are terminated, the secondary recovery is completed.

Note that in the data recovery, depending on an instruction given from the outside of the processor 100, the logic circuit blocks 103_*m*+1 to 103_*n* that are not used in the secondary recovery period after the instruction to start the logic unit is given to the processor 100 in accordance with the second reference instruction enumeration 122 are also used for arithmetic processing in the secondary recovery period in some cases. In other words, an instruction to perform arithmetic processing using any of the logic circuit blocks 103_*m*+1 to 103_*n* in which the data is not recovered is given in some cases (Step 182). Note that Step 182 and the next step (Step 183) are not illustrated in the block diagram of FIG. 8.

In the case where an instruction to perform arithmetic processing using any of the logic circuit blocks 103_*m*+1 to 103_*n* in which the data is not recovered is given in this manner, arithmetic processing is not performed until the data in the logic circuit block 103 is recovered (Step 183). Preferably, in the logic circuit block 103, data is preferentially recovered from the nonvolatile memory block 105 to the volatile memory block 104.

For example, in the case where an instruction to perform arithmetic processing using the logic circuit block 103_*n* is given from the outside of the processor 100 before data recovery in the logic circuit block 103_*n* is performed in Step 180*b*, arithmetic processing is not performed until the data recovery in the logic circuit block 103_*n* is performed. Preferably, in the logic circuit block 103_*n*, data is preferentially recovered from the nonvolatile memory block 105_*n* to the volatile memory block 104_*n*.

By writing the recovered flags of the logic circuit blocks 103_*m*+1 to 103_*n* to the flag storage 107 in accordance with the data recovery of the logic circuit blocks as described above, even when an instruction that is different from the second reference instruction enumeration 122 is given, by comparison with the recovered flag, whether data in the logic circuit block 103 used in accordance with the instruction is recovered can be determined easily.

In this manner, the secondary recovery is completed after the data recovery in the logic circuit blocks 103_*m*+1 to 103_*n* is completed. After the secondary recovery is completed, the processor 100 starts normal arithmetic processing using the logic unit 102 in accordance with an instruction given from the outside.

Note that in this embodiment, data recovery of part of the logic circuit block 103 in the logic unit 102 is performed in the primary recovery; however, the present invention is not limited thereto. Part of the logic circuit block 103 in the logic unit 102 may be further divided, and the primary recovery may be separately performed. For example, the logic circuit blocks 103_1 to 103_*m* can be further divided into two blocks and Steps 175 to 177 can be performed in each block. With such a structure, power needed for data recovery is further divided. Consequently, instantaneous voltage drops due to a sharp increase in power consumption in the data recovery and malfunction of the processor 100 due to the voltage drops can be further inhibited.

By using a power gating driving method as described above, a sharp increase in power consumption in a data backup period and a data recovery period and generation of instantaneous voltage drops can be prevented, and the data backup period and the recovery period can be shortened. Thus, in the power gating driving method in which power consumption is reduced, malfunction of the processor can be inhibited, and the processing speed of the processor can be increased.

The structures, methods, and the like in this embodiment can be combined with any of the structures, methods, and the like in the other embodiments as appropriate.

Embodiment 2

In this embodiment, an example of a method for manufacturing the nonvolatile memory block described in the above embodiment is described with reference to FIGS. 13A to 13D, FIGS. 14A to 14C, FIGS. 15A to 15C, FIGS. 16A and 16B, and FIGS. 17A and 17B. A method for manufacturing the transistor 110 and the transistor 112 in the nonvolatile memory block 105 in FIG. 2B is described. Note that in FIGS. 13A to 13D, FIGS. 14A to 14C, FIGS. 15A to 15C, and FIGS. 16A and 16B, a cross-sectional view taken along line A-B corresponds to a cross-sectional view of a region where the transistor 110 including an oxide semiconductor as a wide band gap semiconductor and the n-channel transistor 112, and a cross-sectional view taken along line C-D corresponds to a cross-sectional view of a node FG at which the drain electrode (or the source electrode) of the transistor 110 including an oxide semiconductor film is connected to the gate electrode of the n-channel transistor 112.

Note that the transistor included in the volatile memory block 104 in FIG. 2B can be formed using a material and a method that are similar to those of the transistor 112. In the case where the structure in FIG. 2C is employed, the transistor 113 can also be formed using a material and a method that are similar to those of the transistor 112.

Figure 13A:
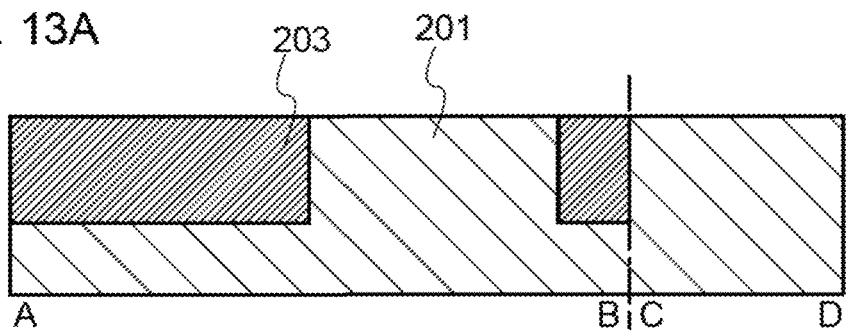
FIGS. 13A to 13D are cross-sectional views illustrating some of steps of manufacturing a processor according to one embodiment of the disclosed invention.

First, as illustrated in FIG. 13A, element isolation regions 203 are formed in a p-type semiconductor substrate 201.

As the p-type semiconductor substrate 201, a single crystal silicon substrate (a silicon wafer) having p-type conductivity, or a compound semiconductor substrate (e.g., a SiC substrate or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from a surface and defects generated in a surface layer are eliminated by high-temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation region 203 can be formed by local oxidation of silicon (LOCOS), shallow trench isolation (STI), or the like.

In the case where a p-channel transistor is formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used as the semiconductor substrate 201 here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Figure 13B:
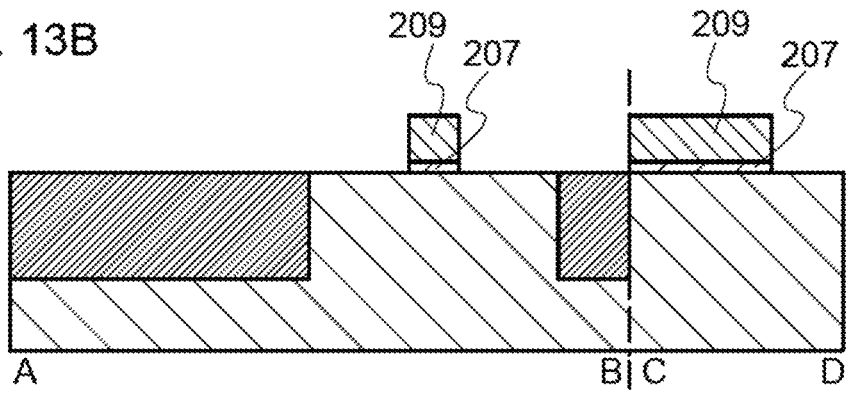

Next, as illustrated in FIG. 13B, a gate insulating film 207 and a gate electrode 209 are formed over the semiconductor substrate 201.

A surface of the semiconductor substrate 201 is oxidized by heat treatment, so that a silicon oxide film is formed. Alternatively, a silicon oxide film is formed by thermal oxidation, and then a surface of the silicon oxide film is nitrided by nitriding treatment; thus a layered structure including the silicon oxide film and a silicon film containing oxygen and nitrogen (silicon oxynitride film) is formed. Next, part of the silicon oxide film or the silicon oxynitride film is selectively etched to form the gate insulating film 207. Alternatively, the gate insulating film 207 is formed in such a manner that silicon oxide, silicon oxynitride, a metal oxide such as a tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to a thickness of 5 to 50 nm by CVD, sputtering, or the like, and then part thereof is selectively etched.

The gate electrode 209 is preferably formed using metal selected from tantalum, tungsten, titanium, molybdenum, chromium, or niobium, or an alloy material or a compound material including any of the metals as its main component. Alternatively, polycrystalline silicon to which an impurity element such as phosphorus is added can be used. Alternatively, the gate electrode 209 may be formed to have a layered structure of a metal nitride film and a film of any of the metals. As a metal nitride, tungsten nitride, molybdenum nitride, or titanium nitride can be used. When the metal nitride film is provided, adhesiveness of the metal film can be increased; thus, separation can be prevented.

The gate electrode 209 is formed in such a manner that a conductive film is formed by sputtering, CVD, or the like and then part of the conductive film is selectively etched.

Here, the surface of the semiconductor substrate 201 is oxidized by heat treatment to form a silicon oxide film; a conductive film including a stack of a tantalum nitride film and a tungsten film is formed over the silicon oxide film by sputtering; and then part of the silicon oxide film and part of the conductive film are selectively etched. Thus, the gate insulating film 207 and the gate electrode 209 are formed.

Note that for high integration, a structure in which a sidewall insulating layer is not provided on a side surface of the gate electrode 209 is preferable. On the other hand, when the characteristics of the transistor have priority, a sidewall insulating layer can be provided on the side surface of the gate electrode 209.

Figure 13C:
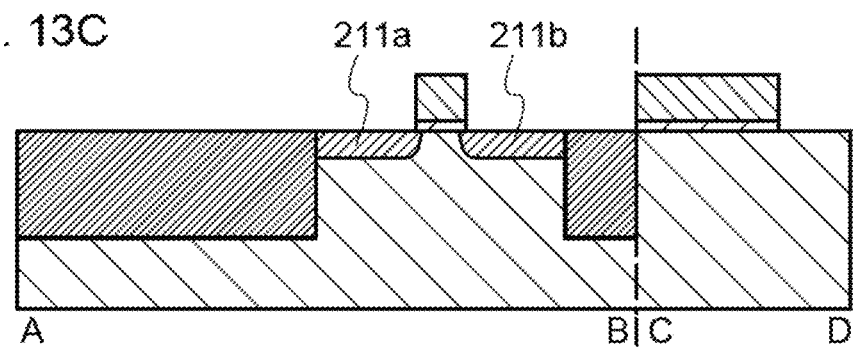

Next, as illustrated in FIG. 13C, an impurity element imparting n-type conductivity is added to the semiconductor substrate 201 to form n-type impurity regions 211a and 211b. In the case where an n-well region is formed in the same substrate, p-type impurity regions are formed by addition of an impurity element imparting p-type conductivity to the n-well region. The concentration of the impurity element imparting n-type conductivity in the n-type impurity regions 211a and 211b and the concentration of the impurity element imparting p-type conductivity in the p-type impurity regions preferably range from $1 \times 10^{19}$ to $1 \times 10^{21}$ atoms/cm$^3$. The impurity element imparting n-type conductivity and the impurity element imparting p-type conductivity are added to the semiconductor substrate 201 and the n-well region, respectively, by ion doping, ion implantation, or the like as appropriate.

In the case where a sidewall insulating layer is formed on the side surface of the gate electrode 209, an impurity region having impurity concentration different from that in the n-type impurity regions 211a and 211b and that in the p-type concentration regions can be formed in a region overlapping with the sidewall insulating layer.

Figure 13D:
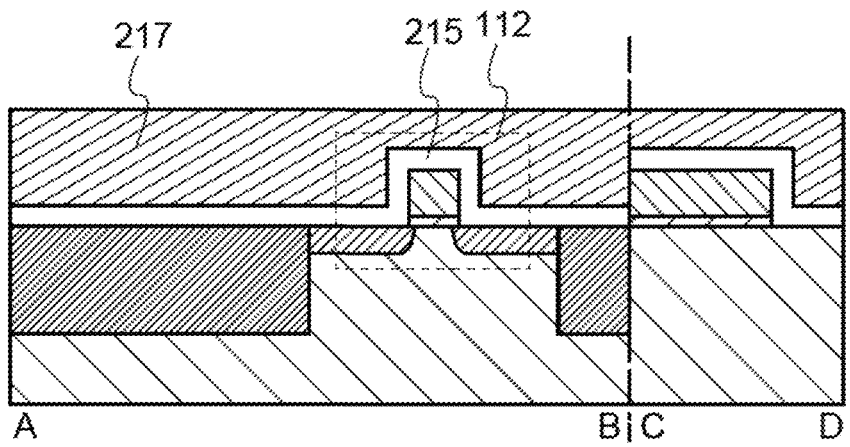

Next, as illustrated in FIG. 13D, an insulating film 215 and an insulating film 217 are formed over the semiconductor substrate 201, the element isolation regions 203, the gate insulating film 207, and the gate electrode 209 by sputtering, CVD, or the like.

The insulating films 215 and 217 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by CVD, the hydrogen content of the insulating film 215 is increased. By performing heat treatment using the insulating film 215, it is possible to hydrogenate the semiconductor substrate, to terminate a dangling bond by hydrogen, and to reduce defects in the semiconductor substrate.

Note that the flatness of the insulating film 217 can be increased when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions.

Through the above steps, the n-channel transistor 112 can be formed as illustrated in FIG. 13D. Here, the transistor 112 is formed using a semiconductor other than an oxide semiconductor, such as single crystal silicon, so that the transistor 112 can operate at high speed. Accordingly, a memory block of a processor that can achieve high-speed access can be formed.

Next, some of the insulating films 215 and 217 are selectively etched to form openings. Then, contact plugs 219a and 219b are formed in the openings. Typically, the contact plugs 219a and 219b are formed in such a manner that after a conductive film is formed by sputtering, CVD, or the like, planarization treatment is performed by chemical mechanical polishing (CMP), etching, or the like so that an unnecessary portion of the conductive film is removed.

The conductive film serving as the contact plugs 219a and 219b is formed in such a manner that tungsten silicide is formed using a WF$_6$ gas and a SiH$_4$ gas by CVD to fill the openings.

Next, an insulating film is formed over the insulating film 217 and the contact plugs 219a and 219b by sputtering, CVD, or the like, and then, part of the insulating film is selectively etched to form an insulating film 221 having a groove portion. Then, after a conductive film is formed by sputtering, CVD, or the like, planarization treatment is performed by CMP, etching, or the like, and an unnecessary portion of the conductive film is removed; thus, wirings 223a and 223b are formed (see FIG. 14A).

The insulating film 221 can be formed using a material that is similar to the material of the insulating film 215.

The wirings 223a and 223b are formed to have a single-layer structure or a layered structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in that order can be given. Note that a transparent conductive material containing indium oxide, tin oxide, or zinc oxide may be used.

Next, an insulating film 220 is formed over the insulating film 221, the wiring 223a, and the wiring 223b by sputtering, CVD, or the like. An insulating film is formed over the insulating film 220 by sputtering, CVD, or the like, and then part of the insulating film is selectively etched to form an insulating film 222 having a groove portion. Then, after a conductive film is formed by sputtering, CVD, or the like, planarization treatment is performed by CMP, etching, or the like, and an unnecessary portion of the conductive film is removed; thus, an electrode 224 is formed (see FIG. 14B).

Here, each of the insulating film 220 and the insulating film 222 can be formed using a material that is similar to the material of the insulating film 215. Note that a selectivity ratio of the insulating film 220 with respect to the insulating film 222 is preferably high.

Here, the electrode 224 functions as a back gate electrode of the transistor 110 to be described later. The electrode 224 can control the threshold voltage of the transistor 110. The electrode 224 may be electrically isolated (floating) or may be supplied with a potential from another element. The state of the electrode 224 can be set as appropriate based on control of the threshold voltage of the transistor 110. Note that the material of the electrode 224 can be similar to the material of a gate electrode 233 to be described later.

Note that in this embodiment, the electrode 224 is provided over the wiring 223a and the wiring 223b; however, the present invention is not limited thereto. For example, the electrode 224 may be formed in the same conductive layer as the wiring 223a and the wiring 223b.

Using the insulating film 222 and the electrode 224 which are flattened, variations in electrical characteristics of a transistor including an oxide semiconductor film to be formed later can be reduced. Further, the transistor including an oxide semiconductor film can be formed with a high yield.

Next, heat treatment or plasma treatment is preferably performed so that hydrogen contained in the insulating film 221, the wirings 223a and 223b, the insulating films 220 and 222, and the electrode 224 is released. Consequently, in heat treatment performed later, diffusion of hydrogen into an insulating film and an oxide semiconductor film to be formed later can be prevented. The heat treatment is performed at higher than or equal to 100° C. and lower than the strain point of the substrate in an inert atmosphere, a reduced-pressure atmosphere, or a dry air atmosphere. Further, in the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating film 222 and the electrode 224 by sputtering, CVD, or the like. The insulating film 225 can be formed to have a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. The oxide insulating film from which part of oxygen is released by heating is an oxide insulating film that contains oxygen at a proportion exceeding the stoichiometric proportion. Oxygen is released by heating from the oxide insulating film from which part of oxygen is released by heating; thus, oxygen can be diffused into the oxide semiconductor film by heating performed in a later step.

In the case where the insulating film 225 has a layered structure, the insulating film 225 is preferably an insulating film serving as a barrier film that prevents entry of an impurity that diffuses from a lower layer. In particular, in the case where a single crystal silicon substrate, an SOI substrate, a substrate over which a semiconductor element formed using silicon or the like is provided, or the like is used as the semiconductor substrate 201, hydrogen or the like contained in the substrate can be prevented from being diffused and entering the oxide semiconductor film to be formed later. As such an insulating film, for example, a silicon nitride film, a silicon nitride oxide film, or an aluminum oxide film formed by plasma-enhanced CVD, sputtering, or the like can be used.

The insulating film 225 is preferably flattened by CMP treatment or the like. A surface of the insulating film 225 has an average surface roughness (Ra) of 1 nm or less, preferably 0.3 nm or less, more preferably 0.1 nm or less.

Note that in this specification and the like, average surface roughness (Ra) is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface.

When the specific surface which is a surface represented by measurement data is expressed as Z=F(X,Y), the average surface roughness (Ra) is an average value of the absolute values of deviations from the reference surface to the specific surface and is shown by the following formula.

$$Ra = \frac{1}{S_0} \int_{y_1}^{y_2} \int_{x_1}^{x_2} |f(x, y) - Z_0| dx dy \quad (1)$$

The specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Here, $S_0$ represents the area of a rectangle which is obtained by projecting the specific surface on the xy plane, and $Z_0$ represents the height of the reference surface (the average height of the specific surface). The average surface roughness (Ra) can be measured using an atomic force microscope (AFM).

The CMP treatment may be performed once or more than once. When the CMP treatment is performed more than once, first polishing is preferably performed with a high polishing rate followed by final polishing with a low polishing rate. By performing polishings with different polishing rates in combination, the flatness of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of plasma dry etching and an inert gas is used in the plasma treatment. In other words, the plasma treatment is treatment in which the surface to be processed is irradiated with ions of an inert gas and minute unevenness of the surface is reduced by a sputtering effect. Thus, the plasma treatment can also be referred to as reverse sputtering treatment.

When the plasma treatment is performed, electrons and argon cations are present in plasma and the argon cations are accelerated in a cathode direction. The surface to be processed is sputtered by the accelerated argon cations. At this time, a projected portion of the surface to be processed is preferentially sputtered. Particles of sputtering from the surface to be processed attach to another place of the surface to be processed. At this time, the particles of sputtering from the surface to be processed preferentially attach to a depression of the surface to be processed. By thus reducing the projected portion and filling the depression, the flatness of the surface to be processed is increased. Note that a combination of plasma treatment and CMP treatment can further flatten the insulating film 225.

Note that through the plasma treatment, it is possible to remove impurities such as oxygen, moisture, and an organic compound that attach to the surface of the insulating film 225 by a sputtering effect.

It is preferable that impurities such as hydrogen, water, a hydroxyl group, and hydride in a treatment chamber be removed by heating and evacuation of the treatment chamber before formation of an oxide semiconductor. It is particularly important to remove such impurities adsorbed on an inner wall of the treatment chamber. Here, heat treatment may be performed at 100 to 450° C. Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has high capability in evacuating a large molecule, whereas it has low capability in evacuating hydrogen or water. Further, a combination with a cryopump having high capability in evacuating water or a sputter ion pump having high capability in evacuating hydrogen is effective. At this time, when the impurities are removed while an inert gas is introduced, the rate of elimination of water or the like, which is difficult to eliminate only by evacuation, can be further increased. Removal of impurities in the treatment chamber by such treatment before the deposition of the oxide semiconductor can prevent hydrogen, water, a hydroxyl group, hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture that attach to the target surface or a deposition shield may be removed.

Figure 14A:
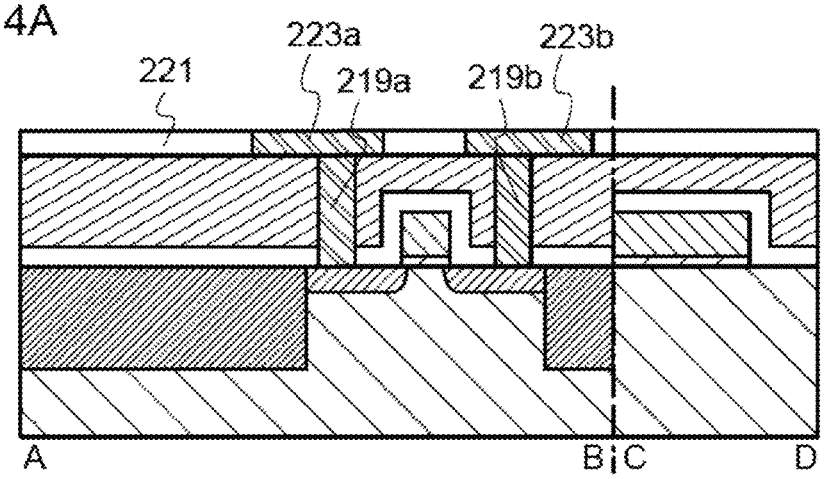
FIGS. 14A to 14C are cross-sectional views illustrating some of steps of manufacturing a processor according to one embodiment of the disclosed invention.
Figure 14B:
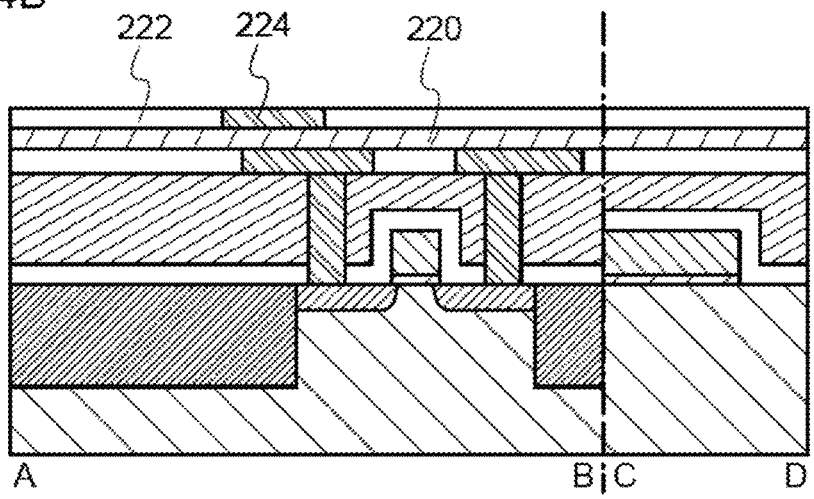
Figure 14C:
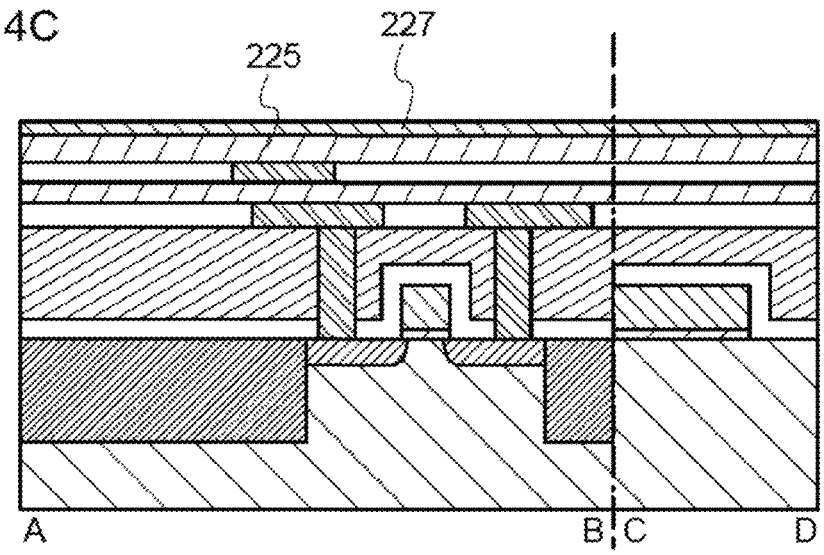

Next, an oxide semiconductor film 227 is formed over the insulating film 225 by sputtering, a coating method, a printing method, vapor deposition, PCVD, PLD, ALD, MBE, or the like (see FIG. 14C). Here, as the oxide semiconductor film 227, an oxide semiconductor film having a thickness of 1 to 50 nm, preferably 3 to 20 nm is formed by sputtering. When the oxide semiconductor film 227 has a thickness in the above range, a short-channel effect which might be caused due to downsizing of the transistor can be inhibited.

An oxide semiconductor used for the oxide semiconductor film 227 preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn oxide, a Sn—Zn oxide, a Zn—Mg oxide, a Sn—Mg oxide, an In—Mg oxide, an In—Ga oxide, an In—Ga—Zn oxide (also referred to as IGZO), an In—Sn—Zn oxide, a Sn—Ga—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, or an In—Sn—Hf—Zn oxide. Moreover, silicon oxide may be included in the above oxide semiconductor. Here, for example, an In—Ga—Zn oxide means an oxide containing indium (In), gallium (Ga), and zinc (Zn) as its main components and there is no particular limitation on the ratio of In:Ga:Zn. The In—Ga—Zn oxide may contain a metal element other than the In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be inhibited.

Alternatively, a material represented by $InMO_3(ZnO)_m$ (m>0, where m is not an integer) may be used as the oxide semiconductor. Note that M represents one or more metal elements selected from Ga, Fe, Mn, or Co. Alternatively, as the oxide semiconductor, a material represented by $In_2SnO_5(ZnO)_n$ (n>0, where n is an integer) may be used.

Note that the concentration of alkali metals or alkaline earth metals in the oxide semiconductor film 227 is preferably $1\times10^{18}$ atoms/cm$^3$ or lower, more preferably $2\times10^{16}$ atoms/cm$^3$ or lower. When an alkali metal or an alkaline earth metal is bonded to an oxide semiconductor, carriers are generated in some cases, which causes an increase in off-state current of the transistor.

The oxide semiconductor film 227 may contain nitrogen at $5\times10^{18}$ atoms/cm$^3$ or lower.

As an oxide semiconductor which can be used for the oxide semiconductor film 227, a wide band gap semiconductor which has a wider bandgap and lower intrinsic carrier density than a silicon semiconductor is used. The band gap of the oxide semiconductor is 2.5 to 4 eV, preferably 3 to 3.8 eV. The off-state current of a transistor can be reduced by using an oxide semiconductor having a wide energy gap.

The oxide semiconductor film 227 may have a single crystal structure or a non-single-crystal structure. In the latter case, the oxide semiconductor film 227 may have an amorphous structure or a polycrystalline structure. Further, the oxide semiconductor film 227 may have an amorphous structure including a crystalline portion or a non-amorphous structure.

In an oxide semiconductor in an amorphous state, a flat surface can be obtained with relative ease, so that when a transistor is formed with the use of the oxide semiconductor, interface scattering can be reduced, and comparatively high mobility can be obtained with relative ease.

In a crystalline oxide semiconductor, defects in a bulk can be further reduced and when surface flatness is improved, mobility higher than that of an oxide semiconductor layer in an amorphous state can be obtained. In order to improve the surface flatness, the oxide semiconductor is preferably formed over a flat surface. As described above, the average surface roughness (Ra) of the surface of the insulating film 225 is 1 nm or less, preferably 0.3 nm or less, more preferably 0.1 nm or less, and the oxide semiconductor film 227 is preferably formed over the insulating film 225.

Here, the oxide semiconductor film 227 is formed by sputtering. As a target, a target corresponding to the oxide can be used.

In the case where an In—Ga—Zn—O-based material is used as the oxide semiconductor, the target can be formed as appropriate in accordance with the material and composition of the oxide semiconductor film 227. For example, an In—Ga—Zn oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above compositions is preferably used as the target. However, the material and composition of the target are not limited to the above.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, defect density, the atomic ratio between a metal element and oxygen, the interatomic distance, density, and the like be set to appropriate values. Alternatively, oxide semiconductor films which have different constitutions (typified by composition) may be stacked or may be separately provided as a channel formation region and source and drain regions as appropriate.

As a sputtering gas, a rare gas (typically argon) atmosphere, an oxygen atmosphere, or a mixed gas of a rare gas and oxygen is used as appropriate. In the case of the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In sputtering, an RF power source, an AC power source, a DC power source, or the like can be used as a power source for generating plasma as appropriate.

Note that the leakage rate of a treatment chamber in which the oxide semiconductor film is formed is preferably $1 \times 10^{-10}$ Pa·m³/sec. or lower so that entry of an impurity into a film to be formed by sputtering can be reduced. As described above, in the process for forming the oxide semiconductor film and preferably in the process for forming the oxide insulating film, entry of impurities is inhibited as much as possible through control of the pressure of the treatment chamber, the leakage rate of the treatment chamber, and the like. Thus, entry of impurities including hydrogen into the oxide semiconductor film can be reduced. In addition, diffusion of impurities such as hydrogen from the oxide insulating film into the oxide semiconductor film can be reduced.

As the oxide semiconductor film 227, a c-axis aligned crystalline oxide semiconductor (CAAC-OS) film including crystallized parts may be used.

The oxide semiconductor film 227 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a c-axis aligned crystalline oxide semiconductor (CAAC-OS).

For example, the oxide semiconductor film 227 may include a CAAC-OS. In the CAAC-OS, for example, c-axes are aligned, and a-axes and/or b-axes are not macroscopically aligned.

For example, the oxide semiconductor film 227 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 227 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film 227 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a layered structure including a region of an amorphous oxide semiconductor, a region of a microcrystalline oxide semiconductor, and a region of a CAAC-OS, for example.

Note that the oxide semiconductor film 227 may be in a single-crystal state, for example.

The oxide semiconductor film 227 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

The crystal part included in CAAC-OS film fits into a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clear. Thus, in the CAAC-OS film, a reduction in electron mobility, due to the grain boundary, is inhibited.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80 to 100°, preferably from 85 to 95°. In addition, the term "parallel" includes a range from −10 to 10°, preferably from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes might be different from each other depending on the shape of the CAAC-OS film (the cross-sectional shape of the surface where the CAAC-OS film is formed or the cross-sectional shape of the surface of the CAAC-OS film). Note that the c-axes of the crystal parts are aligned in the direction parallel to a normal vector of the surface where the CAAC-OS film is formed or a normal vector of the surface of the CAAC-OS film. The crystal part is formed by deposition or by crystallization treatment such as heat treatment after deposition.

With the use of the CAAC-OS film in a transistor, changes in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having crystal part such as a CAAC-OS, defects in the bulk can be further reduced and when the surface flatness of the oxide semiconductor is increased, mobility higher than that of an oxide semiconductor in an amorphous state can be obtained. In order to increase the surface flatness, the oxide semiconductor is preferably formed over a flat surface. Specifically, the oxide semiconductor may be formed over a surface with an average surface roughness (Ra) of 1 nm or less, preferably 0.3 nm or less, more preferably 0.1 nm or less.

The substrate is heated to higher than 200° C. and lower than or equal to 700° C., preferably higher than 300° C. and lower than or equal to 500° C., more preferably higher than or equal to 400° C. and lower than or equal to 450° C. during the formation of the oxide semiconductor film 227 so that the oxide semiconductor film 227 includes the CAAC-OS. The oxide semiconductor film 227 is formed while the substrate is heated in this manner, so that the oxide semiconductor film 227 can include the CAAC-OS.

Alternatively, a first thin oxide semiconductor film having a thickness of greater than or equal to the thickness of one atomic layer and less than or equal to 10 nm, preferably greater than or equal to 2 nm and less than or equal to 5 nm is formed while heating is performed at temperature in the above range, and then a second thick oxide semiconductor film is formed while heating is performed in a similar manner; thus, the first oxide semiconductor film and the second oxide semiconductor film may be stacked to form the oxide semiconductor film 227 including the CAAC-OS.

In the case where the oxide semiconductor film 227 has an amorphous structure, the substrate is not heated or the substrate is heated so that the substrate temperature is lower than 200° C., preferably lower than 180° C. during the formation of the oxide semiconductor film 227. The oxide semiconductor film 227 is formed in this manner, so that the oxide semiconductor film 227 can have an amorphous structure.

Alternatively, the oxide semiconductor film 227 including the CAAC-OS may be formed in the following manner: after an oxide semiconductor film having an amorphous structure is formed in the above manner, heat treatment at 250 to 700° C., preferably 400° C. or higher, more preferably 500° C. or higher, still more preferably 550° C. or higher is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower). Heat treatment for dehydration or dehydrogenation to be described later can serve as this heat treatment.

In the above method, as the substrate heating temperature at the time of formation is higher, the impurity concentration of the obtained oxide semiconductor film 227 is lower. Further, the atomic arrangement in the oxide semiconductor film 227 is ordered and the density thereof is increased, so that a polycrystal or a CAAC-OS is likely to be formed. Furthermore, by the formation in an oxygen gas atmosphere, a polycrystal or a CAAC-OS is easily formed because an unnecessary atom of a rare gas or the like is not included. Note that a mixed gas atmosphere including an oxygen gas and a rare gas may be used. In that case, the percentage of an oxygen gas is 30 vol. % or higher, preferably 50 vol. % or higher, more preferably 80 vol. % or higher.

After the oxide semiconductor film 227 is formed, the oxide semiconductor film 227 may be subjected to heat treatment (first heat treatment). The heat treatment can further remove a substance including a hydrogen atom in the oxide semiconductor film 227; thus, the structure of the oxide semiconductor film 227 can be improved and defect levels in the energy gap can be reduced. The heat treatment is performed in an inert gas atmosphere at higher than or equal to 300° C. and lower than or equal to 700° C., preferably higher than or equal to 450° C. and lower than or equal to 600° C., or lower than the strain point of the substrate in the case where the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a manner that, for example, the semiconductor substrate 201 is introduced into an electric furnace using a resistance heating element or the like and heated at 450° C. for an hour in a nitrogen atmosphere.

The heat treatment apparatus is not limited to the electric furnace and may be an apparatus for heating an object by thermal conduction or thermal radiation from a medium such as a heated gas. For example, a rapid thermal annealing (RTA) apparatus such as a lamp rapid thermal annealing (LRTA)

apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen, or a rare gas such as argon is used. Note that in the case where a GRTA apparatus is used as the heat treatment apparatus, the substrate may be heated in an inert gas heated to a high temperature of 650 to 700° C. because the heat treatment time is short.

In addition, it is preferable that after the oxide semiconductor film 227 is heated by the heat treatment, a high-purity oxygen gas, a high-purity $N_2O$ gas, or ultra dry air (the moisture concentration is 20 ppm (−55° C. by conversion into a dew point) or lower, preferably 1 ppm or lower, more preferably 10 ppb or lower, in the case where measurement is performed by a dew point meter of a cavity-ring down laser spectroscopy (CRDS) method) be introduced into the same furnace. It is particularly preferable that water, hydrogen, and the like be not contained in these gases. The purity of the oxygen gas or the $N_2O$ gas that is introduced into the same furnace is preferably 6N or higher, more preferably 7N or higher (i.e., the impurity concentration in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been reduced through the step of removing impurities by dehydration or dehydrogenation can be supplied.

The first heat treatment has an effect of removing hydrogen, water, and the like and can be referred to as dehydration, dehydrogenation, or the like. The heat treatment can be performed at timing, for example, before the oxide semiconductor layer is processed to have an island shape or after the gate insulating film is formed. The number of times of such heat treatments for dehydration or dehydrogenation is not limited to one and may be two or more.

Next, part of the oxide semiconductor film 227 is selectively etched, so that an oxide semiconductor film 229 is formed to overap with the electrode 224. Then, an insulating film 231 is formed over the oxide semiconductor film 229 by sputtering, CVD, or the like. After that, a gate electrode 233 is formed over the insulating film 231 (see FIG. 15A).

A high-density plasma-enhanced CVD using microwaves (e.g., with a frequency of 2.45 GHz) is preferably employed for forming the insulating film 231 serving as a gate insulating film because an insulating layer can be dense and can have high breakdown voltage and high quality. This is because when a highly purified oxide semiconductor is closely in contact with a high-quality gate insulating film, the interface state can be reduced and interface properties can be favorable.

The insulating film 231 may be formed to have a single layer or a stack including one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may be an oxide insulating film from which oxygen is released by heating, such as a film that can be used as the insulating film 225. By using a film from which oxygen is released by heating as the insulating film 231, oxygen vacancies caused in the oxide semiconductor film 229 can be reduced by heat treatment performed later and deterioration of electrical characteristics of the transistor can be inhibited.

When the insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased even when the thickness of the gate insulating film is small.

The thickness of the insulating film 231 is preferably 10 to 300 nm, more preferably 5 to 50 nm, still more preferably 10 to 30 nm.

The gate electrode 233 can be formed using a metal element selected from aluminum, chromium, copper, tantalum, titanium, molybdenum, or tungsten; an alloy containing any of these metal elements as its component; an alloy containing these metal elements in combination; or the like. Further, one or more metal elements selected from manganese or zirconium may be used. The gate electrode 233 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure including the light-transmitting conductive material and the metal element.

The gate electrode 233 is formed by a printing method or an inkjet method. Alternatively, the gate electrode 233 is formed in such a manner that a conductive film is formed by sputtering, CVD, vapor deposition, or the like and then part of the conductive film is selectively etched.

Further, as a material layer that is in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or ZnN) is preferably provided between the gate electrode 233 and the insulating film 231. These films each have a work function of 5 eV or higher, preferably 5.5 eV or higher; thus, the threshold voltage of the transistor can be positive. Accordingly, a so-called normally-off switching element can be obtained. For example, in the case where an In—Ga—Zn—O film containing nitrogen is used, an In—Ga—Zn—O film having nitrogen concentration at least higher than that of the oxide semiconductor film 229, specifically, an In—Ga—Zn—O film having nitrogen concentration of 7 at. % or higher is used.

After that, heat treatment is preferably performed. Through this heat treatment, oxygen can be diffused from the insulating film 225 and the insulating film 231 into the oxide semiconductor film 229 to repair oxygen defects in the oxide semiconductor film 229; thus, the oxygen defects can be reduced.

Note that after the insulating film 231 is formed, heat treatment (second heat treatment) may be performed in an inert gas atmosphere or an oxygen atmosphere. The heat treatment temperature is preferably 200 to 450° C., more preferably 250 to 350° C. With such heat treatment, variations in electrical characteristics of the transistor can be reduced. In the case where oxygen is contained in the insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; thus, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto, and the heat treatment may be performed after formation of the insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurity elements that are not main components of the oxide semiconductor film 229 as little as possible.

Figure 15A:
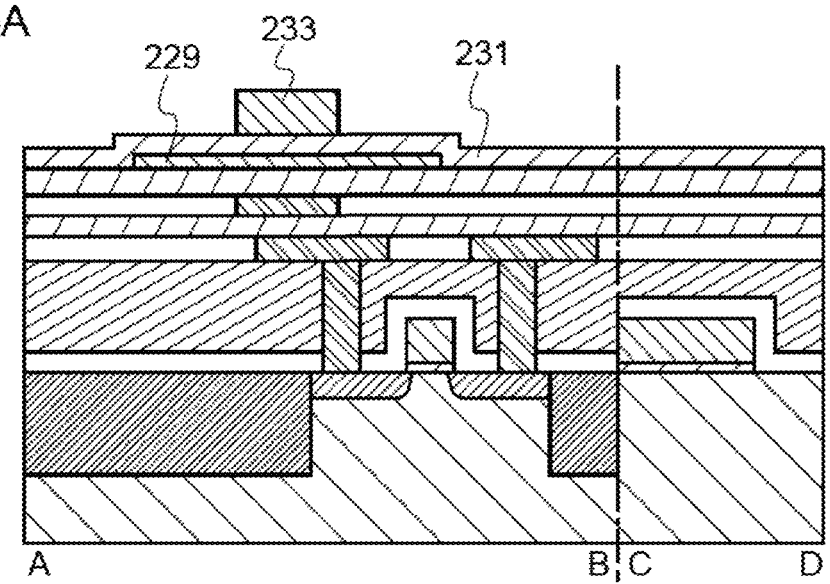
FIGS. 15A to 15C are cross-sectional views illustrating some of steps of manufacturing a processor according to one embodiment of the disclosed invention.
Figure 15B:
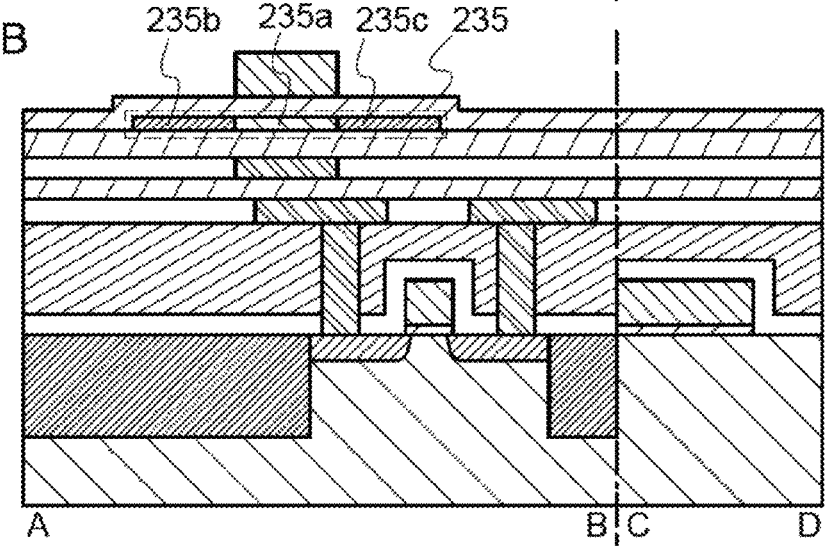

Next, a dopant is added to the oxide semiconductor film 229 with the use of the gate electrode 233 as a mask. As a result, a first region 235a which is covered with the gate electrode 233 and does not contain the dopant and a pair of second regions 235b and 235c which contain the dopant are formed as illustrated in FIG. 15B. Since the dopant is added with the use of the gate electrode 233 as a mask, the first region 235a to which the dopant is not added and the pair of second regions 235b and 235c containing the dopant can be formed in a self-aligning manner. Note that the first region 235a overlapping with the gate electrode 233 functions as a channel region. The pair of second regions 235b and 235c containing the dopant functions as electric-field relaxation regions. The first region 235a and the pair of second regions 235b and 235c containing the dopant constitute an oxide semiconductor film 235.

Further, the concentration of hydrogen in the first region 235a of the oxide semiconductor film 229 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. By the bond of an oxide semiconductor and hydrogen, part of hydrogen serves as a donor to generate electrons as carriers. For that reason, by a reduction in concentration of hydrogen in the first region 235a of the oxide semiconductor film 229, a negative shift in the threshold voltage can be reduced.

The concentration of the dopant in the pair of second regions 235b and 235c is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{19}$ atoms/cm$^3$.

Since the pair of second regions 235b and 235c contains the dopant, the carrier density or the number of defects can be increased. Thus, the conductivity can be higher than that of the first region 235a which does not contain a dopant. Note that an excessive increase in concentration of the dopant causes inhibition of carrier movement by the dopant, which leads to a reduction in conductivity of the pair of second regions 235b and 235c containing the dopant.

The pair of second regions 235b and 235c containing the dopant preferably has a conductivity of 0.1 to 1000 S/cm, preferably 10 to 1000 S/cm.

Since the oxide semiconductor film 229 has the pair of second regions 235b and 235c containing the dopant, an electric field applied to an end portion of the first region 235a serving as the channel region can be relaxed. Thus, a short-channel effect of the transistor can be inhibited.

As a method for adding the dopant to the oxide semiconductor film 229, ion doping or ion implantation can be used. As the dopant, at least one of boron, nitrogen, phosphorus, and arsenic can be added. Alternatively, as the dopant, at least one of helium, neon, argon, krypton, and xenon can be added. Alternatively, as the dopant, hydrogen can be added. As the dopant, at least one of boron, nitrogen, phosphorus, and arsenic and at least one of helium, neon, argon, krypton, and xenon in appropriate combination with hydrogen can be added.

Although the dopant is added to the oxide semiconductor film 229 in a state where the oxide semiconductor film 229 is covered with the insulating film and the like, the dopant may be added in a state where the oxide semiconductor film 229 is exposed.

Alternatively, the dopant can be added by a method other than ion doping, ion implantation, or the like. For example, the dopant can be added in the following manner: plasma is generated in an atmosphere of a gas containing an element to be added and plasma treatment is performed on an object to which the dopant is added. A dry etching apparatus, a CVD apparatus, a high-density plasma CVD apparatus, or the like can be used to generate the plasma.

After that, heat treatment may be performed. The heat treatment is performed typically at 150 to 450° C., preferably 250 to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be crystalline or amorphous.

Figure 15C:
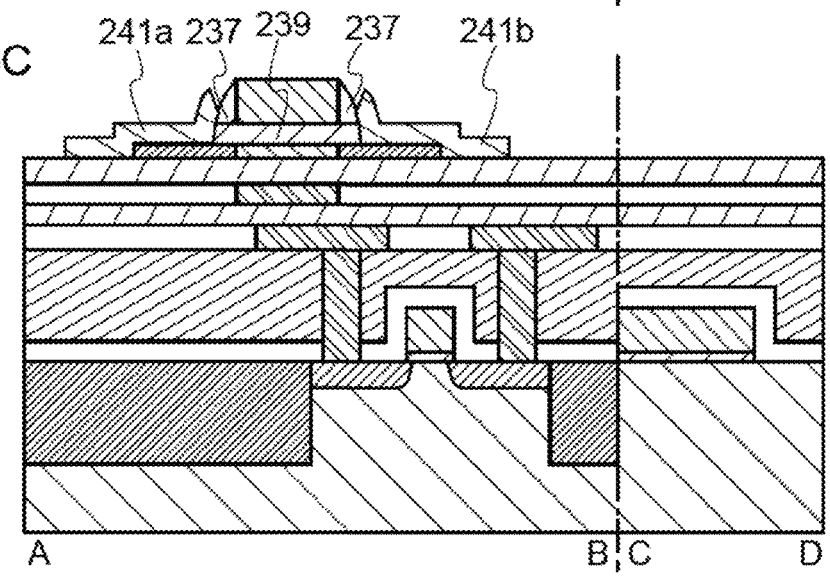

Next, as illustrated in FIG. 15C, sidewall insulating films 237 are formed on side surfaces of the gate electrode 233, and a gate insulating film 239 and electrodes 241a and 241b are formed.

The sidewall insulating film 237 may be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. The sidewall insulating film 237 may be formed using an oxide insulating film from which part of oxygen is released by heating in a manner similar to that of the insulating film 225.

Here, a method for forming the sidewall insulating film 237 is described.

First, an insulating film to be the sidewall insulating films 237 is formed over the insulating film 231 and the gate electrode 233. The insulating film is formed by sputtering, CVD, or the like. Although the thickness of the insulating film is not particularly limited, the thickness is selected as appropriate in consideration of coverage with respect to the shape of the gate electrode 233.

The insulating film is etched to form the sidewall insulating film 237. The etching is highly anisotropic etching, and the sidewall insulating film 237 can be formed in a self-aligning manner by performing the highly anisotropic etching on the insulating film.

The width of the region for relieving an electric field in each of the pair of second regions 235b and 235c containing the dopant depends on the width of the sidewall insulating films 237, and the width of the sidewall insulating films 237 depends on the thickness of the gate electrode 233. Thus, the thickness of the gate electrode 233 may be determined so that the width of the region for relieving an electric field has a desired value.

When the sidewall insulating films 237 are formed, the insulating film 231 is also etched by the highly anisotropic etching and the oxide semiconductor film 229 is exposed, so that the gate insulating film 239 is formed.

The pair of electrodes 241a and 241b can be formed using a material similar to that of the wirings 223a and 223b as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by sputtering, CVD, vapor deposition, or the like and then part of the conductive film is selectively etched.

The pair of electrodes 241a and 241b is preferably formed to be in contact with side surfaces of the sidewall insulating films 237 and the gate insulating film 239. That is, it is preferable that end portions of the pair of electrodes 241a and 241b of the transistor be on the sidewall insulating films 237 and cover entire exposed part of the pair of second regions 235b and 235c containing the dopant in the oxide semiconductor film 229. As a result, regions in the pair of second regions 235b and 235c containing the dopant that are in contact with the pair of electrodes 241a and 241b serve as a source region and a drain region, and regions in the pair of second regions 235b and 235c containing the dopant that overlap with the gate insulating film 239 and the sidewall insulating film 237 serve as electric-field relaxation regions. In addition, since the width of the electric-field relaxation regions can be controlled with the length of the sidewall insulating films 237, high accuracy in alignment of a mask for forming the pair of electrodes 241a and 241b is not strictly required. Accordingly, variations among a plurality of transistors can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235b and 235c is formed in this embodiment, the present invention is not limited to this structure, and the pair of second regions 235b and 235c may be formed after the sidewall insulating films 237 are formed. With such a structure, the first region 235a can be extended to overlap with the sidewall insulating films 237.

Figure 16A:
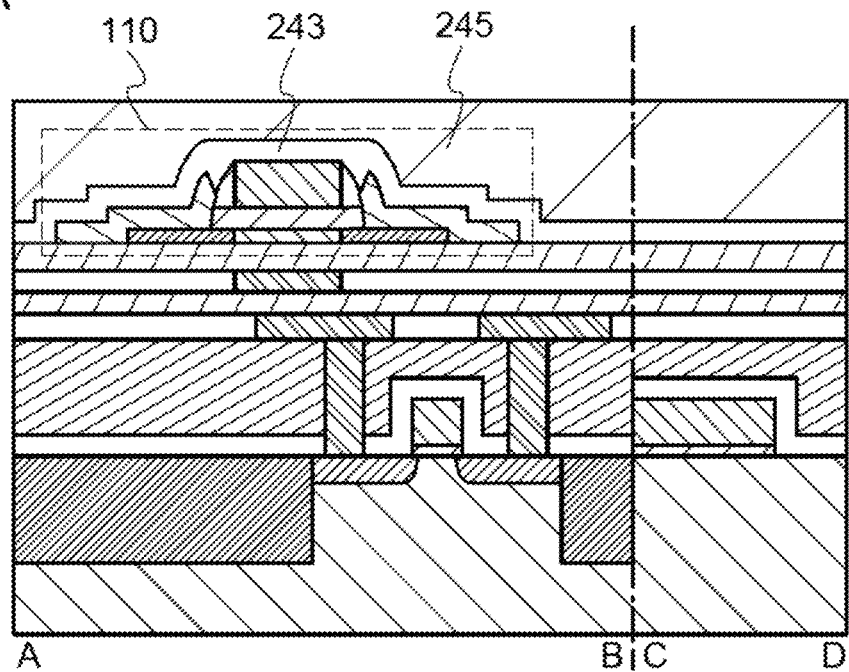
FIGS. 16A and 16B are cross-sectional views illustrating some of steps of manufacturing a processor according to one embodiment of the disclosed invention.

Next, as illustrated in FIG. 16A, an insulating film 243 and an insulating film 245 are formed by sputtering, CVD, a coating method, a printing method, or the like.

The insulating films 243 and 245 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film which prevents diffusion of oxygen into the outside as the insulating film 245, oxygen released from the insulating film 243 can be supplied to the oxide semiconductor film. Typical examples of the insulating film which prevents diffusion of oxygen into the outside include films of aluminum oxide, aluminum oxynitride, and the like. In addition, with the use of an insulating film which prevents diffusion of hydrogen from the outside as the insulating film 245, diffusion of hydrogen from the outside into the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen into the outside, and an oxide insulating film, oxygen can be efficiently diffused into the oxide semiconductor film and oxygen can be prevented from being released into the outside. Accordingly, variations in transistor characteristics can be reduced even at high temperature and in high humidity.

Through the above steps, as illustrated in FIG. 16A, the transistor 110 including an oxide semiconductor film can be formed.

As described above, the oxide semiconductor film 229 is preferably highly purified by sufficient removal of impurities such as hydrogen and sufficient supply of oxygen so as to be supersaturated with oxygen. Specifically, the hydrogen concentration in the oxide semiconductor film 229 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the concentration of hydrogen in the oxide semiconductor film 229 is measured by secondary ion mass spectrometry (SIMS). When the oxide semiconductor film 229 in which the hydrogen concentration is sufficiently reduced for high purification and defect levels in an energy gap due to oxygen vacancies are reduced by sufficient supply of oxygen is used for the transistor 110, off-state current (per unit channel width (1 μm) here) at room temperature (25° C.) is 100 zA (1 zA (zeptoampere) is $1 \times 10^{-21}$ A) or lower, preferably 10 zA or lower, for example. In this manner, with the use of an intrinsic (i-type) or substantially i-type oxide semiconductor film 229, the transistor 110 having very good off-state current characteristics can be obtained.

Although the transistor 110 in this embodiment has a top-gate structure, the present invention is not limited thereto, and the transistor 110 may have a bottom-gate structure. Further, in the transistor 110 in this embodiment, the pair of electrodes 241a and 241b is in contact with at least some of upper surfaces of the pair of second regions 235b and 235c; however, the present invention is not limited to this structure, and the pair of second regions 235b and 235c may be in contact with at least some of the pair of electrodes 241a and 241b, for example.

Next, part of each of the insulating films 215, 217, 221, 225, 243, and 245 is selectively etched, so that openings are formed to expose part of each of the gate electrode 209, the electrode 241a, and the electrode 241b. After a conductive film is formed in the openings, part of the conductive film is selectively etched; thus, a wiring 249 which is in contact with the electrode 241b and a wiring 250 which is in contact with the electrode 241a are formed. The wiring 249 and the wiring 250 can be formed using a material used for the contact plugs 219a and 219b as appropriate.

Here, the wiring 249 functions as the node M1 which electrically connects the drain electrode of the transistor 110 to the gate electrode 209 of the transistor 112. The wiring 250 functions as the source electrode of the transistor 110 and is electrically connected to the volatile memory block 104 in FIG. 2B. Note that in the case where the capacitor 111 in FIG.

2B is provided, for example, an insulating film over the wiring 250 and a conductive film overlapping with the wiring 250 with the insulating film therebetween may be provided.

Figure 16B:
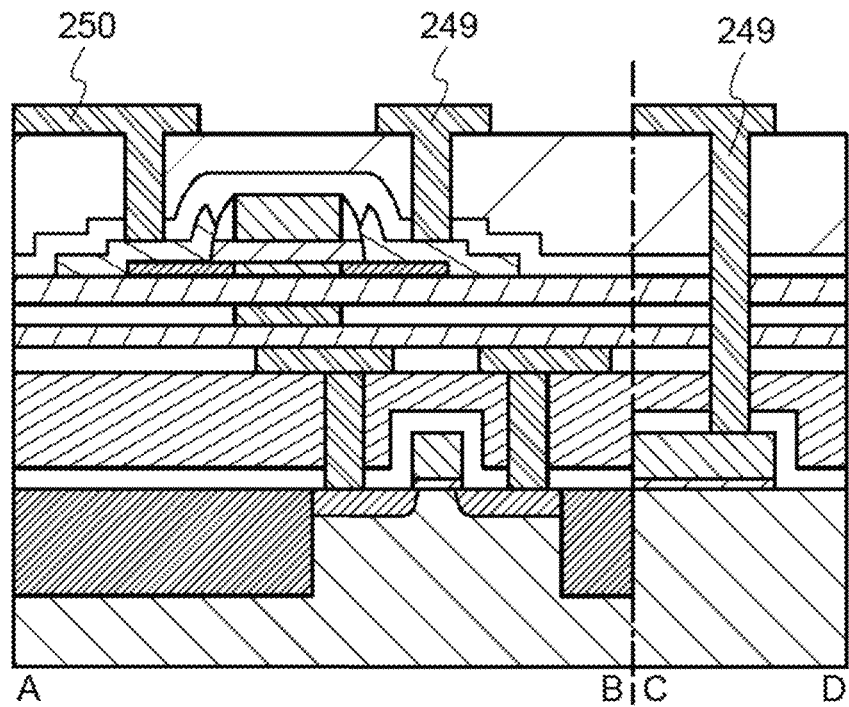

In FIG. 16B, the drain electrode of the transistor 110 and the gate electrode 209 of the transistor 112 are connected to each other through the wiring 249; however, this embodiment is not limited to this structure. For example, an upper surface of the gate electrode of the transistor 112 may be exposed from an upper surface of the insulating film provided over the transistor 112, and one of the source electrode and the drain electrode of the transistor 110 may be formed to be in direct contact with the upper surface of the gate electrode.

Through the above steps, the memory block of the processor including the transistors 110 and 112 can be manufactured.

Figure 17A:
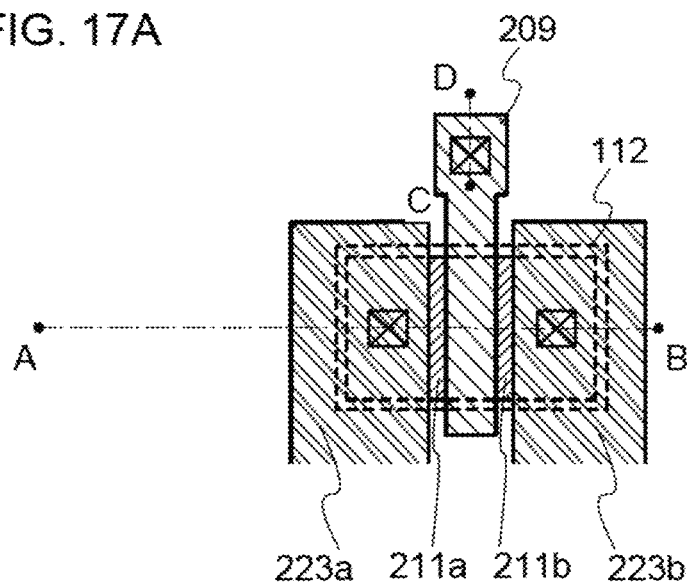
FIGS. 17A and 17B are plan views illustrating part of a processor according to one embodiment of the disclosed invention.
Figure 17B:
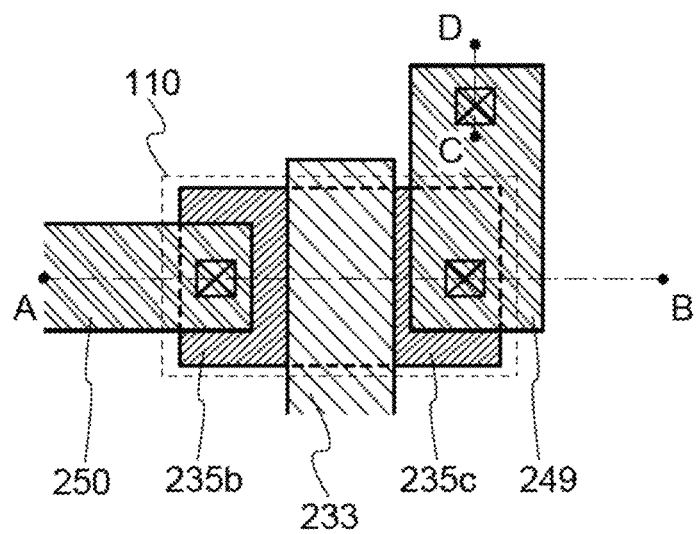

Here, FIGS. 17A and 17B illustrate an example of a plan view of the memory block of the processor that corresponds to the cross-sectional view in FIG. 16B. FIG. 17A is a plan view of a component below the insulating film 225, i.e., the transistor 112. FIG. 17B is a plan view of a component over the insulating film 225, i.e., the transistor 110. Note that some of the components (e.g., the insulating film 215) are not illustrated in FIGS. 17A and 17B for easy understanding. Further, each of the cross-sectional views in FIGS. 13A to 13D, FIGS. 14A to 14C, FIGS. 15A to 15C, and FIGS. 16A and 16B is taken along dashed-dotted line A-B and dashed-dotted line C-D in FIGS. 17A and 17B.

In the memory block of the processor in FIGS. 17A and 17B, as illustrated in FIG. 16B, the transistor 110 is electrically connected to the transistor 112 in a region shown in the cross section taken along dashed-dotted line C-D. Here, at least part of the transistor 110 overlaps with at least part of the transistor 112. It is preferable that at least part of the oxide semiconductor film 235 overlap with at least part of the n-type impurity region 211a or 211b. With such a planar layout, an increase in area occupied by the memory block of the processor due to provision of the transistor including a wide band gap semiconductor such as an oxide semiconductor can be inhibited.

As described above, the transistor of the nonvolatile memory block is formed using a material capable of sufficiently reducing low off-state current of a transistor (e.g., an oxide semiconductor material that is a wide band gap semiconductor). Using a wide band gap semiconductor material capable of sufficiently reducing low off-state current of a transistor makes it possible to hold a potential for a long time without supply of power; thus, data can be retained in the nonvolatile memory block even when the logic unit is powered off.

By using the power gating driving method described in the above embodiment in the processor including the nonvolatile memory block, a sharp increase in power consumption in a data backup period and a recovery period and generation of instantaneous voltage drops can be prevented, and the data backup period and the recovery period can be shortened. Thus, in the power gating driving method that reduces power consumption, malfunction of the processor can be inhibited, and the processing speed of the processor can be increased.

The structures, methods, and the like in this embodiment can be combined with each other, or can be combined with any of the structures, methods, and the like in the other embodiments as appropriate.

Embodiment 3

A central processing unit (CPU) can be formed using at least part of the processor described in the above embodiment.

Figure 18A:
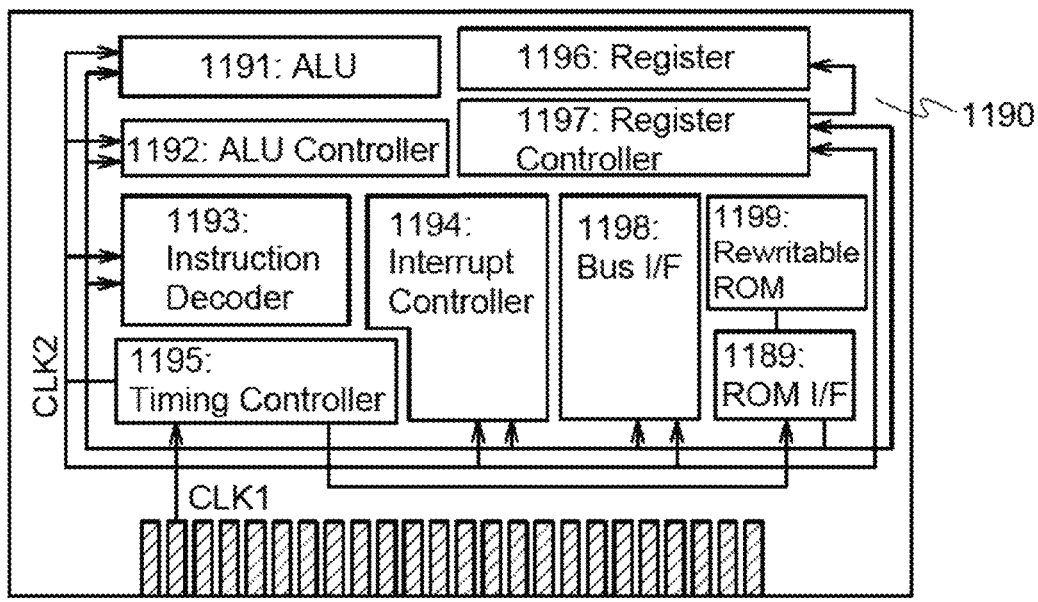
FIGS. 18A to 18C are block diagrams of a CPU according to one embodiment of the disclosed invention.

FIG. 18A is a block diagram illustrating a specific structure of a CPU. The CPU in FIG. 18A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189, over a substrate 1190. A semiconductor substrate, an SOI substrate, a glass substrate, or the like is used as the substrate 1190. The ROM 1199 and the ROM interface 1189 may be provided over a separate chip. Needless to say, FIG. 18A illustrates only a simplified structure example of the CPU, and an actual CPU may have various structures depending on the application.

An instruction input to the CPU through the bus interface 1198 is input to the instruction decoder 1193 and decoded, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU in FIG. 18A, a plurality of memory cells are provided in the register 1196. The plurality of memory cells in the register 1196 form the volatile memory block and the nonvolatile memory block described in the above embodiment.

In the CPU in FIG. 18A, the register controller 1197 corresponds to the backup/recovery controller 106 described in the above embodiment and selects data backup and data recovery in the register 1196. In the case where supply of power to at least the register 1196 is stopped, data is backed up from a volatile memory block to a nonvolatile memory block in the register 1196. In the case where supply of power to at least the register 1196 is started, data is recovered from the nonvolatile memory block to the volatile memory block in the register 1196.

Figure 18B:
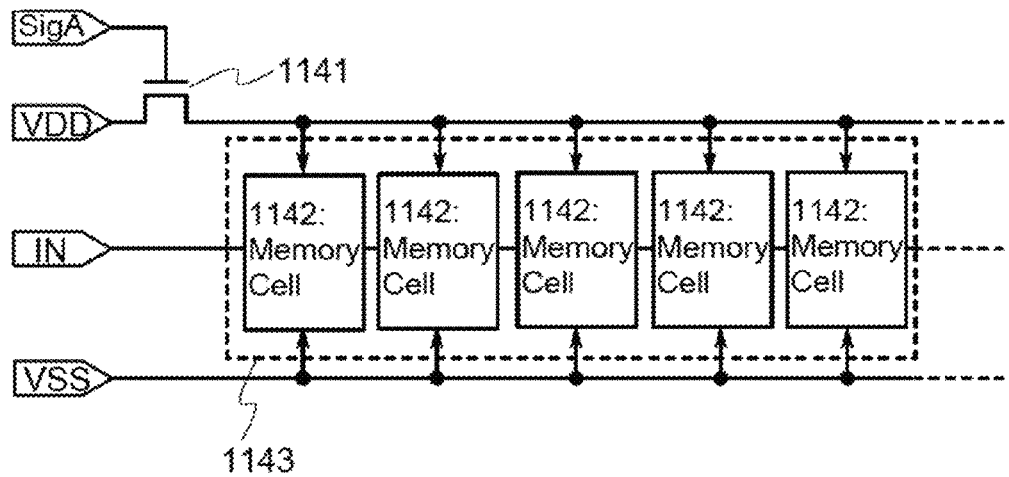
Figure 18C:
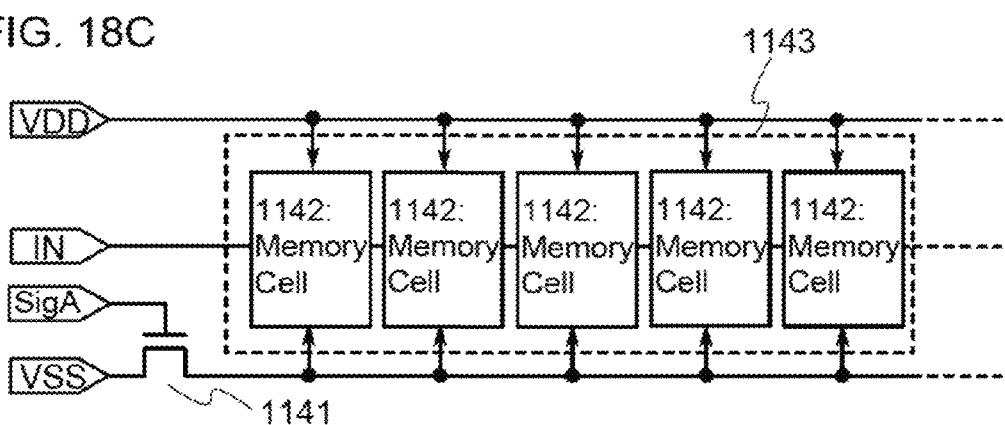

The supply of power can be stopped by providing a switching element between a memory cell group and a node to which a power supply potential VDD or a power supply potential VSS is supplied, as illustrated in FIG. 18B or FIG. 18C. The switching element is included in the power controller 108 described in the above embodiment. Circuits in FIGS. 18B and 18C are described below.

FIGS. 18B and 18C each illustrate a structure example of a storage circuit where the transistor which includes a wide band gap semiconductor material such as an oxide semiconductor material and which is disclosed in the above embodiment is used as a switching element for controlling supply of a power supply potential to a memory cell.

The storage device in FIG. 18B includes a switching element 1141 and a memory cell group 1143 including a plurality of memory cells 1142. Specifically, as each of the memory cells 1142, the memory cell described in the above embodiment can be used. Each of the memory cells 1142 included in the memory cell group 1143 is supplied with the high-level power supply potential VDD through the switching element 1141. Further, each of the memory cells 1142 included in the memory cell group 1143 is supplied with the potential of a signal IN and the low-level power supply potential VSS.

In FIG. 18B, the transistor which includes a wide band gap semiconductor material such as an oxide semiconductor material and which is disclosed in the above embodiment is used as the switching element 1141, and switching of the transistor is controlled by a signal Sig A supplied to a gate electrode of the transistor.

Note that FIG. 18B illustrates the structure in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 18B, the switching element 1141 may control the supply of the low-level power supply potential VSS.

FIG. 18C illustrates a structure example in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be retained even in the case where the operation of a CPU is temporarily stopped and the supply of the power supply potential VDD or the power supply potential VSS is stopped; accordingly, power consumption can be reduced. Specifically, for example, while a user of a personal computer does not input information to an input device such as a keyboard, the operation of the CPU can be stopped, so that the power consumption can be reduced.

The CPU in this embodiment includes a semiconductor device in which a second semiconductor element layer including a wide band gap semiconductor material such as an oxide semiconductor material is provided over a first semiconductor element layer including a material other than a wide band gap semiconductor material, such as single crystal silicon. Accordingly, a transistor including single crystal silicon or the like which can easily operate at high speed and a transistor including an oxide semiconductor which has extremely low off-state current can be used as appropriate according to the functions of transistors included in the CPU. Thus, a CPU in which power consumption is reduced while high-speed operation is maintained can be provided.

Further, since the second semiconductor element layer including an oxide semiconductor is stacked over the first semiconductor element layer including a semiconductor material a material other than an oxide semiconductor, such as single crystal silicon, an increase in area occupied by the transistor including an oxide semiconductor can be prevented. Thus, the CPU can be highly integrated.

Further, a capacitor can be formed without unnecessary steps in the process of forming a wiring layer and the transistor including an oxide semiconductor in the second semiconductor element layer, so that a semiconductor element and the capacitor included in the CPU can be formed efficiently.

Although the CPU is given as an example, the transistor can also be applied to an LSI such as a digital signal processor (DSP), a custom LSI, or a field programmable gate array (FPGA).

A magnetic tunnel junction element (an MTJ element) is known as a nonvolatile random access memory. The MTJ element stores data in a low-resistance state when the magnetization directions of ferromagnetic films provided above and below an insulating film are parallel, or stores data in a high-resistance state when the magnetization directions are anti-parallel. Thus, its principle is quite different from that of the memory including a wide band gap semiconductor material such as an oxide semiconductor material described in this embodiment. Table 1 shows comparison between the MTJ element and the semiconductor device according to this embodiment.

TABLE 1

| | Spintronics (MTJ element) | OS/Si |
|---|---|---|
| 1) Heat Resistance | Curie temperature | Process temperature at 500° C. (reliability at 150° C.) |
| 2) Driving Method | Current driving | Voltage driving |
| 3) Writing Principle | Changing spin direction of magnetic body | Turning on/off FET |
| 4) Si LSI | Suitable for bipolar LSI (MOS LSI is preferable for high integration because bipolar LSI is unsuitable for high integration. Note that W becomes larger.) | Suitable for MOS LSI |
| 5) Overhead | Large (because of high Joule heat) | Smaller than overhead of the MTJ element by 2 to 3 or more orders of magnitude (because of charging and discharging of parasitic capacitance) |
| 6) Non-volatility | Utilizing spin | Utilizing low off-state current |
| 7) Read Number | Without limitation | Without limitation |
| 8) 3D Conversion | Difficult (at most two layers) | Easy (the number of layers is limitless) |
| 9) Integration Degree ($F^2$) | 4 to 15 $F^2$ | Depends on the number of layers stacked in 3D conversion (it is necessary to ensure heat resistance in process of forming upper OS FET) |
| 10) Material | Magnetic rare-earth element | OS material |
| 11) Cost per Bit | High | Low (might be slightly high depending on OS material) |
| 12) Resistance to Magnetic Field | Low | High |

The MTJ element is disadvantageous in that magnetic properties are lost when the temperature is the Curie temperature or higher because a magnetic material is used. Further, the MTJ element is compatible with a silicon bipolar device because current drive is employed. However, a silicon bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. Further, the material cost per bit of the MTJ element is expensive.

On the other hand, the transistor which includes a wide band gap semiconductor material such as an oxide semiconductor material and is described in the above embodiment has an element structure and an operation principle similar to those of a silicon MOSFET except that a semiconductor material for forming a channel is a metal oxide. Further, the transistor including an oxide semiconductor is not affected by a magnetic field, and does not cause soft errors. This shows that the transistor has high silicon integrated circuit integrity.

As shown in Table 1, the memory in which the transistor which includes a wide band gap semiconductor material such as an oxide semiconductor material and is described in the above embodiment and the transistor including silicon are combined has advantages over a spintronics device in many aspects such as heat resistance, 3D conversion (layered structure of three or more layers), and resistance to a magnetic field. Note that the power for overhead in Table 1 is, for example, power for writing data to a memory portion or the like in a processor, which is what is called power consumed for overhead.

As described above, the use of a memory including an oxide semiconductor that has more advantages than the spintronics device makes it possible to reduce power consumption of a CPU.

The structures, methods, and the like in this embodiment can be combined with any of the structures, methods, and the like in the other embodiments as appropriate.

Embodiment 4

A semiconductor device including the processor disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as video cameras and digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. Oil engines, moving objects driven by electric motors using power from non-aqueous secondary batteries, and the like are also included in the range of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 19A and 19B.

Figure 19A:
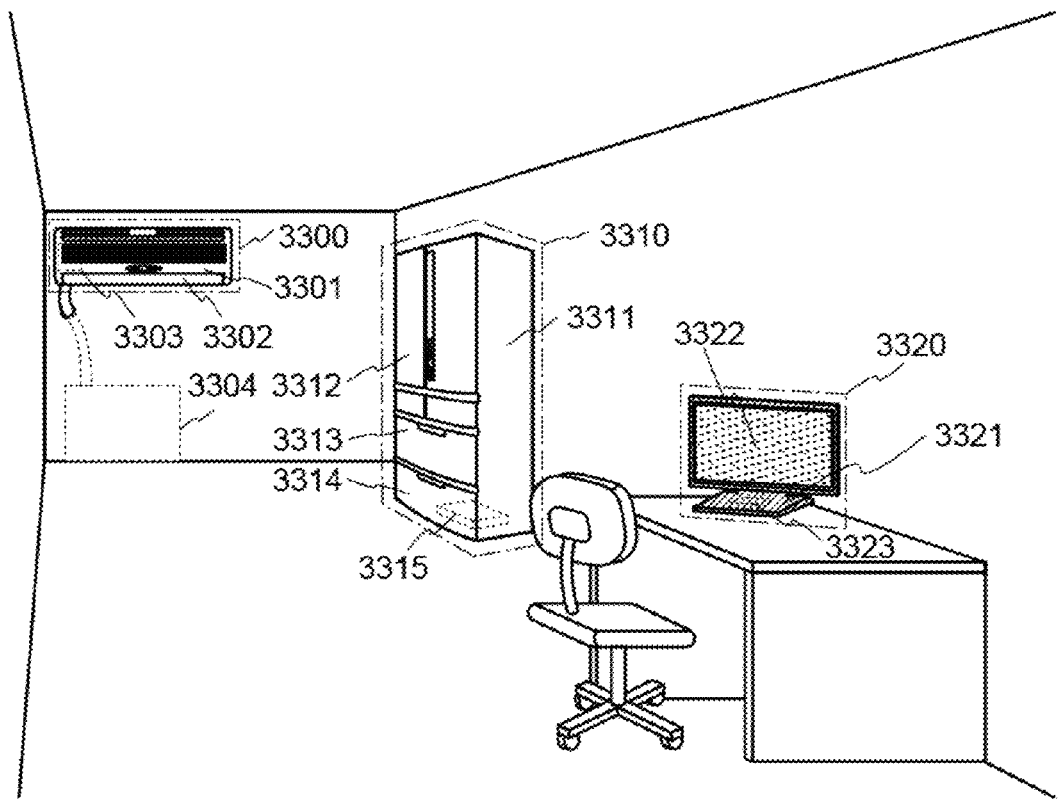
FIGS. 19A and 19B illustrate electronic devices.
Figure 19B:
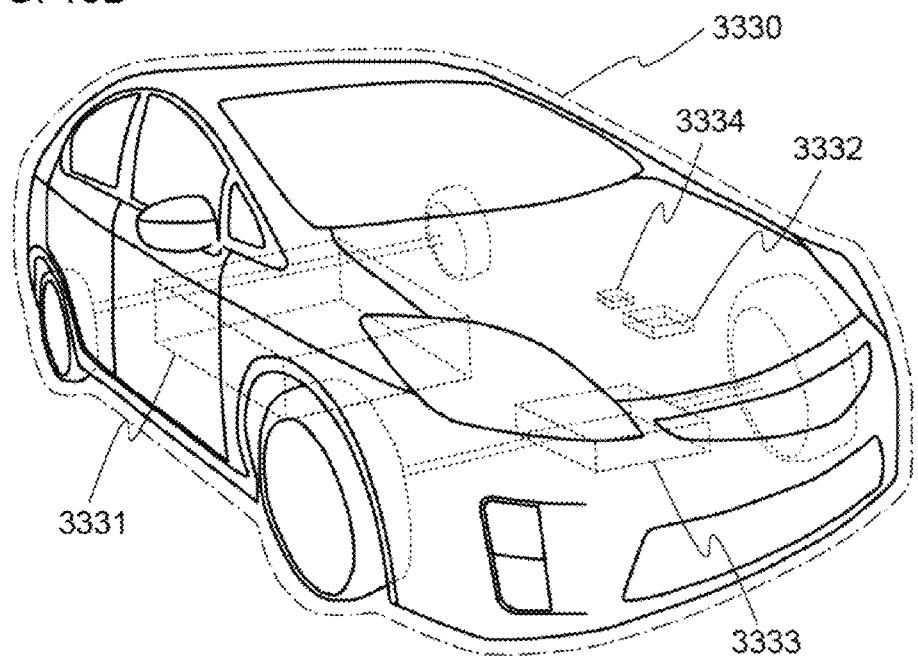

In FIG. 19A, an air conditioner which includes an indoor unit 3300 and an outdoor unit 3304 is an example of an electric device using the CPU including the processor described in the above embodiment. Specifically, the indoor unit 3300 includes a housing 3301, an air outlet 3302, a CPU 3303, and the like. Although the CPU 3303 is provided in the indoor unit 3300 in FIG. 19A, the CPU 3303 may be provided in the outdoor unit 3304. Alternatively, the CPU 3303 may be provided in both the indoor unit 3300 and the outdoor unit 3304. As described in the above embodiment, the power consumption of the CPU can be reduced; thus, the power consumption of the air conditioner can be reduced.

In FIG. 19A, an electric refrigerator-freezer 3310 is an example of an electric device provided with the CPU formed using an oxide semiconductor. Specifically, the electric refrigerator-freezer 3310 includes a housing 3311, a door for a refrigerator 3312, a door for a freezer 3313, a door for a vegetable drawer 3314, a CPU 3315, and the like. When the CPU including the processor described in the above embodiment is used as the CPU 3315 of the electric refrigerator-freezer 3310, the power consumption of the electric refrigerator-freezer 3310 can be reduced.

In FIG. 19A, an image display device 3320 is an example of an electric device provided with the CPU formed using an oxide semiconductor. Specifically, the image display device 3320 includes a housing 3321, a display portion 3322, a CPU 3323, and the like. In FIG. 19A, the CPU 3323 is provided in the housing 3321. When the CPU including the processor described in the above embodiment is used as the CPU 3323 of the image display device 3320, the power consumption of the image display device 3320 can be reduced.

An example of an electric vehicle is described in FIG. 19B. An electric vehicle 3330 is equipped with a secondary battery 3331. The output of power of the secondary battery 3331 is adjusted by a control circuit 3332, and the power is supplied to a driving device 3333. The control circuit 3332 is controlled by a processing unit 3334 including a ROM, a RAM, a CPU, or the like which is not illustrated. When the CPU including the processor described in the above embodiment is used as the CPU in the electric vehicle 3330, the power consumption of the electric vehicle 3330 can be reduced.

The driving device 3333 includes a DC motor or an AC motor either alone or in combination with an internal-combustion engine. The processing unit 3334 outputs a control signal to the control circuit 3332 based on input information such as information of operation (e.g., acceleration, deceleration, or stop) by a driver or information during driving (e.g., information on an upgrade or a downgrade, or information on a load on a driving wheel) of the electric vehicle 3330. The control circuit 3332 adjusts electric energy supplied from the secondary battery 3331 in accordance with the control signal of the processing unit 3334 to control the output of the driving device 3333. In the case where the AC motor is mounted, although not illustrated, an inverter which converts direct current into alternate current is also incorporated.

This embodiment can be combined with any of the other embodiments as appropriate.

<Off-State Current of Transistor>

The measurement results of the off-state current of a transistor including a highly purified oxide semiconductor are described below.

Figure 20:
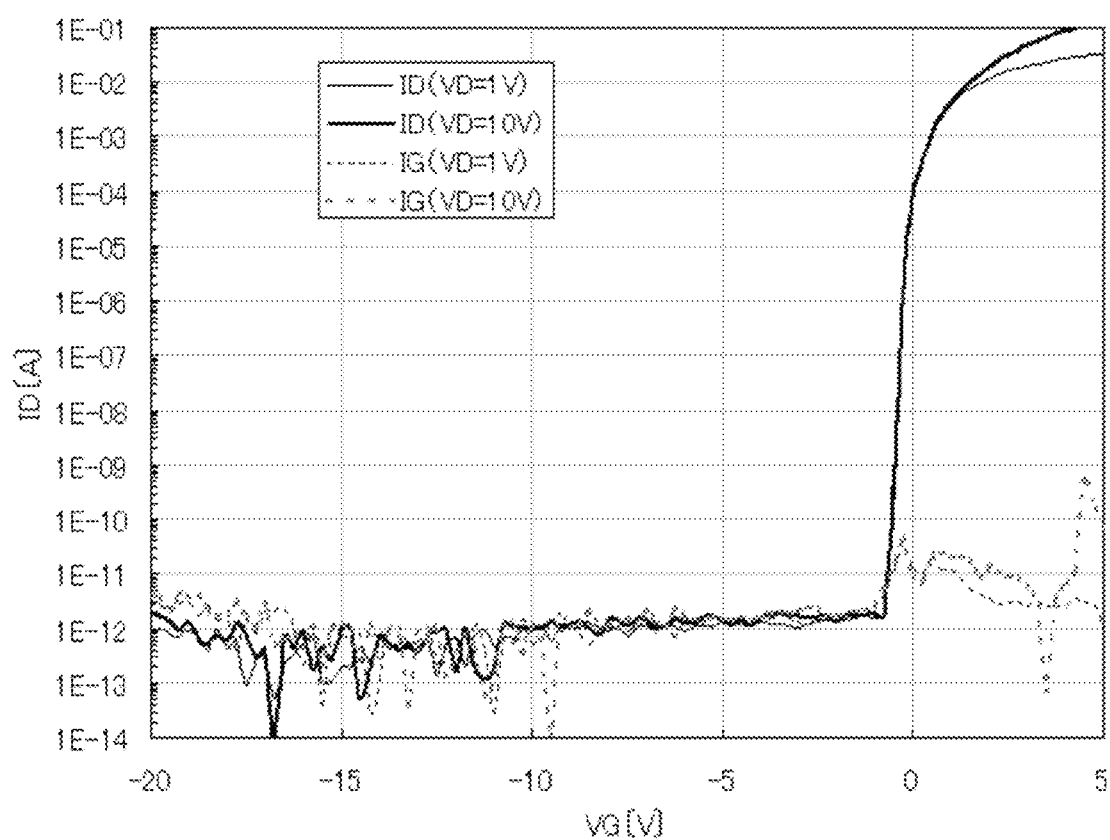
FIG. 20 shows characteristics of a transistor including an oxide semiconductor.

First, a transistor with a channel width W of 1 m, which is sufficiently wide, is prepared in consideration of the very low off-state current of a transistor including a highly purified oxide semiconductor, and the off-state current is measured. FIG. 20 shows the measurement results of the off-state current of the transistor with a channel width W of 1 m. In FIG. 20, the horizontal axis shows gate voltage VG and the vertical axis shows drain current ID. In the case where drain voltage VD is +1 V or +10 V and the gate voltage VG is in a range of −5 to −20 V, the off-state current of the transistor is lower than or equal to $1 \times 10^{-12}$ A which is the detection limit. Further, the off-state current (per unit channel width (1 μm)) of the transistor is lower than or equal to 1 aA ($1 \times 10^{-18}$ A).

Next, the more accurate measurement results of the off-state current of the transistor including a highly purified oxide semiconductor are described. As described above, the off-state current of the transistor including a highly purified oxide semiconductor is lower than or equal to $1 \times 10^{-12}$ A which is the detection limit of measurement equipment. Here, the more accurate measurement results of off-state current (which is lower than or equal to the detection limit of the measurement equipment in the measurement) with the use of an element for characteristic evaluation are described.

First, the element for characteristic evaluation that is used in a method for measuring current is described with reference to FIG. 21.

Figure 21:
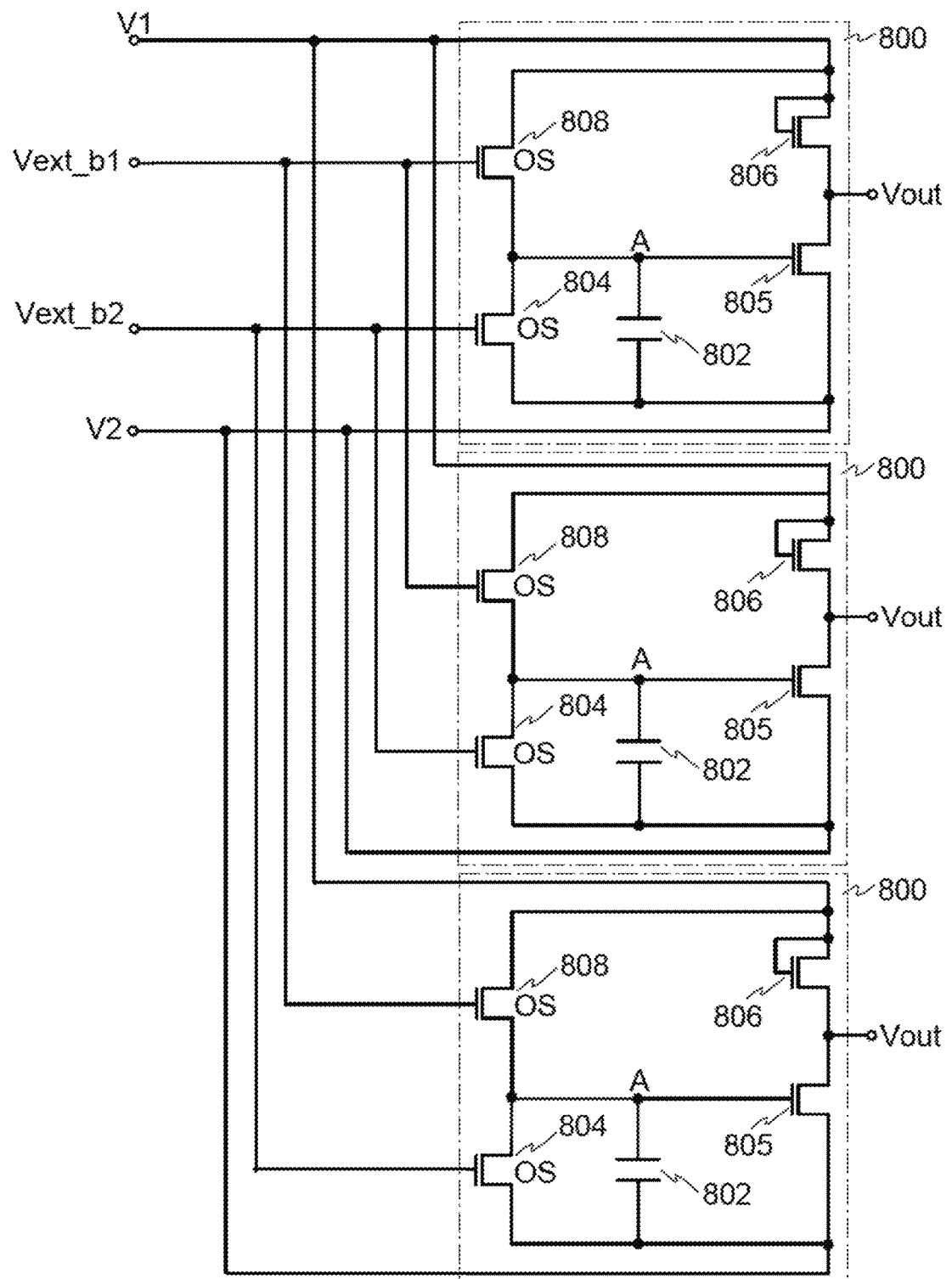
FIG. 21 is a circuit diagram of a circuit for evaluating characteristics of a transistor including an oxide semiconductor.

In the element for characteristic evaluation in FIG. 21, three measurement systems 800 are connected in parallel. A measurement system 800 includes a capacitor 802, a transistor 804, a transistor 805, a transistor 806, and a transistor 808. As the transistor 804, the transistor 805, the transistor 806, and the transistor 808, transistors including a highly purified oxide semiconductor are used.

In the measurement system 800, one of a source terminal and a drain terminal of the transistor 804, one terminal of the capacitor 802, and one of a source terminal and a drain terminal of the transistor 805 are electrically connected to a power source (for supplying V2). The other of the source terminal and the drain terminal of the transistor 804, one of a source terminal and a drain terminal of the transistor 808, the other terminal of the capacitor 802, and a gate terminal of the transistor 805 are electrically connected to each other. The other of the source terminal and the drain terminal of the transistor 808, one of a source terminal and a drain terminal of the transistor 806, and a gate terminal of the transistor 806 are electrically connected to a power source (for supplying V1). The other of the source terminal and the drain terminal of the transistor 805 and the other of the source terminal and the drain terminal of the transistor 806 are electrically connected to each other to form an output terminal.

A potential Vext_b2 for controlling an on state and an off state of the transistor 804 is supplied to the gate terminal of the transistor 804. A potential Vext_b1 for controlling an on state and an off state of the transistor 808 is supplied to the gate terminal of the transistor 808. A potential Vout is output from the output terminal.

Next, a method for measuring current with the use of the element for characteristic evaluation is described.

First, an initial period in which a potential difference is applied to measure the off-state current is described briefly. In the initial period, the potential Vext_b1 for turning on the transistor 808 is input to the gate terminal of the transistor 808, and the potential V1 is supplied to a node A that is electrically connected to the other of the source terminal and the drain terminal of the transistor 804 (that is, a node electrically connected to one of the source terminal and the drain terminal of the transistor 808, the other terminal of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808 so that the transistor 808 is turned off. After the transistor 808 is turned off, the potential V1 is set low. The transistor 804 is still off. The potential V2 is equal to the potential V1. Thus, the initial period is completed. In a state where the initial period is completed, a potential difference is generated between the node A and one of the source terminal and the drain terminal of the transistor 804, and a potential difference is generated between the node A and the other of the source terminal and the drain terminal of the transistor 808. Thus, electric charge slightly flows through the transistor 804 and the transistor 808. That is, the off-state current is generated.

Next, a measurement period of the off-state current is briefly described. In the measurement period, the potential (that is, V2) of one of the source terminal and the drain terminal of the transistor 804 and the potential (that is, V1) of the other of the source terminal and the drain terminal of the transistor 808 are set low and fixed. On the other hand, the potential of the node A is not fixed (the node A is in a floating state) in the measurement period. Accordingly, electric charge flows through the transistor 804, and the amount of electric charge stored in the node A is changed as time passes. The potential of the node A is changed depending on a change in the amount of electric charge stored in the node A. That is, the output potential Vout of the output terminal is also changed.

Figure 22:
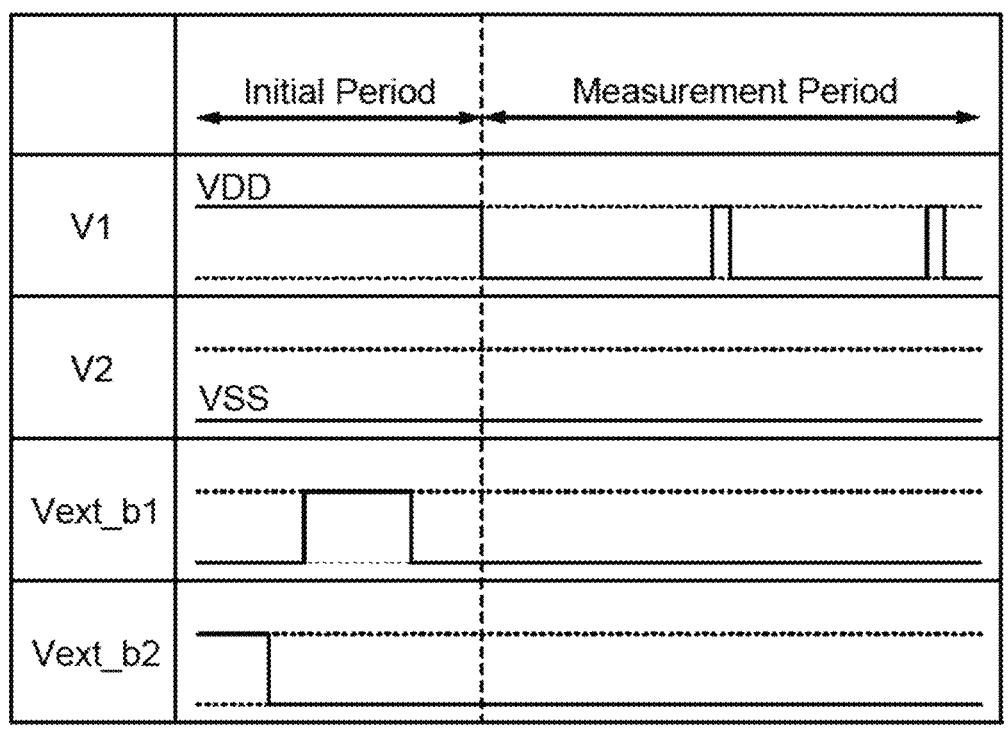
FIG. 22 is a timing chart of a circuit for evaluating characteristics of a transistor including an oxide semiconductor.

FIG. 22 shows details of the relationship between potentials in the initial period in which the potential difference is applied and in the following measurement period (timing chart).

In the initial period, first, the potential Vext_b2 is set to a potential (high potential) at which the transistor 804 is turned on. Thus, the potential of the node A becomes V2, that is, a low potential (VSS). Note that a low potential (VSS) is not necessarily applied to the node A. After that, the potential Vext_b2 is set to a potential (low potential) at which the transistor 804 is turned off, whereby the transistor 804 is turned off. Next, the potential Vext_b1 is set to a potential (a high potential) at which the transistor 808 is turned on. Thus, the potential of the node A becomes V1, that is, a high potential (VDD). After that, the potential Vext_b1 is set to a potential at which the transistor 808 is turned off. Accordingly, the node A is brought into a floating state and the initial period is completed.

In the following measurement period, the potential V1 and the potential V2 are set to potentials at which electric charge flows to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set short so that the measurement is not influenced.

When the potential difference is generated and the measurement period is started as described above, the amount of electric charge stored in the node A is changed as time passes, which changes the potential of the node A. This means that the potential of the gate terminal of the transistor 805 is changed, and thus the output potential Vout of the output terminal is also changed with the lapse of time.

A method for calculating the off-state current on the basis of the obtained output potential Vout is described below.

The relationship between the potential $V_A$ of the node A and the output potential Vout is obtained before the off-state current is calculated. Thus, the potential $V_A$ of the node A can be obtained using the output potential Vout. From the relationship, the potential $V_A$ of the node A can be expressed as a function of the output potential Vout by the following formula.

$$V_A = F(Vout) \quad (2)$$

Electric charge $Q_A$ of the node A can be expressed by the following formula using the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad (3)$$

Since current $I_A$ of the node A is a time derivative of electric charge flowing to the node A (or electric charge flowing from the node A), the current $I_A$ of the node A is expressed by the following formula.

$$I_A = \frac{\Delta Q_A}{\Delta t} = \frac{C_A \Delta F(Vout)}{\Delta t} \quad (4)$$

In this manner, the current $I_A$ of the node A can be obtained from the capacitance $C_A$ connected to the node A and the output potential Vout of the output terminal.

By the above method, it is possible to measure leakage current (off-state current) which flows between a source and a drain of a transistor in an off state.

In this measurement, the transistor 804, the transistor 805, the transistor 806, and the transistor 808 are formed using a highly purified oxide semiconductor with a channel length (L) of 10 μm and a channel width (W) of 50 μm. In the measurement systems 800 which are arranged in parallel, the capacitances of the capacitors 802 are 100 fF, 1 pF, and 3 pF.

Note that in the measurement, VDD is 5 V and VSS is 0 V. In the measurement period, Vout is measured while the potential V1 is basically set to VSS and changed to VDD for 100 msec. at intervals of 10 to 300 sec. Here, Δt used in calculation of current I flowing through the element is about 30000 sec.

Figure 23:
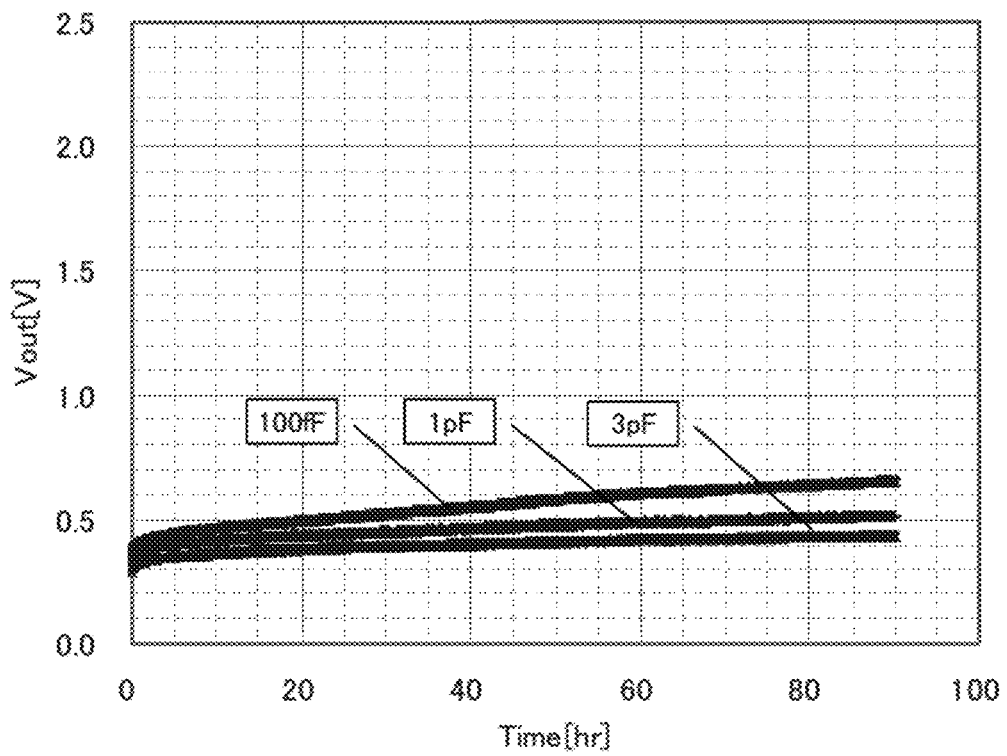
FIG. 23 shows characteristics of a transistor including an oxide semiconductor.

FIG. 23 shows the relationship between the output potential Vout and elapsed time Time in the current measurement. According to FIG. 23, the potential is changed as time passes.

Figure 24:
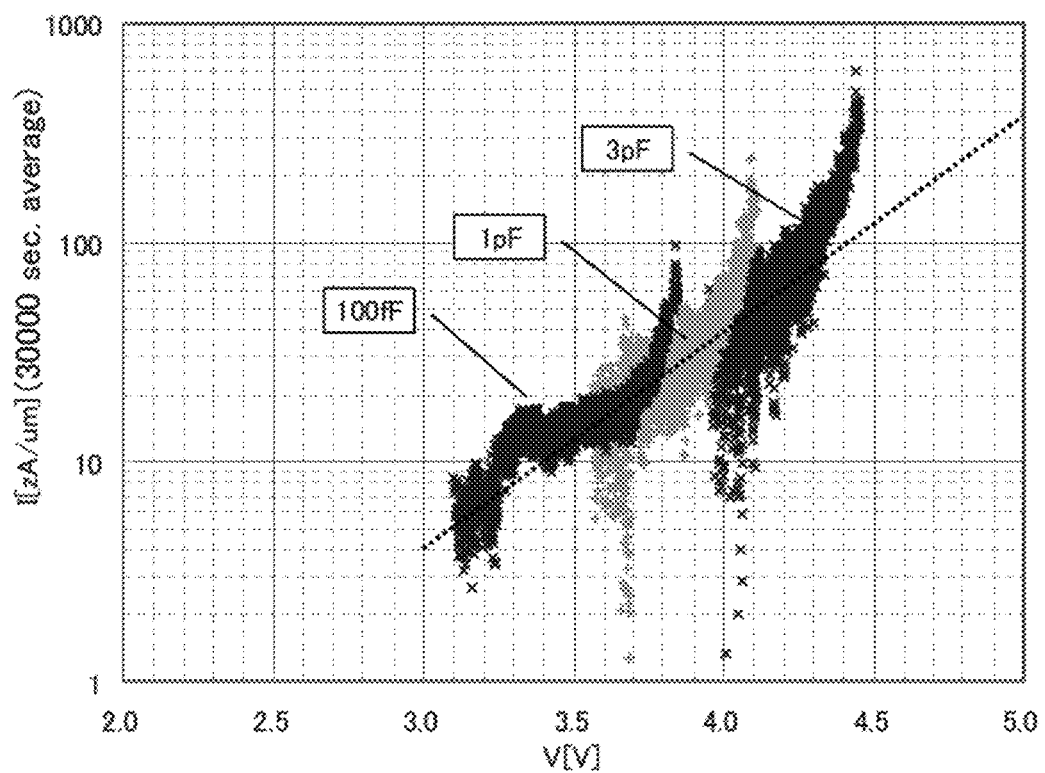
FIG. 24 shows characteristics of a transistor including an oxide semiconductor.

FIG. 24 shows the off-state current at room temperature (25° C.) calculated based on the current measurement. Note that FIG. 24 shows the relationship between source-drain voltage V and the off-state current I. According to FIG. 24, off-state current is approximately 40 zA/μm when the source-drain voltage is 4 V. In addition, the off-state current is 10 zA/μm or lower when the source-drain voltage is 3.1 V. Note that 1 zA represents $10^{-21}$ A.

Figure 25:
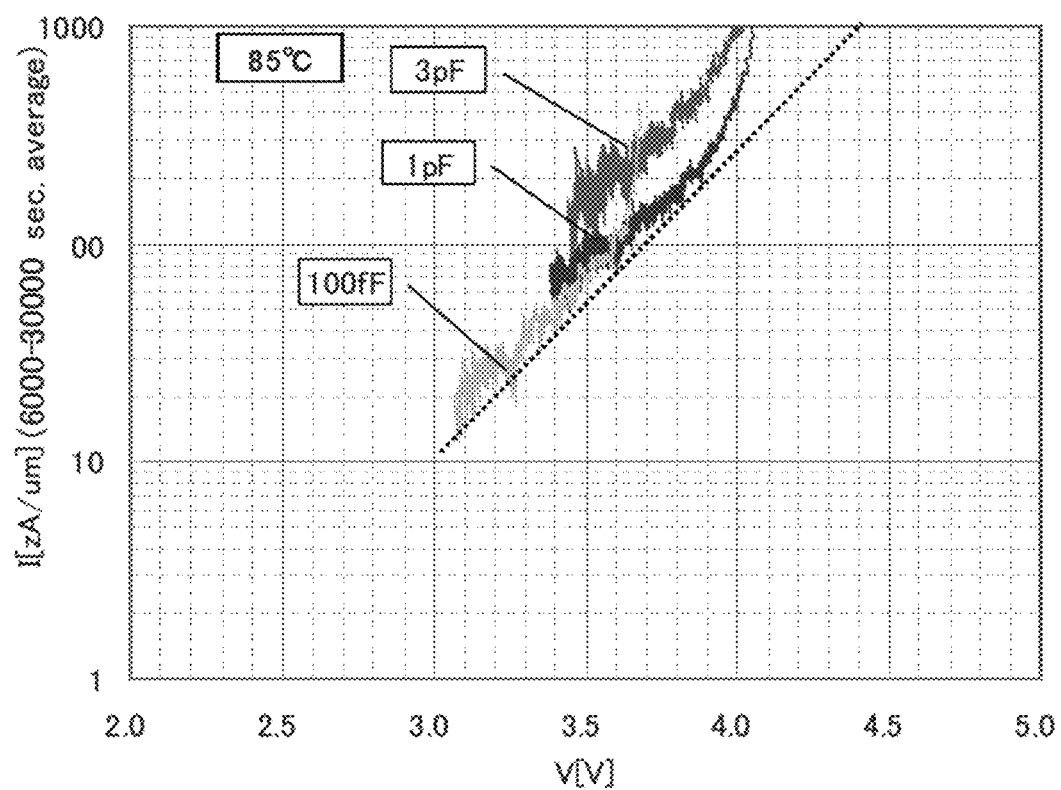
FIG. 25 shows characteristics of a transistor including an oxide semiconductor.

Further, FIG. 25 shows off-state current at 85° C. calculated in the current measurement. FIG. 25 shows the relationship between the source-drain voltage V and the off-state current I at 85° C. FIG. 25 shows that the off-state current is 100 zA/μm or lower when the source-drain voltage is 3.1 V.

In this manner, it is confirmed that the off-state current of a transistor including a highly purified oxide semiconductor is sufficiently low.

This application is based on Japanese Patent Application serial No. 2012-077996 filed with Japan Patent Office on Mar. 29, 2012, the entire contents of which are hereby incorporated by reference.

What is claimed is:

1. A processor comprising:
   an instruction decoder;
   a logic unit including a plurality of logic circuit blocks including a volatile memory block and a nonvolatile memory block;
   a backup/recovery controller including a storage storing first reference instruction enumeration and second reference instruction enumeration;
   a power controller; and
   a flag storage,
   wherein the instruction decoder receives an instruction from an outside of the processor and gives an instruction to the logic unit, the backup/recovery controller, and the power controller,
   wherein, when enumeration of the instruction from the outside of the processor corresponds to at least part of the first reference instruction enumeration, the backup/recovery controller gives an instruction to back up data from the volatile memory block to the nonvolatile memory block to at least one of the plurality of logic circuit blocks in accordance with the first reference instruction enumeration,
   wherein the backup/recovery controller receives an instruction from the instruction decoder and gives an instruction to recover data from the nonvolatile memory block to the volatile memory block to at least one of the plurality of logic circuit blocks in accordance with the second reference instruction enumeration,
   wherein one of the logic circuit blocks in the logic unit receives an instruction from the backup/recovery controller, and performs data backup or data recovery between the volatile memory block and the nonvolatile memory block,
   wherein another one of the logic circuit blocks in the logic unit concurrently receives an instruction from the instruction decoder and performs arithmetic processing using data stored in the volatile memory block,
   wherein a data backed up flag or a data recovered flag is written to the flag storage by the backup/recovery controller, and
   wherein the power controller receives an instruction from the instruction decoder or the backup/recovery controller and powers on or off the logic unit.

2. The processor according to claim 1,
   wherein the data backup performed at the time of stop of the logic unit is divided into primary backup in which data is backed up from the volatile memory block to the nonvolatile memory block in one of the logic circuit blocks in the logic unit before an instruction to stop the logic unit and another one of the logic circuit blocks in the logic unit concurrently performs arithmetic processing, and secondary backup in which data is backed up from the volatile memory block to the nonvolatile memory block in another one of the logic circuit blocks in the logic unit after the instruction to stop the logic unit, and wherein the data recovery performed at the time of start of the logic unit is divided into primary recovery in which data is recovered from the nonvolatile memory block to the volatile memory block in one of the logic circuit blocks in the logic unit in accordance with an instruction to start the logic unit, and secondary recovery in which data is recovered from the nonvolatile memory block to the volatile memory block in another one of the logic circuit blocks in the logic unit after completion of the primary recovery and one of the logic circuit blocks in the logic unit concurrently performs arithmetic processing.

3. The processor according to claim 2, wherein, in the primary backup, when the enumeration of the instruction from the outside of the processor corresponds to at least part of the first reference instruction enumeration, the backup/recovery controller gives an instruction to back up data from the volatile memory block to the nonvolatile memory block to at least one of the logic circuit blocks in the logic unit, wherein one of the logic circuit blocks in the logic unit receives the instruction from the backup/recovery controller and backs up data from the volatile memory block to the nonvolatile memory block, wherein another one of the logic circuit blocks in the logic unit concurrently performs arithmetic processing, wherein the backup/recovery controller writes a backed up flag of one of the logic circuit blocks in the logic unit to the flag storage in accordance with backup of the data in one of the logic circuit blocks in the logic unit, wherein, in the secondary backup, the instruction decoder receives an instruction to stop the logic unit from the outside of the processor and gives an instruction to back up data in the logic unit to the backup/recovery controller, wherein the backup/recovery controller gives an instruction to back up data from the volatile memory block to the nonvolatile memory block to another one of the logic circuit blocks in the logic unit in accordance with the backed up flag, wherein another one of the logic circuit blocks in the logic unit backs up data from the volatile memory block to the nonvolatile memory block, wherein the backup/recovery controller gives an instruction to power off at least the logic unit to the power controller after completion of backup of the data in another one of the logic circuit blocks in the logic unit, and wherein the power controller powers off at least the logic unit.

4. The processor according to claim 3, wherein, in the primary backup, in the case where another data is written to one of the logic circuit blocks in the logic unit from which the data is backed up, the backed up flag of the logic circuit block written to the flag storage is erased.

5. The processor according to claim 3, wherein, in the primary backup, one of the logic circuit blocks in the logic unit is divided into a plurality of blocks and the primary backup is performed more than once.

6. The processor according to claim 1, wherein, in the primary backup, the instruction decoder receives an instruction to start the logic unit from the outside of the processor, gives an instruction to power on the logic unit to the power controller, and gives an instruction to recover data in the logic unit to the backup/recovery controller, wherein the power controller receives the instruction from the instruction decoder and powers on at least the logic unit, wherein the backup/recovery controller receives the instruction from the instruction decoder and gives an instruction to recover data from the nonvolatile memory block to the volatile memory block to one of the logic circuit blocks in the logic unit in accordance with the second reference instruction enumeration, wherein one of the logic circuit blocks in the logic unit recovers data from the nonvolatile memory block to the volatile memory block, wherein the backup/recovery controller writes a recovered flag of one of the logic circuit blocks in the logic unit to the flag storage in accordance with recovery of the data in one of the logic circuit blocks in the logic unit, wherein a data recovery completion signal of one of the logic circuit blocks in the logic unit is transmitted to the instruction decoder after completion of recovery of the data in one of the logic circuit blocks in the logic unit, wherein, in the secondary recovery, the instruction decoder receives the data recovery completion signal and gives an instruction to perform arithmetic processing to one of the logic circuit blocks in the logic unit, wherein the backup/recovery controller gives an instruction to recover data from the nonvolatile memory block to the volatile memory block to another one of the logic circuit blocks in the logic unit, wherein another one of the logic circuit blocks in the logic unit recovers data from the nonvolatile memory block to the volatile memory block, wherein one of the logic circuit blocks in the logic unit concurrently performs arithmetic processing in accordance with the instruction from the instruction decoder, and wherein the backup/recovery controller writes a recovered flag of another one of the logic circuit blocks in the logic unit to the flag storage in accordance with recovery of the data in another one of the logic circuit blocks in the logic unit.

7. The processor according to claim 6, wherein, in the secondary recovery, in the case where an instruction to perform arithmetic processing in another one of the logic circuit blocks in the logic unit from which the data is not recovered is given, the instruction to perform arithmetic processing is on standby.

8. The processor according to claim 7, wherein data is preferentially recovered from the nonvolatile memory block to the volatile memory block in the logic circuit block.

9. The processor according to claim 2, wherein, in the primary recovery, one of the logic circuit blocks in the logic unit is divided into a plurality of blocks and the primary recovery is performed more than once.

10. The processor according to claim 1, wherein the volatile memory block includes a register.

11. The processor according to claim 1, wherein the nonvolatile memory block includes a transistor including an oxide semiconductor.

12. The processor according to claim 1, wherein the processor is incorporated in one selected from the group consisting of an air conditioner, an electric refrigerator-freezer, an image display device, and an electric vehicle.

13. A method for driving a processor, comprising the steps of:

in data backup performed at the time of stop of a logic unit in a processor, backing up data from a volatile storage element to a nonvolatile storage element in part of the logic unit that is not used until an instruction to stop the logic unit is given and concurrently performing arithmetic processing in another part of the logic unit;

backing up data from a volatile storage element to a nonvolatile storage element in another part of the logic unit when the instruction to stop the logic unit is given; and powering off at least the logic unit when data backup in the logic unit is completed, in data recovery performed at the time of start of the logic unit, powering on at least the logic unit when an instruction to start the logic unit is given;

recovering data from the nonvolatile storage element to the volatile storage element in part of the logic unit used after the start instruction is given when the logic unit is powered on; and performing arithmetic processing in part of the logic unit when data is recovered in part of the logic unit and concurrently recovering data from the nonvolatile storage element to the volatile storage element in another part of the logic unit.

14. The method for driving the processor according to claim 13, wherein the processor is incorporated in one selected from the group consisting of an air conditioner, an electric refrigerator-freezer, an image display device, and an electric vehicle.

* * * * *